(12) United States Patent
Matsuno et al.

(10) Patent No.: US 12,394,718 B2
(45) Date of Patent: Aug. 19, 2025

(54) THREE-DIMENSIONAL MEMORY DEVICE CONTAINING ETCH-STOP STRUCTURES AND SELF-ALIGNED INSULATING SPACERS AND METHOD OF MAKING THE SAME

(71) Applicant: SANDISK TECHNOLOGIES LLC, Addison, TX (US)

(72) Inventors: Koichi Matsuno, Fremont, CA (US); Kota Funayama, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 587 days.

(21) Appl. No.: 17/682,515

(22) Filed: Feb. 28, 2022

(65) Prior Publication Data
US 2023/0275026 A1    Aug. 31, 2023

(51) Int. Cl.
*H01L 23/535* (2006.01)
*H01L 23/528* (2006.01)
(Continued)

(52) U.S. Cl.
CPC ........ *H01L 23/535* (2013.01); *H01L 23/5283* (2013.01); *H10B 41/27* (2023.02); *H10B 43/27* (2023.02)

(58) Field of Classification Search
CPC ............... H01L 23/535; H01L 23/5283; H01L 21/76805; H01L 21/76816;
(Continued)

(56) References Cited

U.S. PATENT DOCUMENTS

| 5,915,167 A | 6/1999 | Leedy |
| 9,419,013 B1 * | 8/2016 | Lee ........................ H10B 43/35 |

(Continued)

OTHER PUBLICATIONS

Notification of Transmittal of the International Search Report and Written Opinion of the International Searching Authority for International Patent Application No. PCT/US2022/030634, mailed Nov. 18, 2022, 13 pages.

(Continued)

*Primary Examiner* — Fernando L Toledo
*Assistant Examiner* — Marshall Mu-Nuo Hatfield
(74) *Attorney, Agent, or Firm* — THE MARBURY LAW GROUP PLLC

(57) ABSTRACT

Contact via openings are formed through a retro-stepped dielectric material portion in a three-dimensional memory device to underlying etch stop structures. The etch stop structures may include a stepped conductive or semiconductor etch stop plate overlying stepped surfaces in the staircase region. The contact via openings are extended through the etch stop structures. Alternatively, electrically conductive layers, including a topmost dummy electrically conductive layer in the staircase region, may be employed as etch stop structures. In this case, the contact via openings can be extended through the electrically conductive layers. Insulating spacers are formed at peripheral regions of the extended contact via openings. Contact via structures surrounded by the insulating spacers are formed in the extended contact via openings to a respective underlying electrically conductive layer.

20 Claims, 66 Drawing Sheets

(51) Int. Cl.
  *H10B 41/27* (2023.01)
  *H10B 43/27* (2023.01)
(58) Field of Classification Search
  CPC ... H01L 21/76831; H10B 41/27; H10B 43/27; H10B 43/50
  See application file for complete search history.

(56) References Cited

U.S. PATENT DOCUMENTS

| | | |
|---|---|---|
| 9,716,105 B1 | 7/2017 | Tsutsumi |
| 9,754,963 B1 | 9/2017 | Kawamura et al. |
| 9,853,038 B1 | 12/2017 | Cui |
| 9,905,573 B1 | 2/2018 | Mada et al. |
| 9,960,181 B1 | 5/2018 | Cui et al. |
| 10,181,442 B1 | 1/2019 | Watanabe et al. |
| 10,192,877 B2 | 1/2019 | Norizuki et al. |
| 10,211,215 B1 | 2/2019 | Ishii et al. |
| 10,217,746 B1 | 2/2019 | Kim et al. |
| 10,256,245 B2 | 4/2019 | Ariyoshi |
| 10,304,852 B1 | 5/2019 | Cui et al. |
| 10,453,798 B2 | 10/2019 | Tsutsumi et al. |
| 10,453,854 B2 | 10/2019 | Kanno et al. |
| 10,461,163 B2 | 10/2019 | Kanakamedala et al. |
| 10,580,783 B2 | 3/2020 | Cui et al. |
| 10,608,010 B2 | 3/2020 | Terasawa et al. |
| 10,700,089 B1 | 6/2020 | Hojo et al. |
| 10,937,801 B2 | 3/2021 | Otsu et al. |
| 11,049,876 B2 | 6/2021 | Kaminaga et al. |
| 2016/0322374 A1 | 11/2016 | Sano et al. |
| 2017/0117222 A1* | 4/2017 | Kim .................. H01L 23/5283 |
| 2017/0330761 A1* | 11/2017 | Chawla ............. H01L 23/53295 |
| 2018/0061850 A1 | 3/2018 | Mada et al. |
| 2018/0261611 A1 | 9/2018 | Norizuki et al. |
| 2018/0261613 A1 | 9/2018 | Ariyoshi |
| 2019/0013237 A1* | 1/2019 | Nam ..................... H10B 43/50 |
| 2019/0088672 A1 | 3/2019 | Tomimatsu et al. |
| 2019/0096808 A1 | 3/2019 | Tsutsumi et al. |
| 2019/0148392 A1 | 5/2019 | Kanno et al. |
| 2019/0148506 A1 | 5/2019 | Kanakamedala et al. |
| 2019/0229125 A1 | 7/2019 | Zhou et al. |
| 2019/0252396 A1 | 8/2019 | Mushiga et al. |
| 2019/0252403 A1 | 8/2019 | Kaminaga et al. |
| 2019/0252404 A1 | 8/2019 | Kaminaga et al. |
| 2019/0273088 A1 | 9/2019 | Cui et al. |
| 2019/0280001 A1* | 9/2019 | Terasawa .......... H01L 21/76865 |
| 2019/0319039 A1* | 10/2019 | Kim ....................... H10B 41/30 |
| 2019/0333855 A1 | 10/2019 | Park |
| 2020/0035694 A1 | 1/2020 | Kaminaga |
| 2020/0127005 A1 | 4/2020 | Otsu et al. |
| 2020/0144380 A1* | 5/2020 | Hwang ................. H10B 43/50 |
| 2020/0152654 A1 | 5/2020 | Hwang et al. |
| 2020/0194447 A1 | 6/2020 | Sun et al. |
| 2020/0312865 A1 | 10/2020 | Ge et al. |
| 2021/0358805 A1 | 11/2021 | Hopkins et al. |
| 2021/0366920 A1 | 11/2021 | Tokita et al. |
| 2021/0366924 A1 | 11/2021 | Tokita et al. |
| 2022/0005818 A1 | 1/2022 | Tanaka et al. |
| 2022/0005824 A1 | 1/2022 | Tanaka et al. |
| 2022/0028879 A1 | 1/2022 | Mochizuki et al. |

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
Notification of Transmittal of the International Search Report and the Written Opinion of the International Searching Authority for International Patent Application No. PCT/US2021/035466, mailed on Sep. 13, 2021, 14 pages.
U.S. Appl. No. 17/355,883, filed Jun. 23, 2021, SanDisk Technologies LLC.
U.S. Appl. No. 17/411,689, filed Aug. 25, 2021, SanDisk Technologies LLC.
U.S. Appl. No. 17/411,726, filed Aug. 25, 2021, SanDisk Technologies LLC.
U.S. Appl. No. 17/525,233, filed Nov. 12, 2021, SanDisk Technologies LLC.
U.S. Appl. No. 17/682,550, filed Feb. 28, 2022, SanDisk Technologies LLC.
USPTO Office Communication, Non-Final Office Action for U.S. Appl. No. 17/682,550, mailed on Sep. 10, 2024, 15 pages.

* cited by examiner

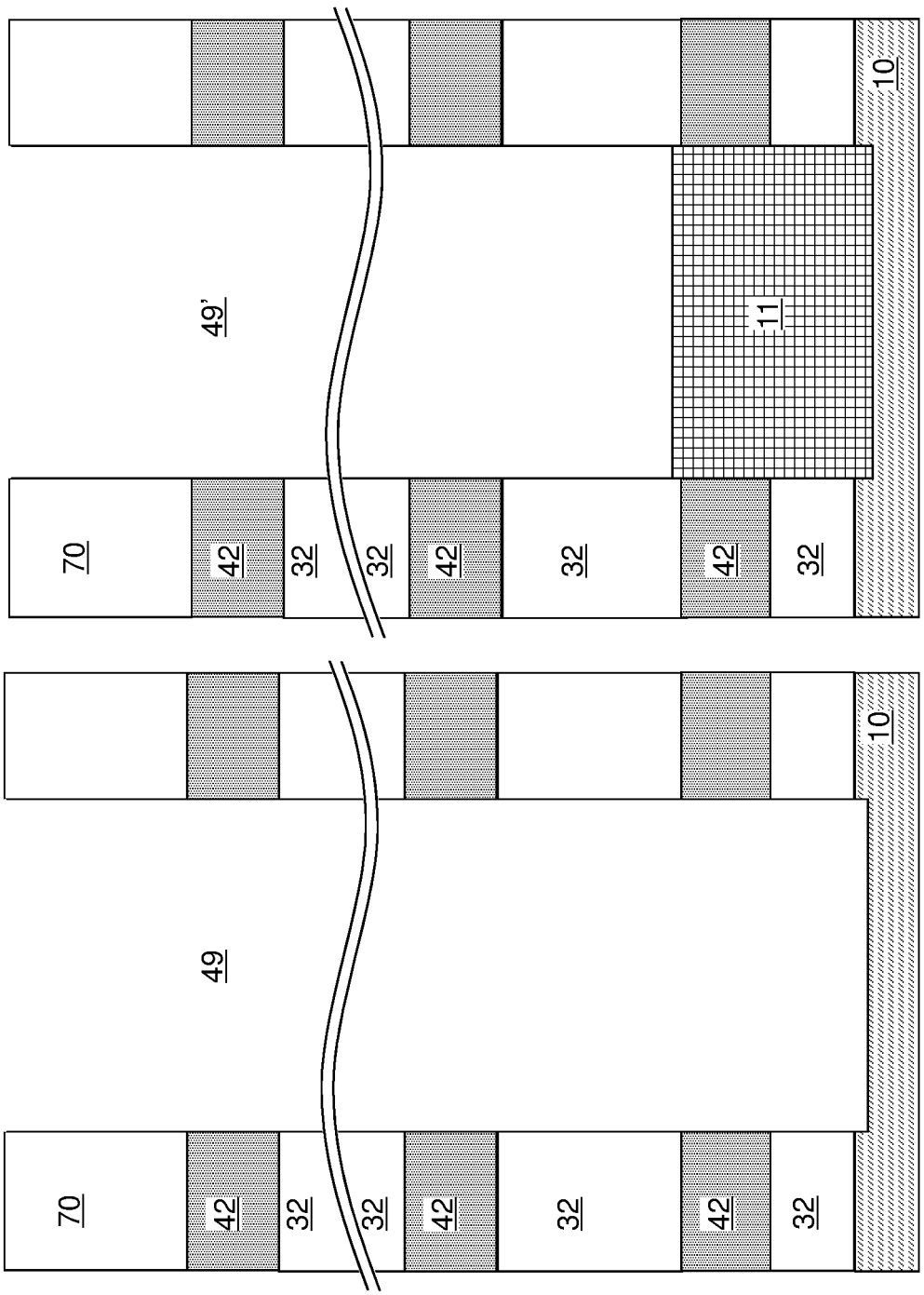

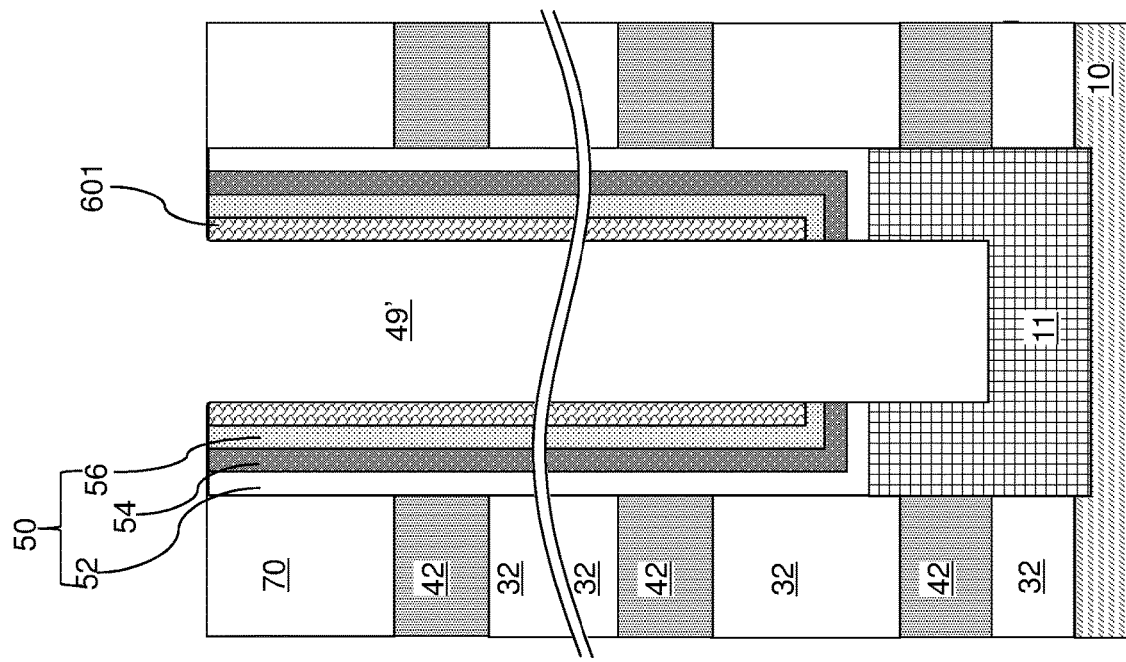
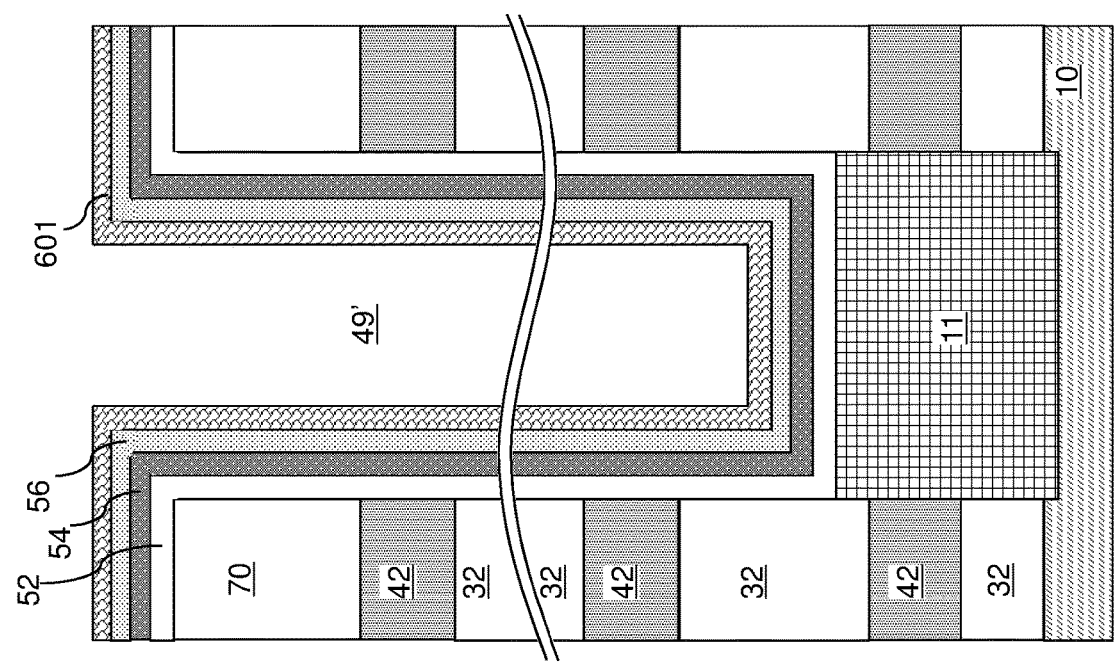

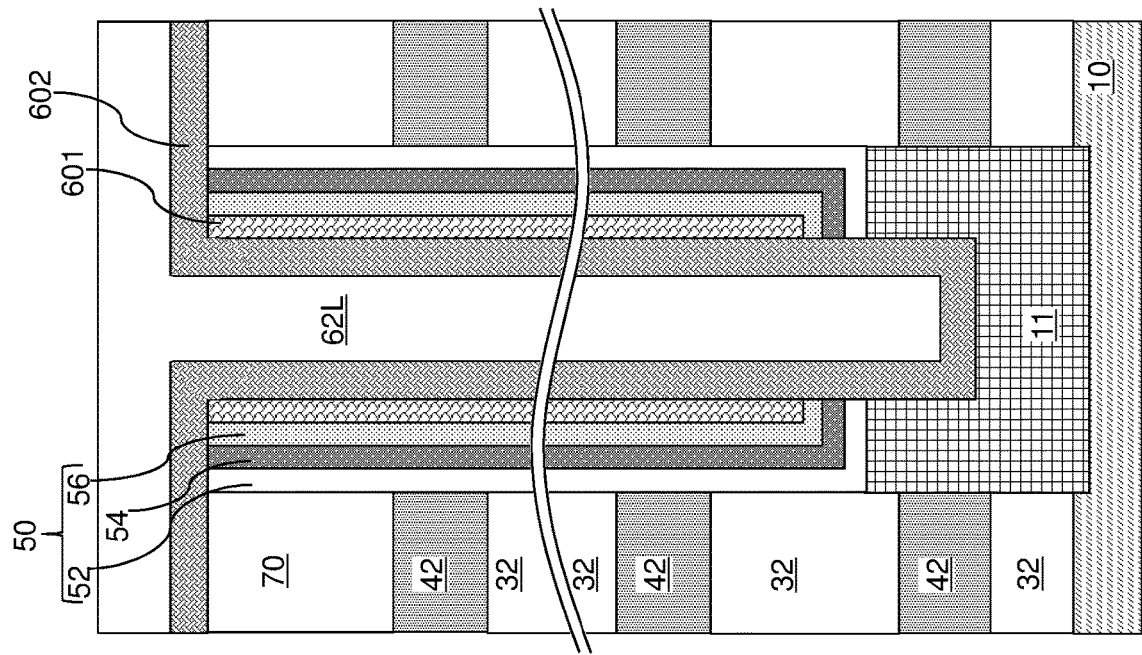
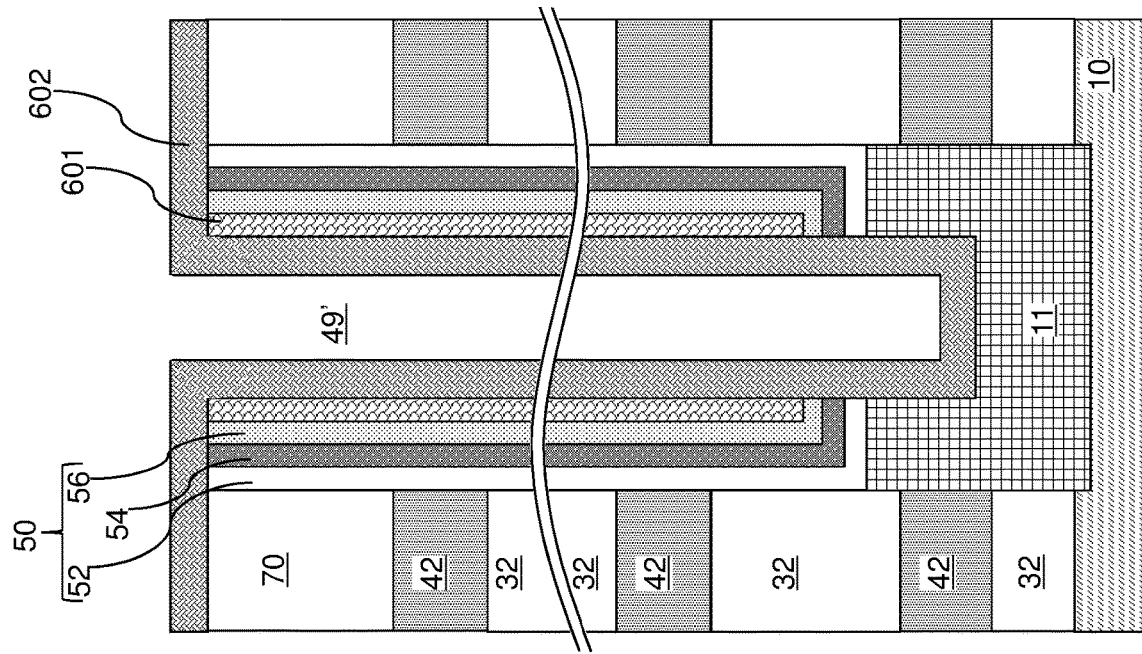

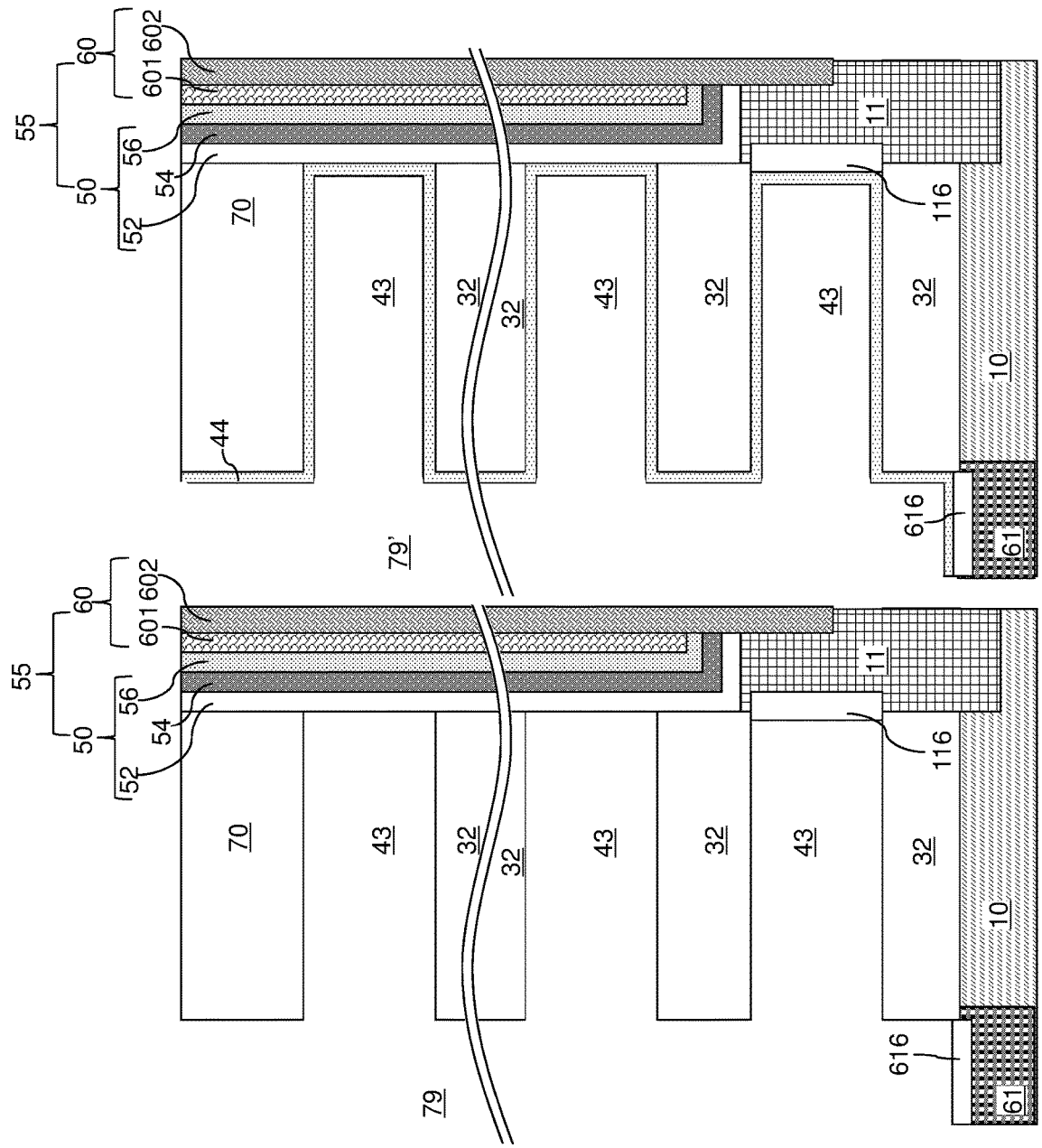

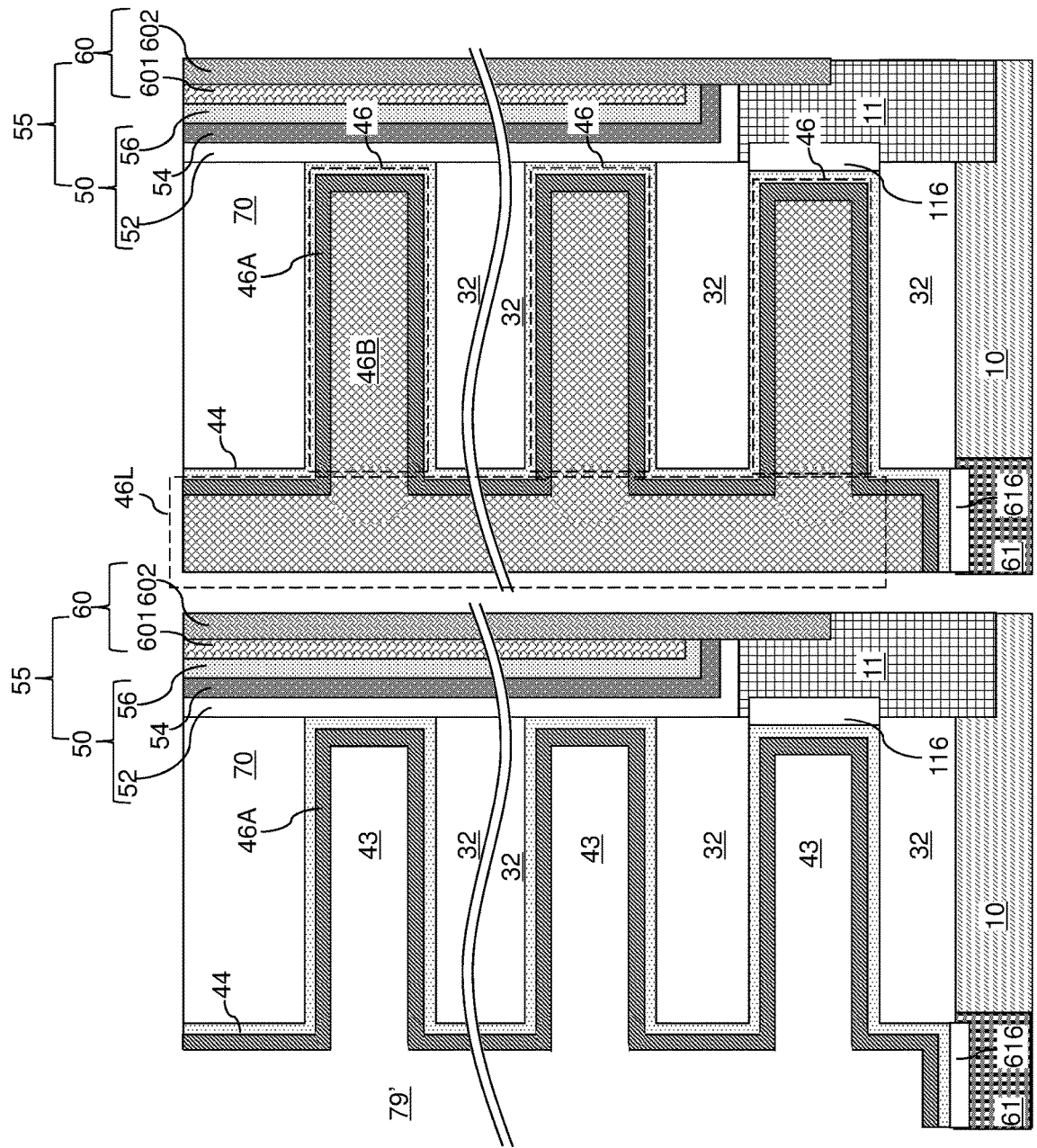

THREE-DIMENSIONAL MEMORY DEVICE CONTAINING ETCH-STOP STRUCTURES AND SELF-ALIGNED INSULATING SPACERS AND METHOD OF MAKING THE SAME

FIELD

The present disclosure relates generally to the field of semiconductor devices, and particular to a three-dimensional memory device employing etch-stop structures and self-aligned insulating spacers for word-line contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the alternating stack comprises a staircase region in which lateral extents of the electrically conductive layers decrease with a vertical distance from the substrate; a retro-stepped dielectric material portion overlying the staircase region of the alternating stack; memory stack structures vertically extending through the alternating stack, wherein each of the memory stack structures comprises a respective vertical semiconductor channel and a respective memory film; an electrically conductive or semiconductor perforated etch stop plate interposed between the alternating stack and a stepped bottom surface of the retro-stepped dielectric material portion; and laterally-insulated contact structures vertically extending through the retro-stepped dielectric material portion and through a respective one of perforation openings in the perforated etch stop plate, wherein each of the laterally-insulated contact structures comprises an assembly of a contact via structure contacting a top surface of a respective one of the electrically conductive layers and an insulating spacer laterally surrounding the contact via structure and contacting the perforated etch stop plate.

According to another aspect of the present disclosure, a method of forming a semiconductor structure is provided, which comprises: forming an alternating stack of insulating layers and spacer material layers over a substrate, wherein the spacer material layers are formed as, or are subsequently replaced with, electrically conductive layers; forming stepped surfaces in a staircase region by patterning the alternating stack; forming a stepped material plate over the stepped surfaces, wherein the stepped material plate is formed as, or is subsequently replaced with, a stepped etch stop plate; forming a retro-stepped dielectric material portion over the stepped material plate; forming memory stack structures through the alternating stack, wherein each of the memory stack structures comprises a respective vertical semiconductor channel and a respective memory film; performing a first anisotropic etch process to form contact via openings vertically extending through the retro-stepped dielectric material portion and stopping on the stepped etch stop plate; forming insulating spacers at peripheral regions of the contact via openings; performing a second anisotropic etch process that vertically extends via cavities within the contact via openings, wherein top surfaces of the electrically conductive layers are exposed underneath the via cavities; and forming contact via structures by depositing at least one conductive material in the via cavities.

According to yet another aspect of the present disclosure, a three-dimensional memory device is provided, which comprises: an alternating stack of insulating layers and electrically conductive layers located over a substrate, wherein the alternating stack comprises a staircase region in which lateral extents of the electrically conductive layers decrease with a vertical distance from the substrate; a retro-stepped dielectric material portion overlying the staircase region of the alternating stack; memory stack structures vertically extending through the alternating stack, wherein each of the memory stack structures comprises a respective vertical semiconductor channel and a respective memory film; and laterally-insulated contact structure vertically extending through the retro-stepped dielectric material portion, wherein the laterally-insulated contact structure comprises an electrically conductive contact via structure and an insulating spacer that laterally surrounds the electrically conductive contact via structure; the electrically conductive contact via structure contacts a first electrically conductive layer of the electrically conductive layers and vertically extends through an opening in a second electrically conductive layer of the electrically conductive layers which overlies the first electrically conductive layer; and the electrically conductive contact via structure is electrically isolated from the second electrically conductive layer by the insulating spacer.

According to still another aspect of the present disclosure, a method of forming a semiconductor structure is provided, which comprises: forming an alternating stack of insulating layers and spacer material layers over a substrate, wherein the spacer material layers are formed as, or are subsequently replaced with, electrically conductive layers; forming stepped surfaces in a staircase region by patterning the alternating stack; forming a retro-stepped dielectric material portion over the stepped surfaces; forming memory stack structures through the alternating stack, wherein each of the memory stack structures comprises a respective vertical semiconductor channel and a respective memory film; performing a first anisotropic etch process to form contact via openings vertically extending through the retro-stepped dielectric material portion and stopping on a respective electrically conductive layer of the electrically conductive layers; forming insulating spacers at peripheral regions of the contact via openings; performing a second anisotropic etch process that vertically extends via cavities within the contact via openings, wherein a top surface of a respective additional electrically conductive layer is exposed underneath the via cavities, the respective additional electrically conductive layer underlying the respective electrically conductive layer; and forming contact via structures by depositing at least one conductive material in the via cavities.

BRIEF DESCRIPTION OF THE DRAWINGS

FIGS. 7A-7H are sequential schematic vertical cross-sectional views of a memory opening during formation of a memory opening fill structure according to the first embodiment of the present disclosure.

FIGS. 11A-11D are sequential vertical cross-sectional views of a region of the first exemplary structure during formation of electrically conductive layers according to the first embodiment of the present disclosure.

DETAILED DESCRIPTION

Figure 1:
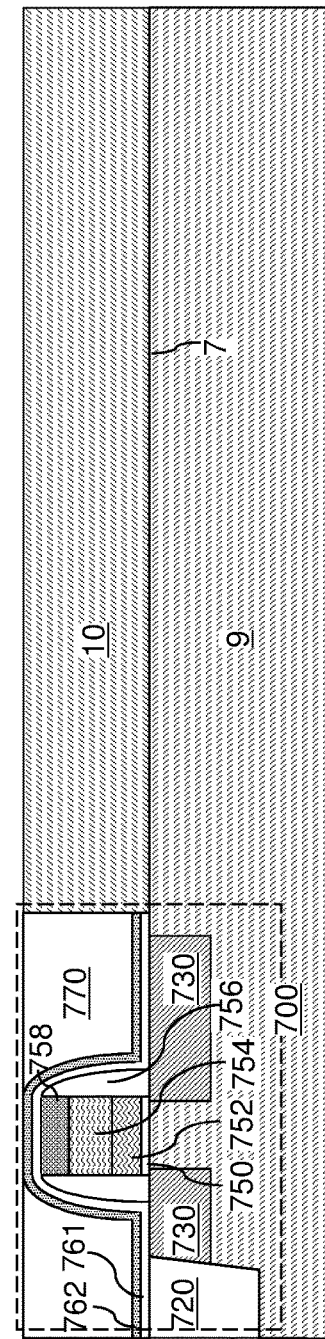
FIG. 1 is a schematic vertical cross-sectional view of a first exemplary structure after formation of at least one peripheral device and a semiconductor material layer according to a first embodiment of the present disclosure.

As discussed above, the present disclosure is directed to a three-dimensional memory device employing etch-stop structures and self-aligned insulating spacers for word-line contact via structures and methods of manufacturing same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one peripheral semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment, the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one peripheral semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one peripheral semiconductor device 700 is herein referred to as a peripheral region 200. The region in which a memory array is subsequently formed is herein referred to as a memory array region 100. A staircase region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
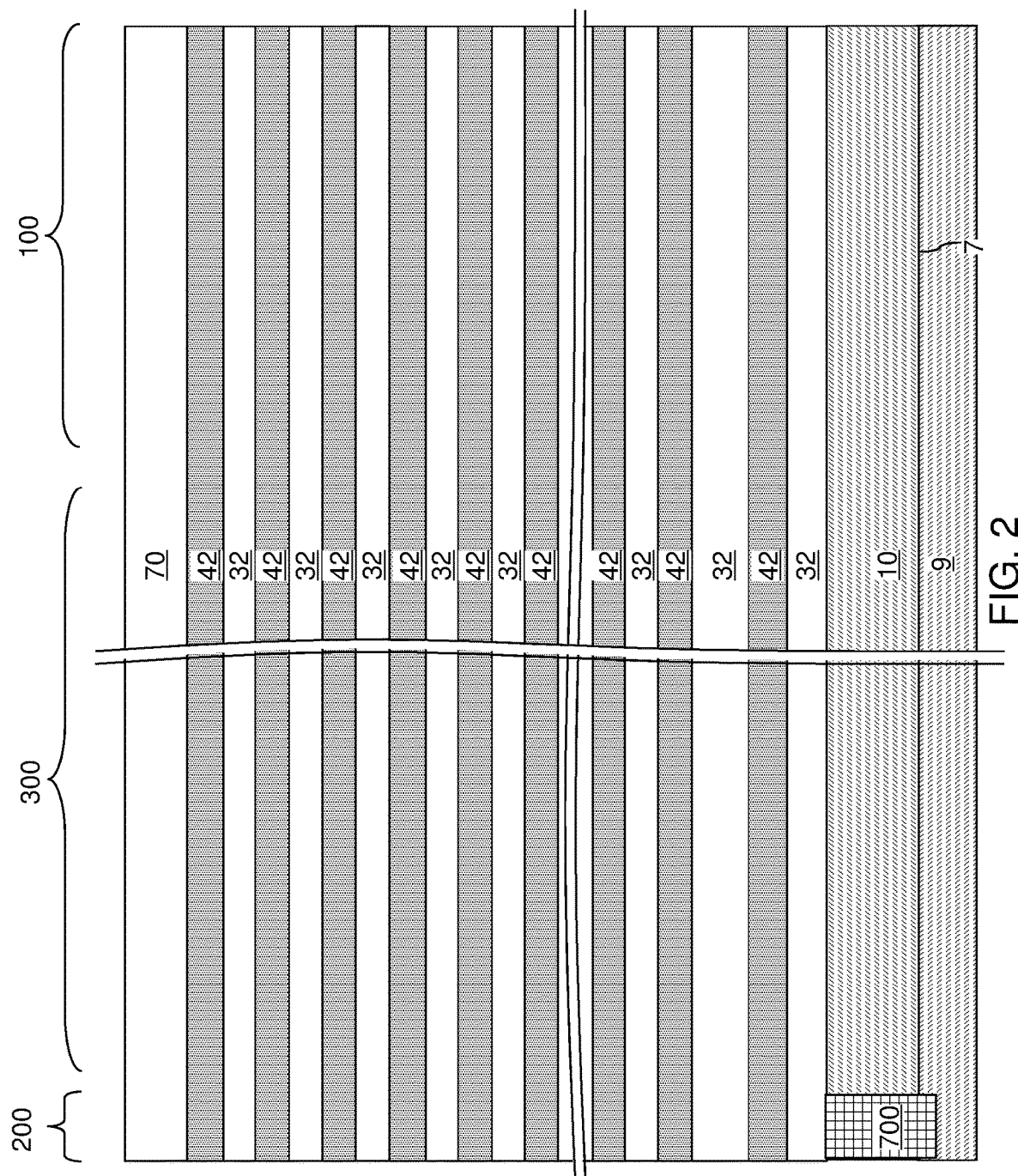
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
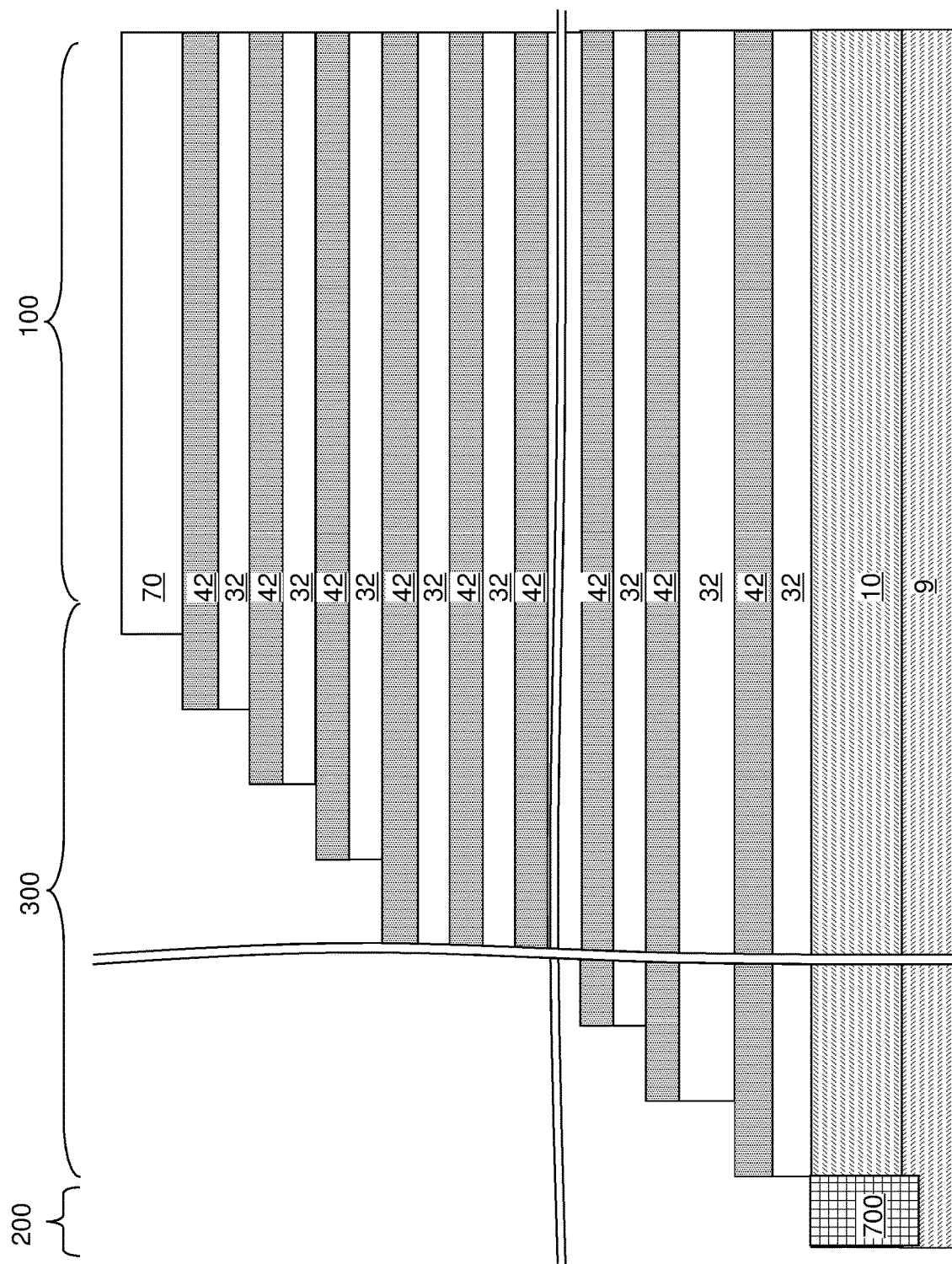
FIG. 3 is a schematic vertical cross-sectional view of the first exemplary structure after formation of stepped terraces according to the first embodiment of the present disclosure.

Referring to FIG. 3, a stepped cavity can be formed within the staircase region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

A peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

Each sacrificial material layer 42 other than a topmost sacrificial material layer 42 within the alternating stack (32, 42) laterally extends farther than any overlying sacrificial material layer 42 within the alternating stack (32, 42). The staircase region includes stepped surfaces of the alternating stack (32, 42) that continuously extend from a bottommost layer within the alternating stack (32, 42) to a topmost layer within the alternating stack (32, 42). The sacrificial material layers 42 have a respective lateral extent that decreases as a function of a vertical distance from the substrate (9, 10) in the staircase region. Generally, stepped surfaces are formed in a staircase region 300 by patterning the alternating stack (32, 42). The alternating stack (32, 42) has variable lateral extents that decrease with a vertical distance from the substrate (9, 10) in the staircase region 300.

Figure 4:
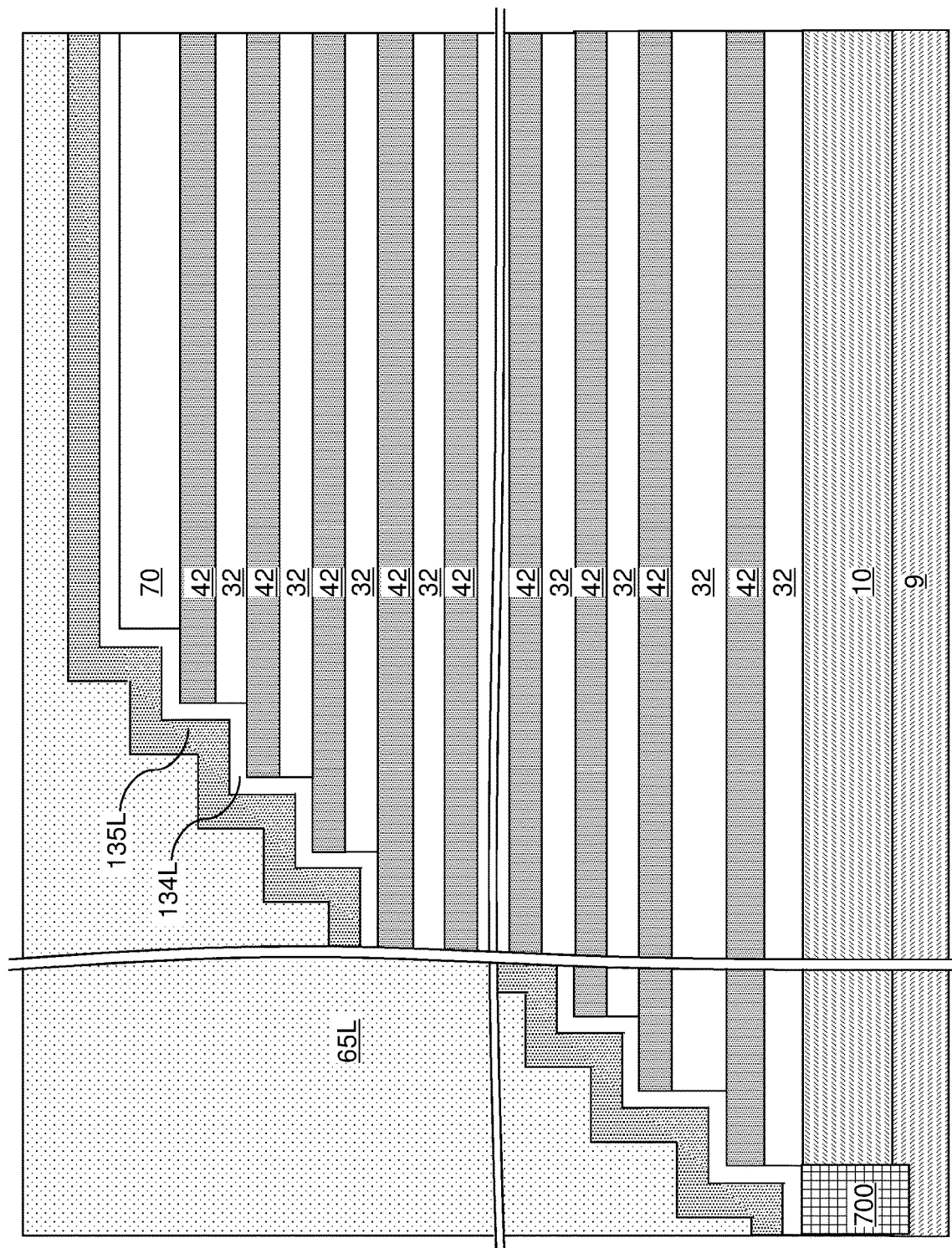
FIG. 4 is a schematic vertical cross-sectional view of the first exemplary structure after formation of a stepped insulating layer, a stepped sacrificial material layer, and a retro-stepped dielectric material layer according to the first embodiment of the present disclosure.

Referring to FIG. 4, a stepped insulating layer 134L is formed as a continuous material layer directly on the stepped surfaces of the alternating stack (32, 42) and over the insulating cap layer 70. The stepped insulating layer 134L includes an insulating material that is different from the material of the sacrificial material layers 42. In one embodiment, the stepped insulating layer 134L includes an insulating material that is different from silicon nitride. For example, the stepped insulating layer 134L can comprise silicon oxide or a dielectric metal oxide, such as aluminum oxide. The stepped insulating layer 134L can be deposited by a conformal deposition process such as chemical vapor deposition or atomic layer deposition. The thickness of the stepped insulating layer 134L may be in a range from 3 nm to 60 nm, such as from 6 nm to 30 nm, although lesser and greater thicknesses can also be employed.

A stepped sacrificial material layer 135L is formed over the stepped insulating layer 134L. The stepped sacrificial material layer 135L includes sacrificial material that is different from the material of the stepped insulating layer 134L. In one embodiment, the stepped sacrificial material layer 135L includes the same material as the material of the sacrificial material layers 42. For example, the stepped sacrificial material layer 135L can comprise silicon nitride. In an alternative embodiment, the stepped sacrificial material layer 135L includes a sacrificial material that is different from the material of the sacrificial material layers 42. For example, the stepped sacrificial material layer 135L may comprise a silicon-germanium alloy or amorphous carbon. The stepped sacrificial material layer 135L can be deposited by a conformal deposition process such as chemical vapor deposition or atomic layer deposition. The thickness of the stepped sacrificial material layer 135L can have a thickness in a range from 20 nm to 100 nm, such as from 30 nm to 50 nm, although lesser and greater thicknesses can also be employed.

A dielectric fill material such as undoped silicate glass or a doped silicate glass can be deposited over the stepped sacrificial material layer 135L to form a dielectric fill material layer 65L. The dielectric fill material layer 65 may fill the entire volume of the stepped cavity overlying the stepped surfaces of the alternating stack (32, 42) and underlying a horizontal plane including the top surface of the insulating cap layer 70.

Figure 5:
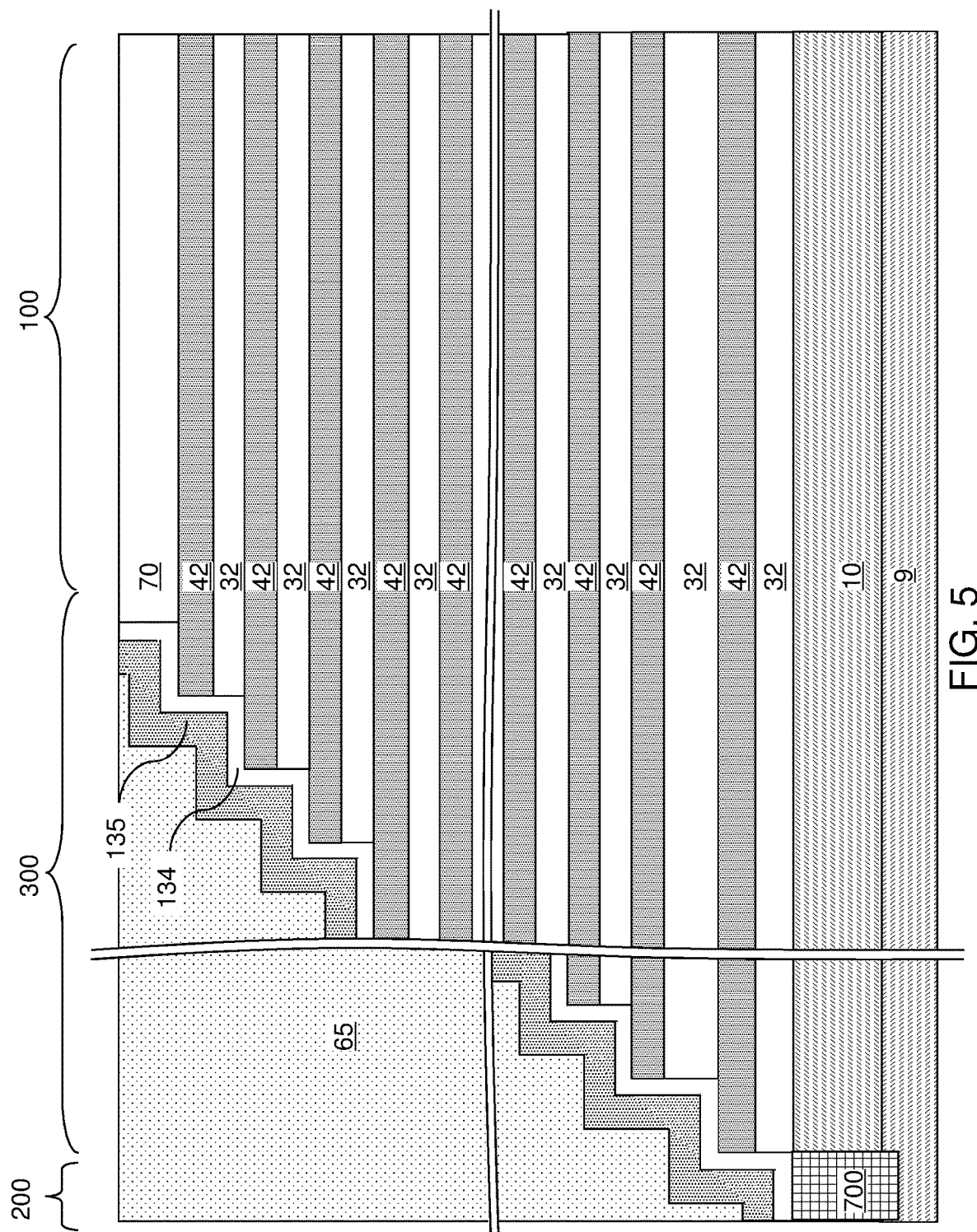
FIG. 5 is a schematic vertical cross-sectional view of the first exemplary structure after formation of a stepped insulating plate, a stepped sacrificial material plate, and a retro-stepped dielectric material portion according to the first embodiment of the present disclosure.

Referring to FIG. 5, an optional planarization process can be performed in to remove the portions of the dielectric fill material layer 65L, the stepped sacrificial material layer 135L, and the stepped insulating layer 134L that are located above the horizontal plane including the top surface of the insulating cap layer 70. For example, a chemical mechanical polishing (CMP) process may be employed to remove the portions of the dielectric fill material layer 65L, the stepped sacrificial material layer 135L, and the stepped insulating layer 134L that are located above the horizontal plane including the top surface of the insulating cap layer 70. A remaining portion of the dielectric fill material layer 65L comprises a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. A remaining portion of the stepped sacrificial material layer 135L comprises a stepped sacrificial material plate 135. A remaining portion of the stepped insulating layer 134L comprises a stepped insulating plate 134. The topmost surfaces of the stepped insulating plate 134, the sacrificial material plate 135, and the retro-stepped dielectric material portion 65 can be located within the same horizontal plane as the top surface of the insulating cap layer 70.

Figure 9A:
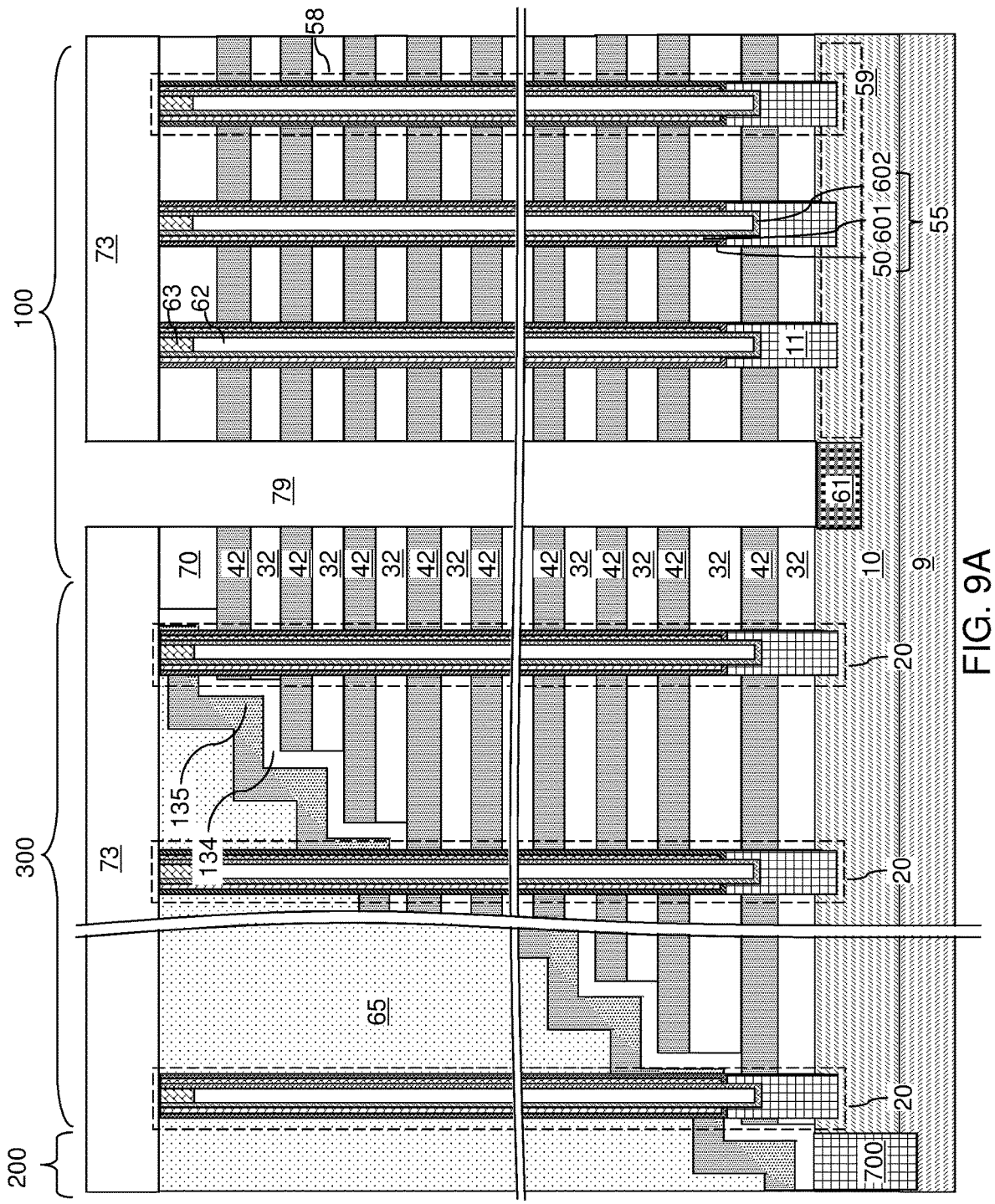
FIG. 9A is a schematic vertical cross-sectional view of the first exemplary structure after formation of backside trenches according to the first embodiment of the present disclosure.
Figure 9B:
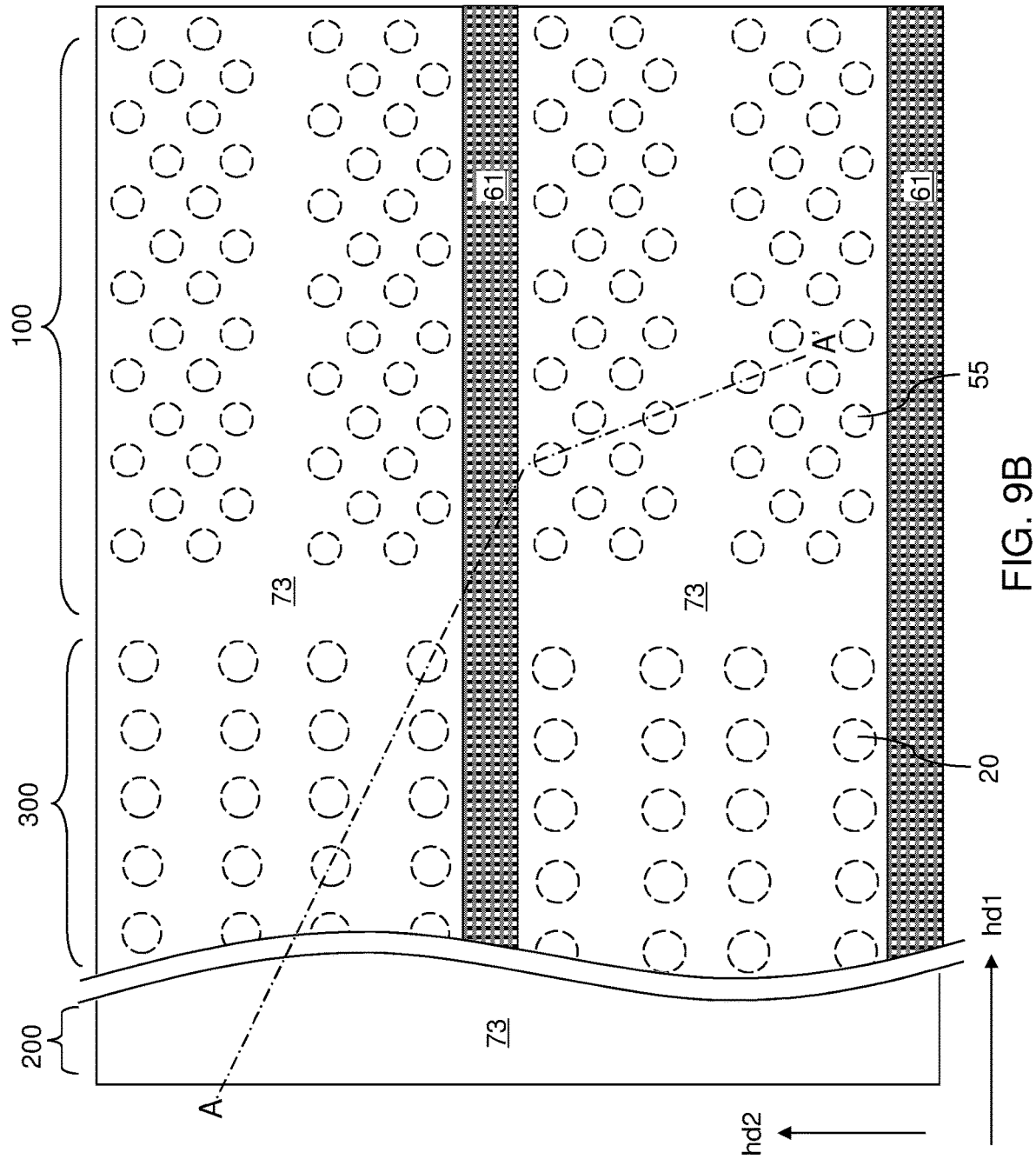
FIG. 9B is a top-down view of the first exemplary structure of FIG. 9A. The vertical plane A-A' is the plane of the schematic vertical cross-sectional view of FIG. 9A.

In an alternative embodiment, the planarization process is omitted, and portions of the dielectric fill material layer 65L, the stepped sacrificial material layer 135L, and the stepped insulating layer 134L that are located above the horizontal plane including the top surface of the insulating cap layer 70 remain in the device. In this alternative embodiment, the portion of the dielectric fill material layer 65L that is located above the horizontal plane including the top surface of the insulating cap layer 70 functions as a contact level dielectric layer 73 which is formed at the steps shown in FIGS. 9A and 9B below. In this alternative embodiment, a separate contact level dielectric layer 73 formation step shown in FIGS. 9A and 9B is omitted.

Generally, a stepped insulating plate 134 can be formed on the stepped surfaces of the alternating stack (32, 42), and the stepped material plate 135 can be formed over and directly on the insulating plate 134. The stepped material plate 135 may be replaced with a stepped etch stop plate in subsequent processing steps. As such, the stepped material plate 135 may be a sacrificial stepped material plate. The retro-stepped dielectric material portion 65 can be formed over and directly on the stepped material plate 135. In one embodiment, the spacer material layers within the alternating stack (32, 42) may be formed as sacrificial material layers 42 that are subsequently replaced with electrically conductive layers, and the stepped material plate 135 may be formed as a sacrificial stepped material plate that is subsequently replaced with the stepped etch stop plate.

Optionally, drain select level isolation structures (not shown) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 6A:
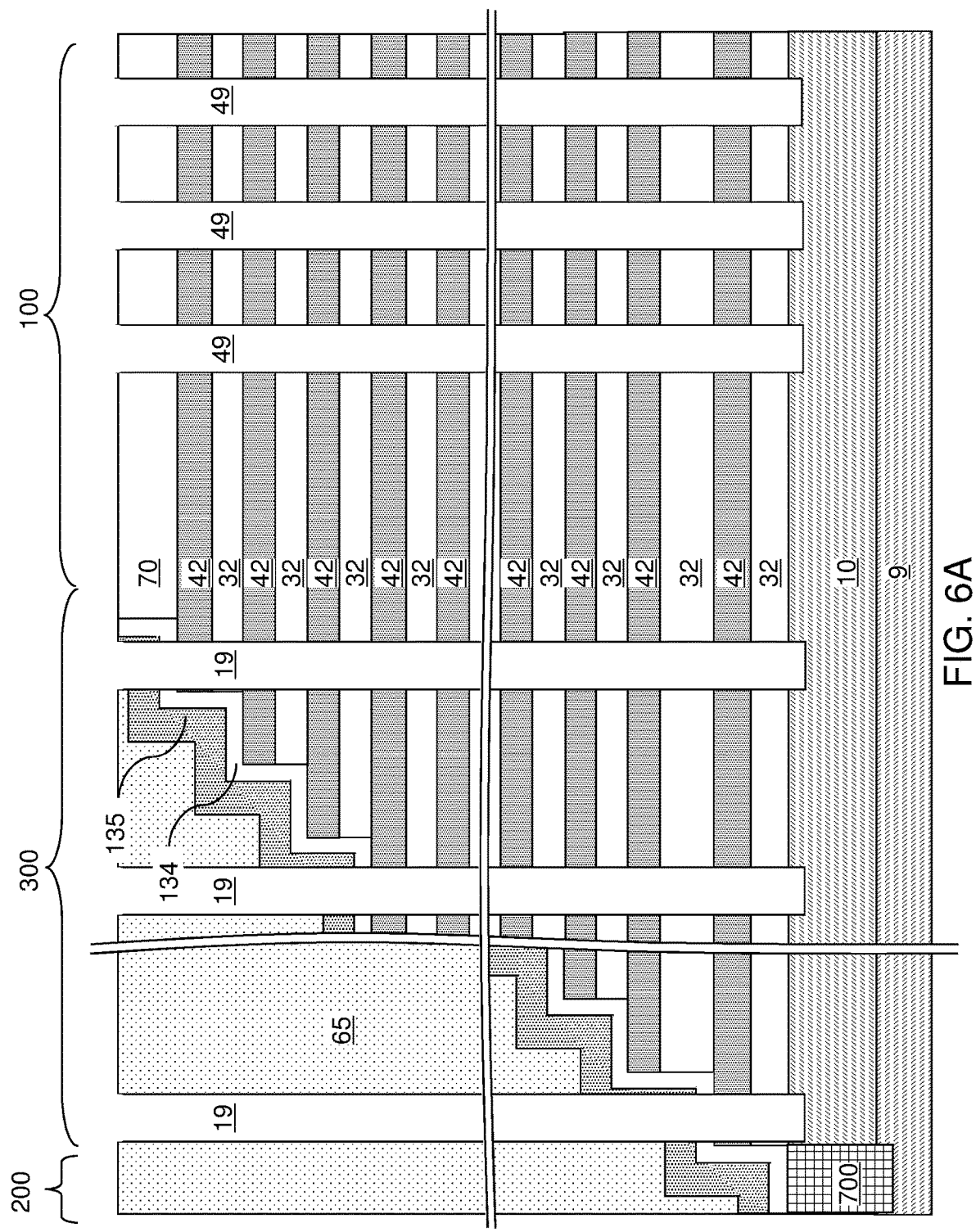
FIG. 6A is a schematic vertical cross-sectional view of the first exemplary structure after formation of memory openings and support openings according to the first embodiment of the present disclosure.
Figure 6B:
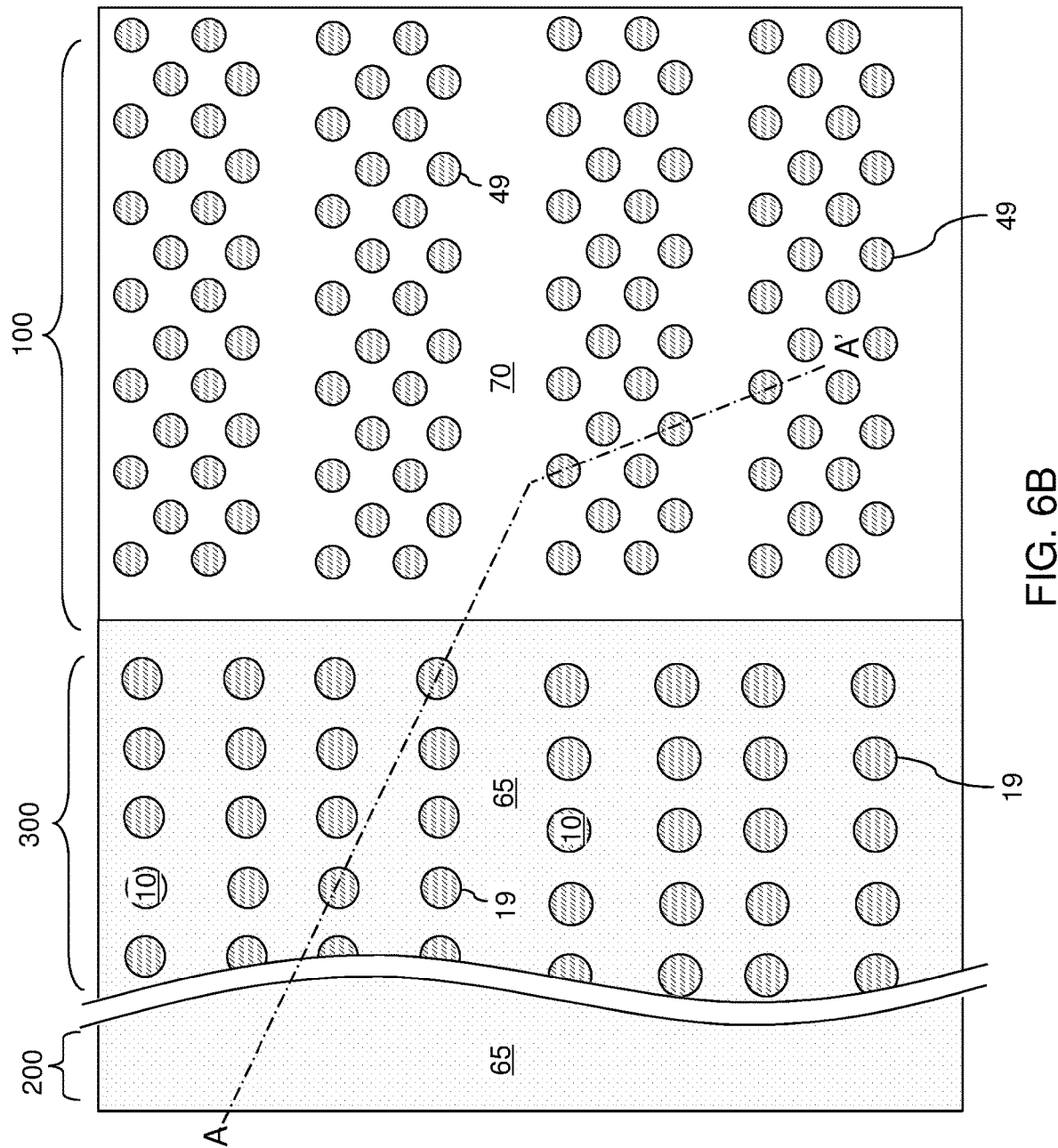
FIG. 6B is a top-down view of the first exemplary structure of FIG. 6A. The vertical plane A-A' is the plane of the cross-section for FIG. 6A.

Referring to FIGS. 6A and 6B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70, the retro-stepped dielectric material portion 65, the stepped material plate 135, the stepped insulating plate 134, and the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed in the memory array region 100 through the insulating cap layer 70 and each layer within the alternating stack (32, 42). The support openings 19 are formed in the staircase region 300 through the retro-stepped dielectric material portion 65, the stepped material plate 135, the stepped insulating plate 134, and the portion of the alternating stack (32, 42) that underlie the stepped surfaces.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. In one embodiment, each of the support openings 19 can vertically extend through the stepped material plate 135 and the stepped insulating plate 134. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 7A-7H illustrate structural changes in a memory opening 49, which is one of the memory openings 49 in the first exemplary structure of FIGS. 6A and 6B. The same structural change occurs simultaneously in each of the other memory openings 49 and in each support opening 19.

Referring to FIG. 7A, a memory opening 49 in the exemplary device structure of FIGS. 6A and 6B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 7B, an optional pedestal channel portion 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11.

In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion 11 contacts. If a semiconductor material layer 10 is not present, the pedestal channel portion 11 can be formed directly on the substrate semiconductor layer 9, which can have a doping of the first conductivity type.

Referring to FIG. 7C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 7D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising portions of the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 7E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening. The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 7F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 7H:
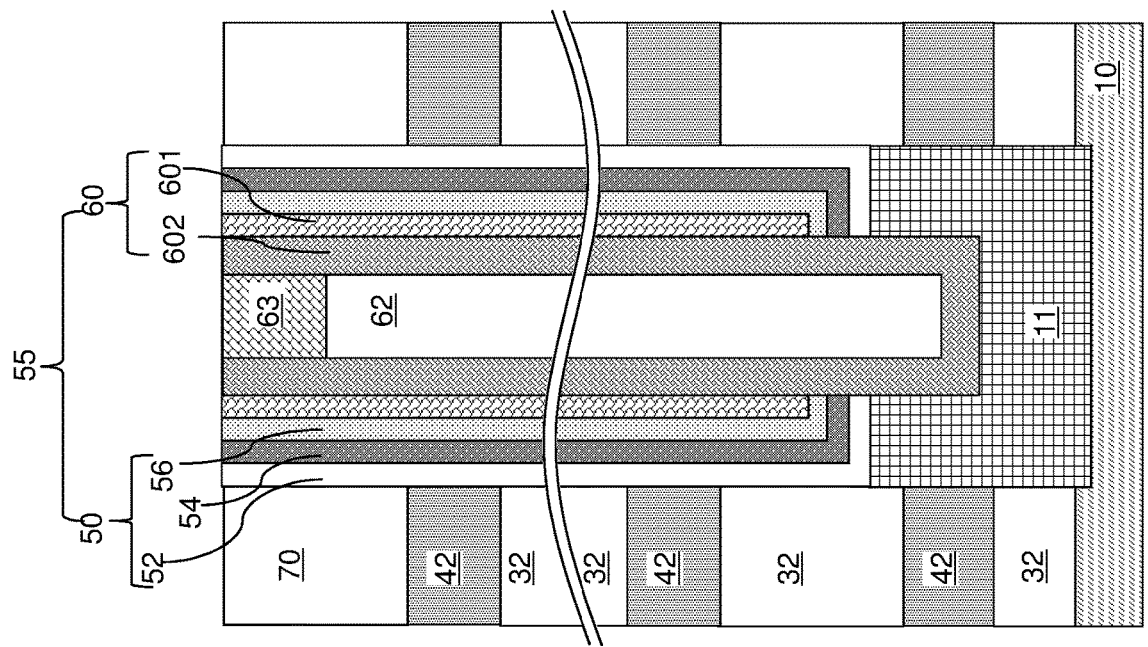
Figure 7G:
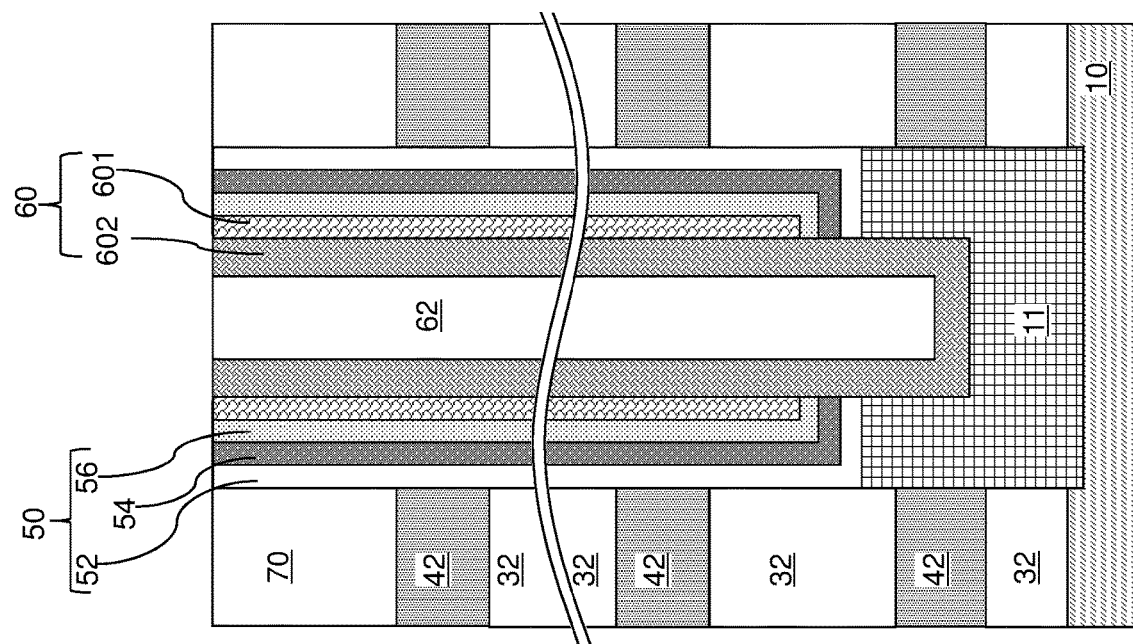

Referring to FIG. 7G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 7H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52.

Figure 8:
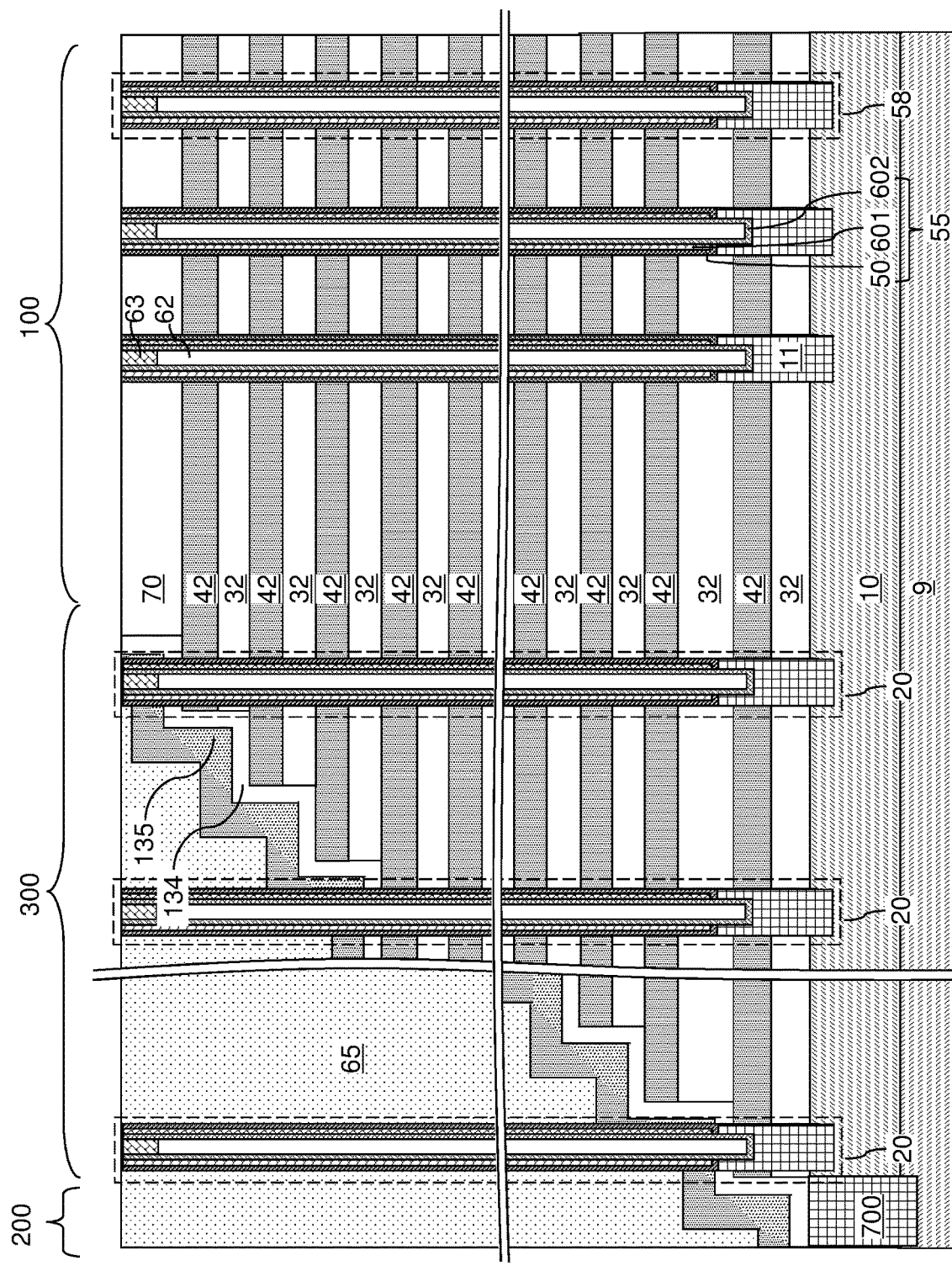
FIG. 8 is a schematic vertical cross-sectional view of the first exemplary structure after formation of memory stack structures and support pillar structures according to the first embodiment of the present disclosure.

Referring to FIG. 8, the first exemplary structure is illustrated after formation of memory opening fill structures 58 and support pillar structure 20 within the memory openings 49 and the support openings 19, respectively. Each combination of a pedestal channel portion 11 (if present), a memory stack structure 55, a dielectric core 62, and a drain region 63 within a memory opening 49 is herein referred to as a memory opening fill structure 58. An instance of a memory opening fill structure 58 can be formed within each memory opening 49 of the structure of FIGS. 8A and 8B. An instance of the support pillar structure 20 can be formed within each support opening 19 of the structure of FIGS. 8A and 8B. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions (e.g., portions of the charge storage layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

A two-dimensional array of support pillar structures 20 can be formed in the staircase region 300. In one embodiment, each of the support pillar structures 20 can vertically extend through at least one etch stop plate 182. In one embodiment, at least one of the support pillar structures 20 can vertically extend through only one of the etch stop plates 182. Alternatively or additionally, at least one of the support pillar structures 20 can vertically extend through a respective pair of the etch stop plates 182. A support pillar structure 20 may, or may not, directly contact a dielectric spacer 134.

Referring to FIGS. 9A and 9B, the contact level dielectric layer 73 can optionally be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

In the above described alternative embodiment in which the planarization step of FIG. 5 is omitted, the portion of the dielectric fill material layer 65L that is located above the horizontal plane including the top surface of the insulating cap layer 70 functions as the contact level dielectric layer 73. In this alternative embodiment, the separate formation of the contact level dielectric layer 73 is omitted. In another alternative embodiment, the contact level dielectric layer 73 is formed over the retained portion of the dielectric fill material layer 65L that is located above the horizontal plane including the top surface of the insulating cap layer 70. Thus, the contact level dielectric film which comprises a bilayer is formed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300. In one embodiment, the backside trenches 79 can include a source contact opening in which a source contact via structure can be subsequently formed. In one embodiment, the backside trenches 79 can laterally extend along a first horizontal direction (e.g., word line direction) hd1, and can be laterally spaced among one another along a second horizontal direction (e.g., bit line direction) hd2. In one embodiment, each backside trench 79 can be a line trench having a uniform width that is invariant with translation with the lengthwise direction, i.e., the first horizontal direction hd1. The photoresist layer can be removed, for example, by ashing.

The backside trenches 79 cut through each of the retro-stepped dielectric material portion 65, the stepped material plate 135, and the stepped insulating plate 134, and divide each of the retro-stepped dielectric material portion 65, the stepped material plate 135, and the stepped insulating plate 134 into a respective plurality of disjoined material portions. Thus, the backside trenches 79 divide the retro-stepped dielectric material portion 65 into a plurality of retro-stepped dielectric material portions 65 that are laterally spaced from each other along the second horizontal direction hd2. The backside trenches 79 divide the stepped material plate 135 into a plurality of stepped material plates 135 that are laterally spaced from each other along the second horizontal direction hd2. The backside trenches 79 divide the stepped insulating plate 134 into a plurality of stepped insulating plates 134 that are laterally spaced from each other along the second horizontal direction hd2.

Each of the retro-stepped dielectric material portions 65, the stepped material plates 135, and the stepped insulating plates 134 as divided by the backside trenches 79 has a respective pair of lengthwise sidewalls that are exposed to a respective one of the backside trenches 79. Each lengthwise sidewall of the retro-stepped dielectric material portions 65, the stepped material plates 135, and the stepped insulating plates 134 may be located within a respective vertical plane laterally extending along the first horizontal direction hd1.

A source region 61 can be formed at a surface portion of the semiconductor material layer 10 under each backside trench 79 by implantation of electrical dopants into physically exposed surface portions of the semiconductor material layer 10. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of a respective overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 10:
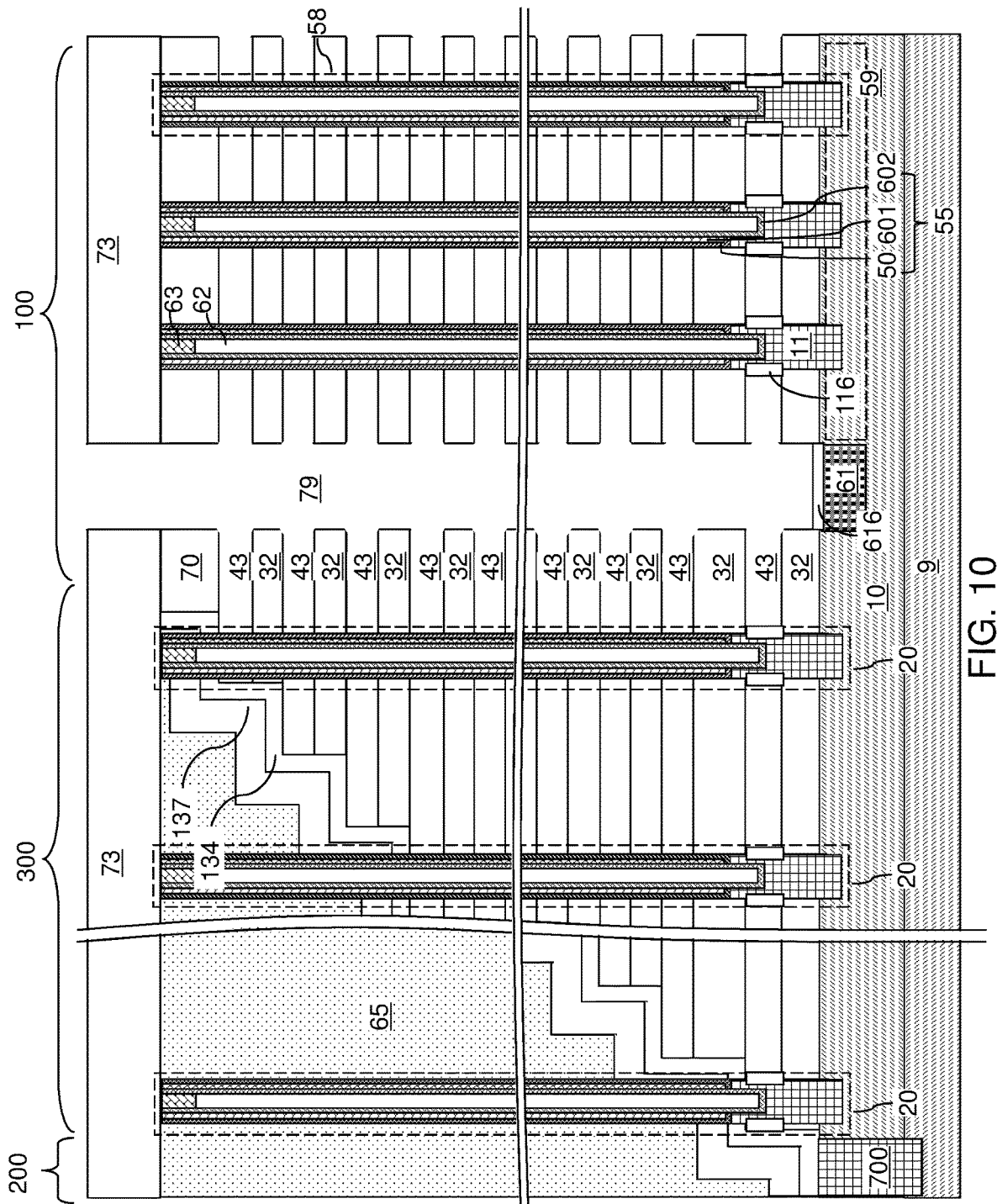
FIG. 10 is a schematic vertical cross-sectional view of the first exemplary structure after formation of backside recesses according to the first embodiment of the present disclosure.
Figure 12A:
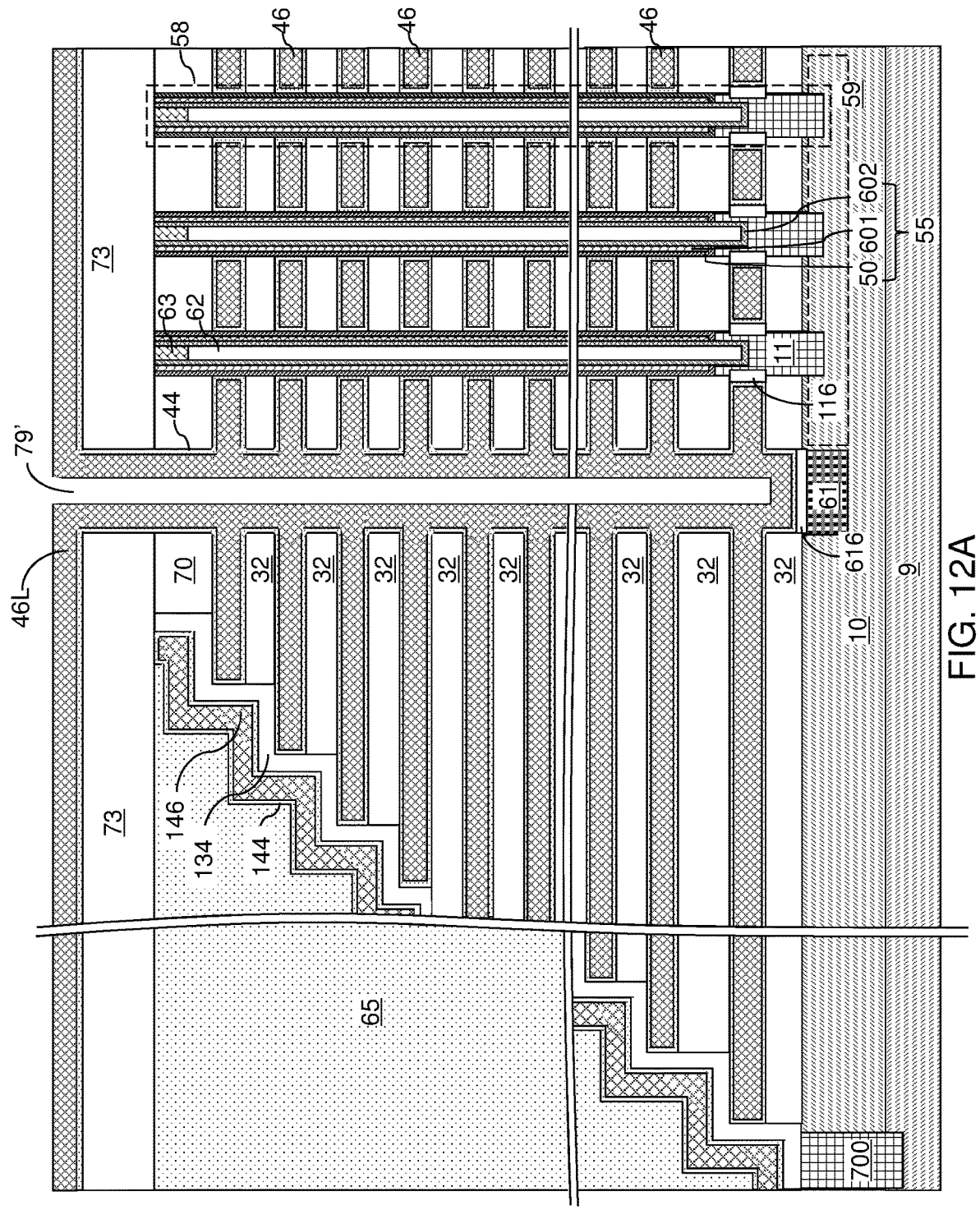
FIG. 12A is a schematic vertical cross-sectional view of the first exemplary structure at the processing step of FIG. 11D.
Figure 12B:
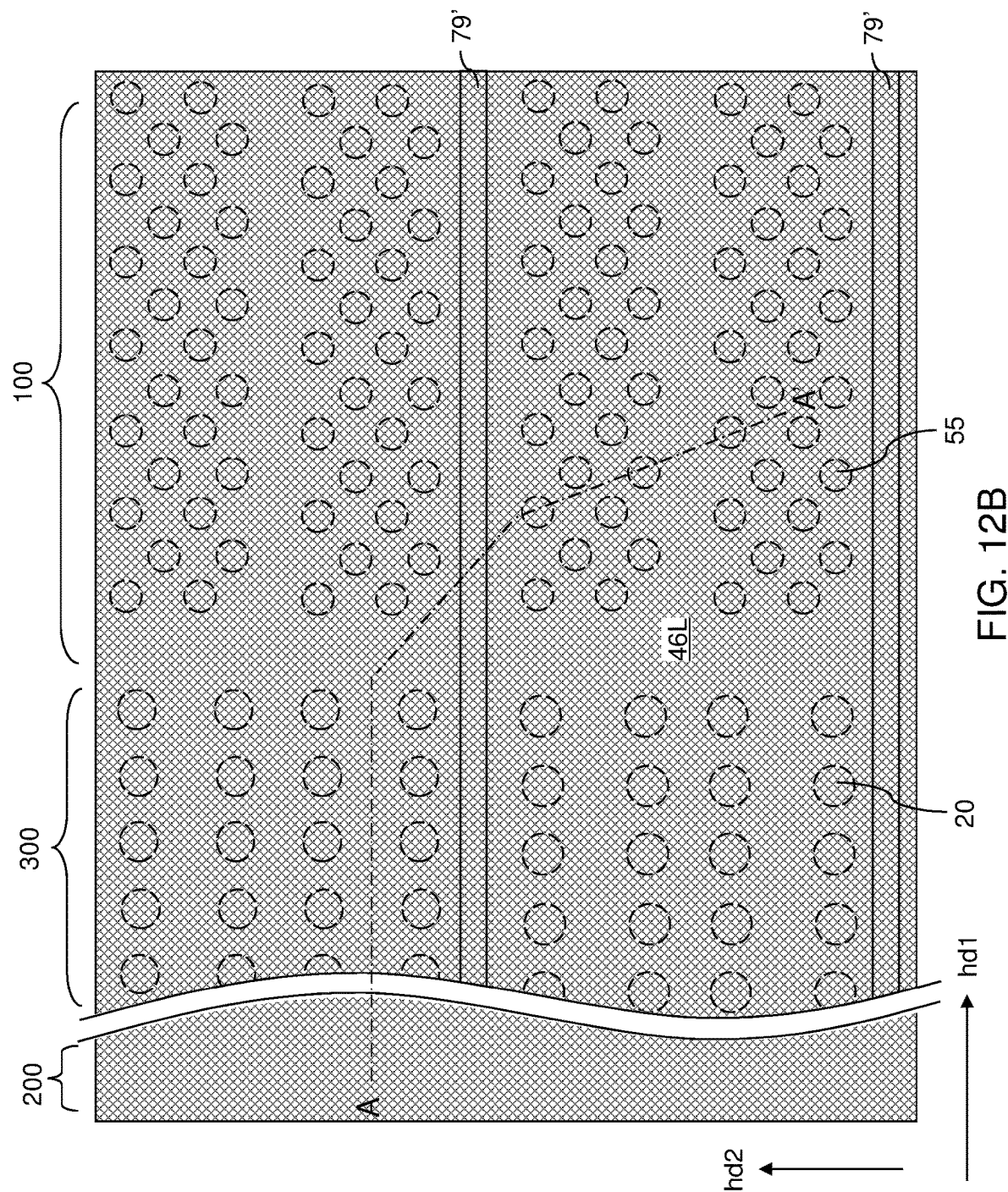
FIG. 12B is a top-down view of the first exemplary structure of FIG. 12A. The vertical plane A-A' is the plane of the schematic vertical cross-sectional view of FIG. 12A.
Figure 12C:
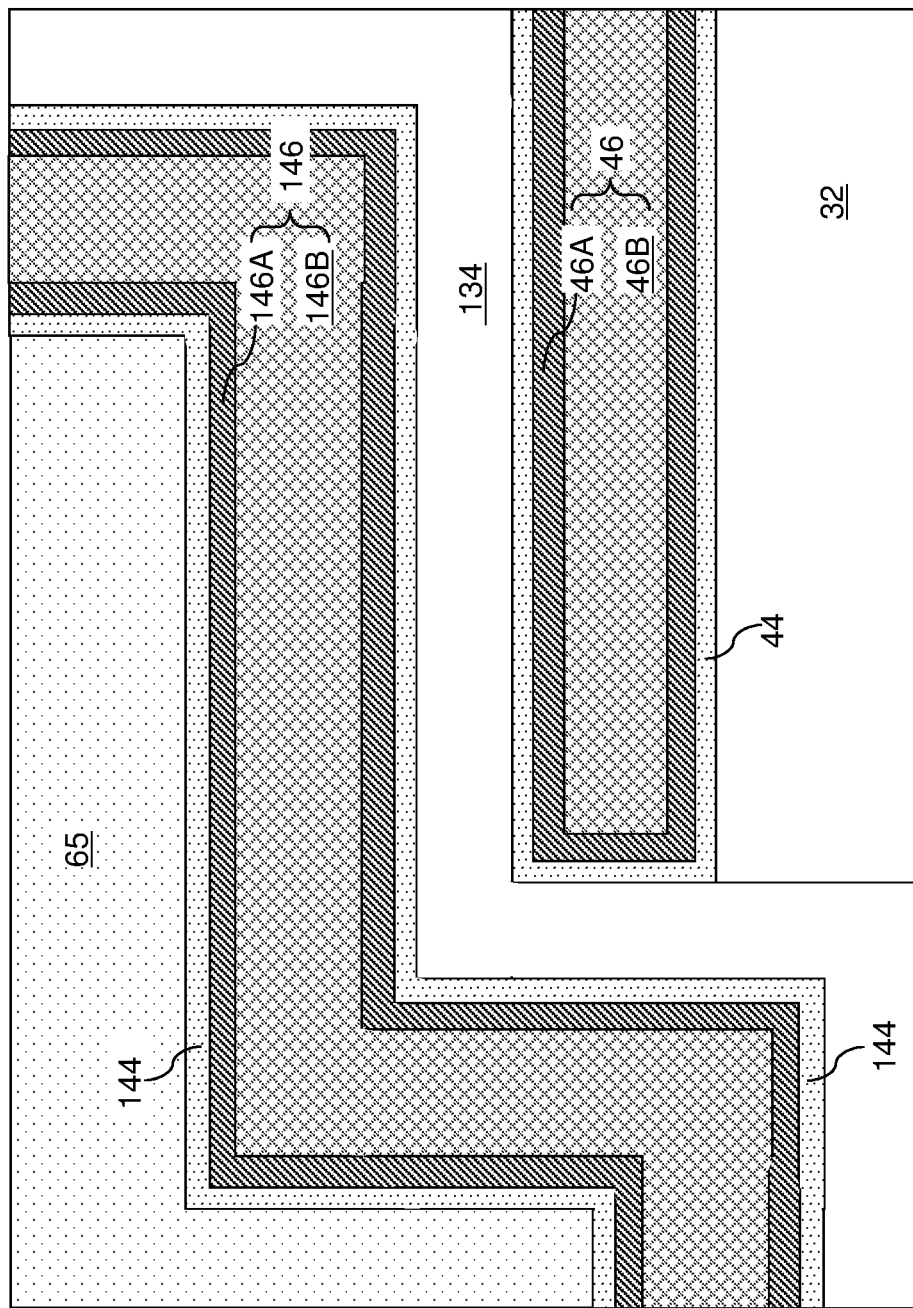
FIG. 12C is a magnified view of a region of the first exemplary structure of FIG. 12A.

Referring to FIGS. 10 and 11A, an etchant that selectively etches the second material of the sacrificial material layers 42 with respect to the first material of the insulating layers 32 can be introduced into the backside trenches 79, for example, employing a wet etch process. Backside recesses 43 are formed in volumes from which the sacrificial material layers 42 are removed. The removal of the second material of the sacrificial material layers 42 can be selective to the first material of the insulating layers 32, the material of the stepped insulating plates 134, the material of the retro-stepped dielectric material portion 65, the semiconductor material of the source regions 61, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 are removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32.

According to an aspect of the present disclosure, the stepped material plates 135 can be removed selective to the retro-stepped dielectric material portions 65, the stepped insulating plates 134, the insulating layers 32, the source regions 61, the outermost layer of each memory films 50 (such as the blocking dielectric layer 52), and the optional pedestal channel portions 11 concurrently with prior to or after removal of the sacrificial material layers 42. A plate-shaped void 137 can be formed in each volume from which a stepped material plate 135 is removed. A set of support pillar structures 20 vertically extends through each plate-shaped void 137, and provides structural support to overlying structures such as a retro-stepped dielectric material portion 65 and a portion of the contact-level dielectric layer 73 that overlies the retro-stepped dielectric material portion 65.

In one embodiment, the stepped material plates 135 comprise the same material as the sacrificial material layers 42. For example, the stepped material plates 135 and the sacrificial material layers 42 may comprise silicon nitride. In this case, the plate-shaped voids 137 may be formed concurrently with formation of the backside recesses 43.

In another embodiment, the stepped material plates 135 comprise a different material than the material of the sacrificial material layers 42. For example, the stepped material plates 135 may comprise a silicon-germanium alloy or amorphous carbon, and the sacrificial material layers 42 may comprise silicon nitride. In this case, the stepped material plates 135 may be selectively removed prior to or after removal of the sacrificial material layers 42 (i.e., prior to or after formation of the backside recesses 43). Removal of the stepped material plates 135 may be effected by a selective isotropic etch process (for example, employing a wet etch process that etches a silicon-germanium alloy) or an ashing process (for example, to ash amorphous carbon).

Subsequently, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 11B, a dielectric material can be optionally conformally deposited to form a backside blocking dielectric layer 44 on physically exposed surfaces around the backside recesses 43 and to form an encasing dielectric liner (not illustrated in FIG. 11B) on physically exposed surfaces around the plate-shaped voids 137. Each encasing dielectric liner subsequently encases a perforated etch stop plate upon formation of the perforated etch stop plate. The backside blocking dielectric layers 44 and the encasing dielectric liners, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed on all physically exposed surfaces in the backside recesses 43. The backside blocking dielectric layer 44 is formed on horizontal bottom surfaces of the insulating layers 32 other than the bottommost one of the insulating layers 32, and on horizontal top surfaces of each of the insulating layers 32. The backside blocking dielectric layer 44 is formed on physically exposed portions of the sidewalls of the memory opening fill structures 58 and the support pillar structures 20. The backside blocking dielectric layer 44 can be formed and on a sidewall of the backside trench 79. Each encasing dielectric liner can be formed on a stepped bottom surface of an overlying retro-stepped dielectric material portion 65 and over the stepped surfaces of an underlying stepped insulating plate 134.

The dielectric material of the backside blocking dielectric layers 44 and the encasing dielectric liners can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layers 44 and the encasing dielectric liners can include a silicon oxide layer. A backside cavity 79' is present within the portion of each backside trench 79 that is not filled with the backside blocking dielectric layer 44.

In one embodiment, the backside blocking dielectric layers 44 and the encasing dielectric liners can be formed by a conformal deposition process such as atomic layer deposition (ALD). The backside blocking dielectric layers 44 and the encasing dielectric liners can consist essentially of aluminum oxide. The thickness of the backside blocking dielectric layers 44 and the encasing dielectric liners can be in a range from 1 nm to 15 nm, such as 2 to 6 nm, although lesser and greater thicknesses can also be employed.

Referring to FIG. 11C, at least one metallic material can be subsequently deposited in remaining volumes of the backside recesses 43 and the plate-shaped voids 137. For example, an optional metallic barrier layer 46A can be deposited in remaining volumes of the backside recesses 43 and the plate-shaped voids 137. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIGS. 11D and 12A-12C, a metal fill material is deposited in the plurality of backside recesses 43 and the plate-shaped voids 137, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, a perforated etch stop plate 146 can be formed in each plate-shaped void 137, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. Each perforated etch stop plate 146 includes an optional plate metallic barrier layer 146A and a plate metallic fill material layer 146B. The plate metallic barrier layer 146A may have the same material composition and the same thickness as the metallic barrier layer 46A. The plate metallic fill material layer 146B may have the same material composition as the metallic fill material layer 46B. Each perforated etch stop plate 146 may be encased within an optional respective encasing dielectric liner 144, which has the same material composition and the same thickness as the backside blocking dielectric layers 44. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. Each stepped sacrificial material plate 135 can be replaced with a perforated etch stop plate 146 that is optionally encased within an encasing dielectric liner 144. Each perforated etch stop plate 146 includes a set of perforation openings through which a set of support pillar structures 20 vertically extends. As used herein, a "perforation opening" refers to an opening that extends through an entire thickness of a material portion, i.e., from a first surface located on one side of the material portion to a second surface located on the other side of the material portion such that a closed periphery of a wall surface of the perforation opening adjoins the first surface and another closed periphery of the wall surface of the perforation opening adjoins the second surface. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46. Each electrically conductive layer 46 can function as a word line integrated with control gate electrodes for NAND arrays, a source select gate electrode, or a drain select gate electrode.

Figure 13:
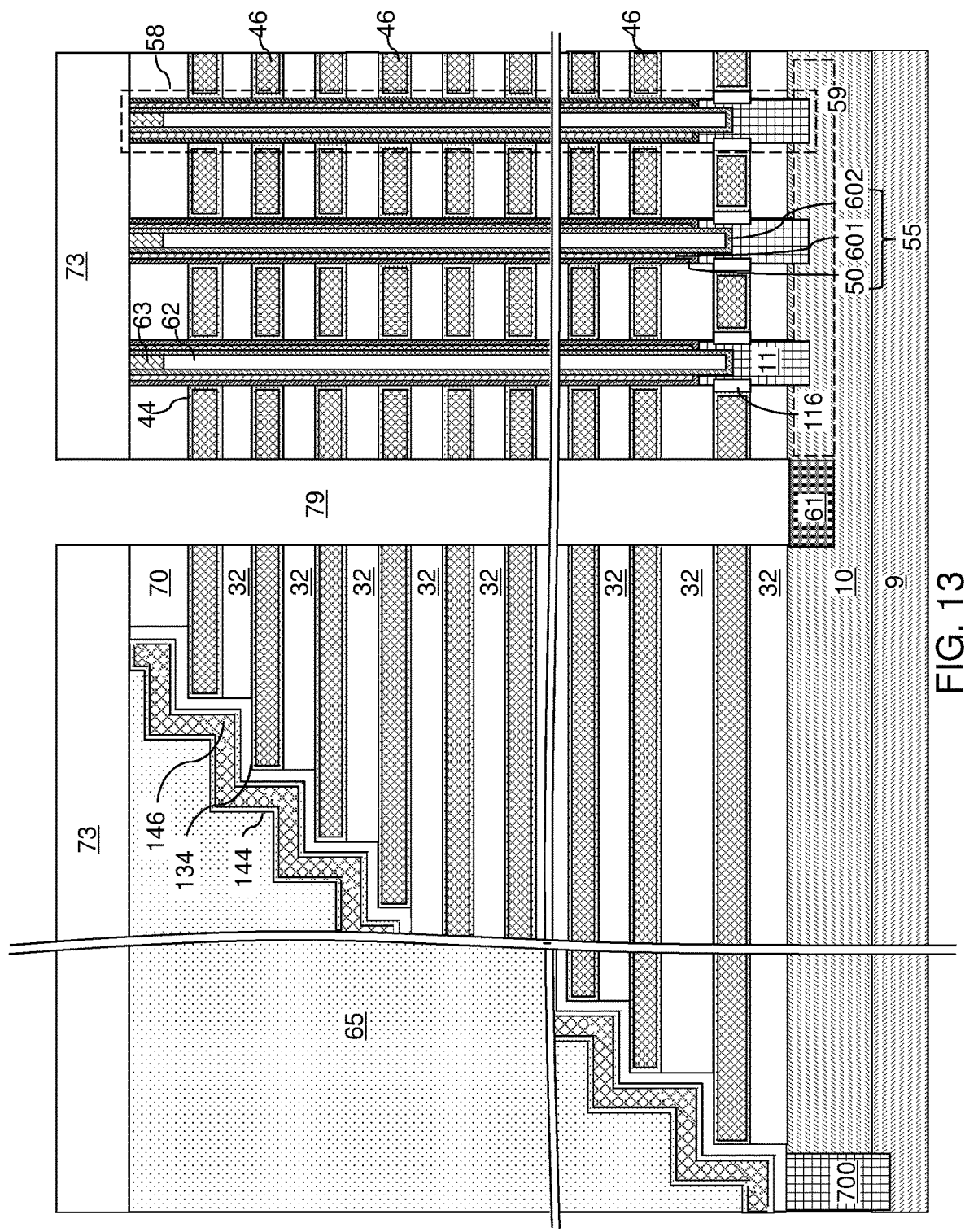
FIG. 13 is a schematic vertical cross-sectional view of the first exemplary structure after removal of a deposited conductive material from within the backside trenches according to the first embodiment of the present disclosure.

Referring to FIG. 13, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79.

Figure 14A:
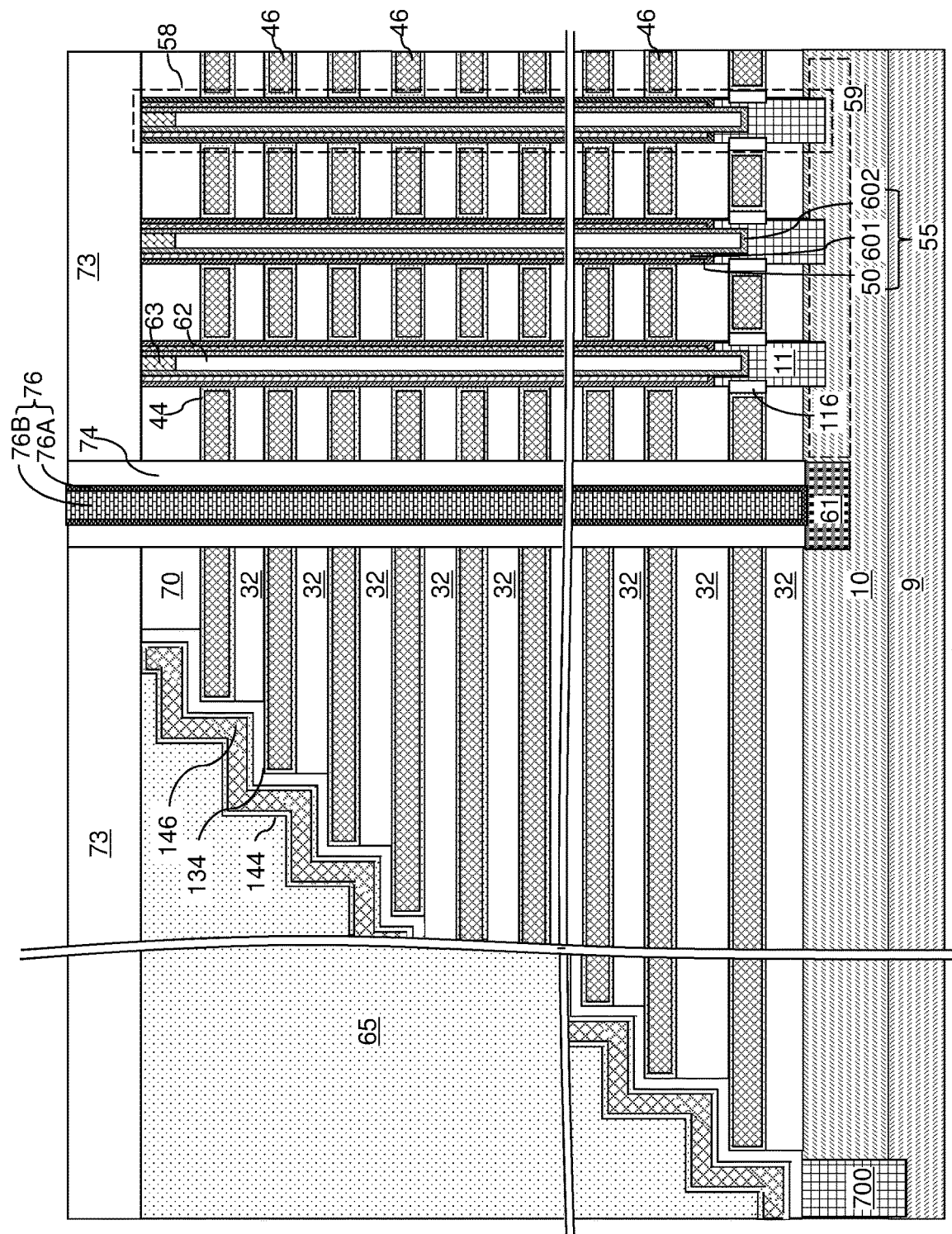
FIG. 14A is a schematic vertical cross-sectional view of the first exemplary structure after formation of a backside insulating spacer and a backside contact via structure in each backside trench according to the first embodiment of the present disclosure.
Figure 14B:
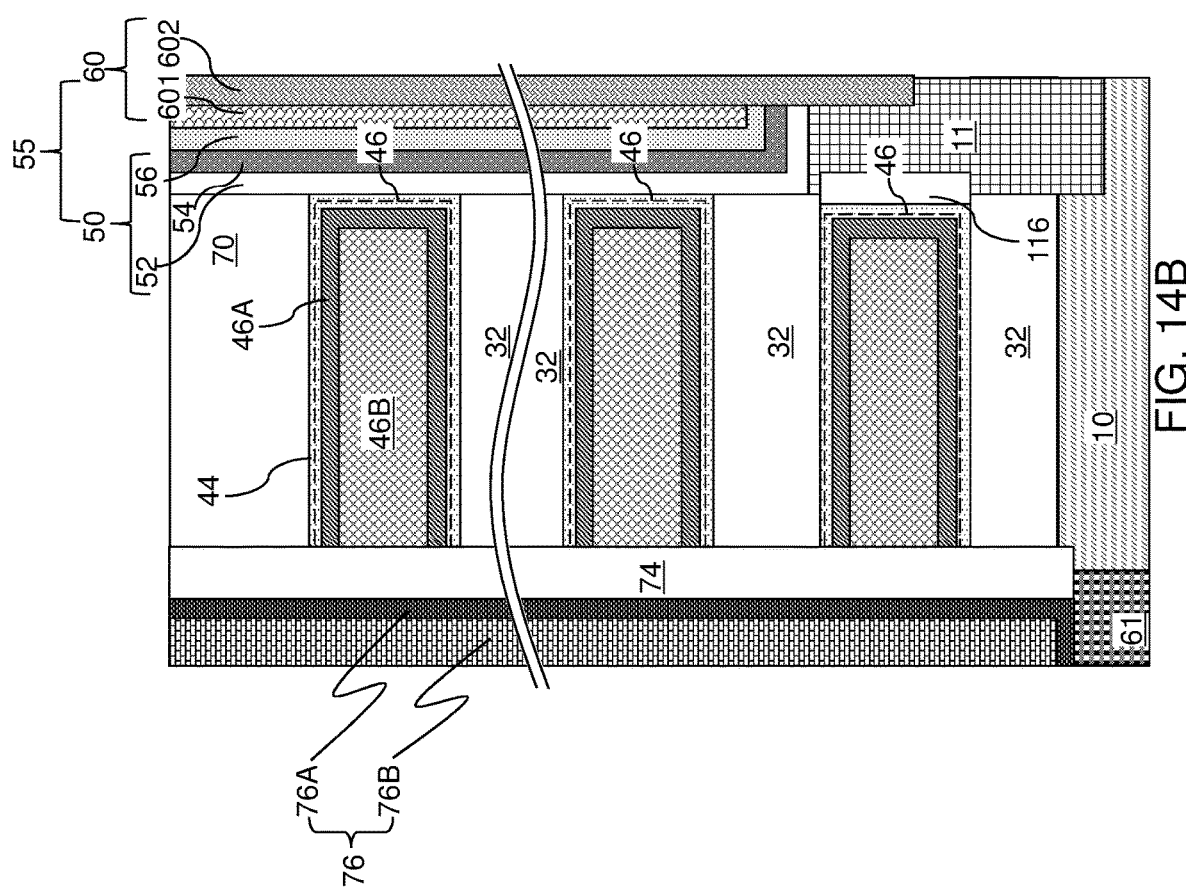
FIG. 14B is a magnified view of a region of the first exemplary structure of FIG. 14A.

Referring to FIGS. 14A and 14B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 2 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating trench spacer 74. A backside cavity is present within a volume surrounded by each insulating trench spacer 74. A top surface of the semiconductor material layer 10 can be physically exposed at the bottom of each backside trench 79. An insulating trench spacer 74 may have a tubular configuration, and may contact lengthwise sidewalls of a pair of perforated etch stop plates 146 located on either side of a respective backside trench 79. Further, the insulating trench spacer 74 may contact lengthwise sidewalls of a pair of stepped insulating plates 134 and a pair of retro-stepped dielectric material portions 65.

A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 15:
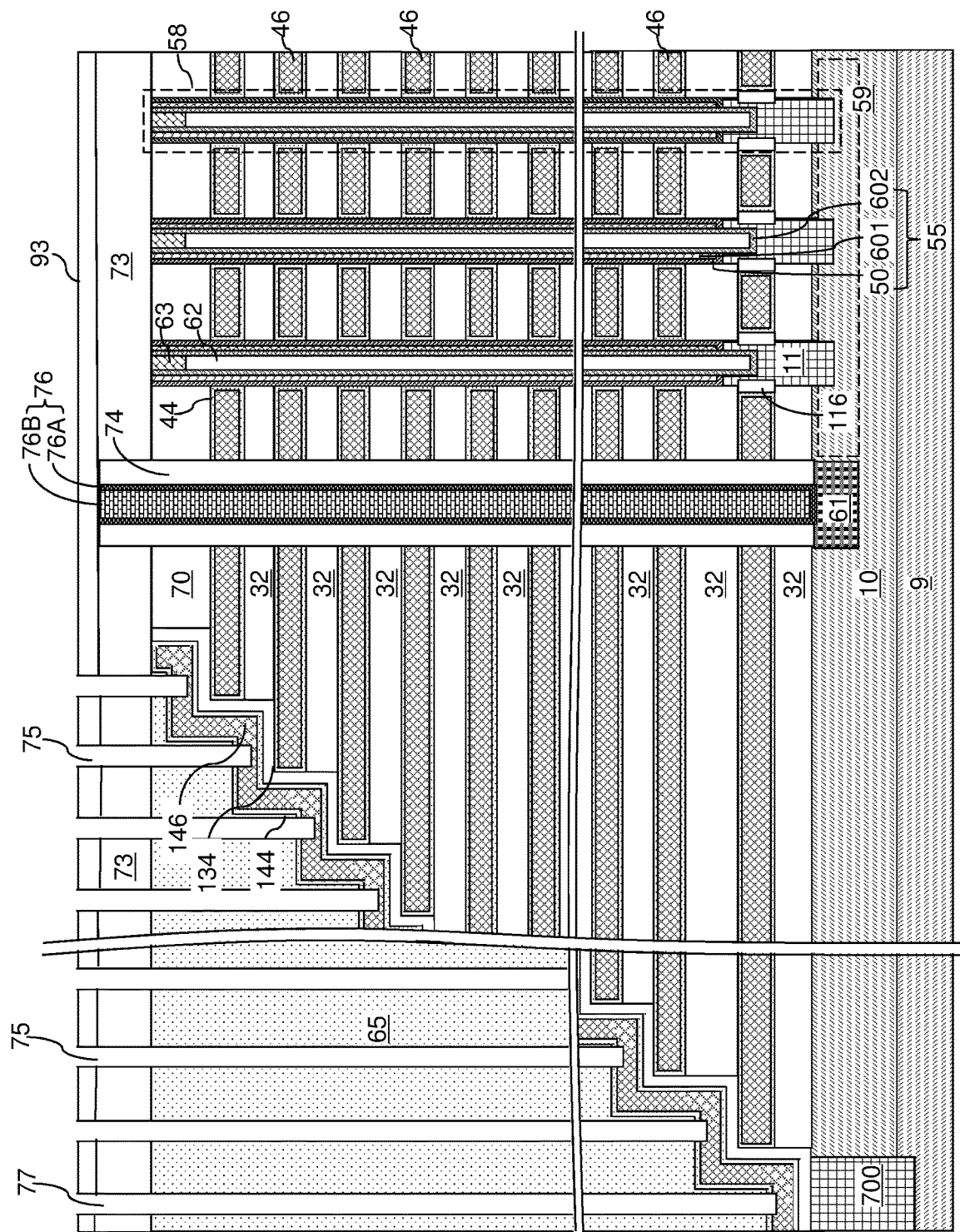
FIG. 15 is a schematic vertical cross-sectional view of the first exemplary structure after formation of word-line contact via openings and peripheral contact via openings according to the first embodiment of the present disclosure.
Figure 16A:
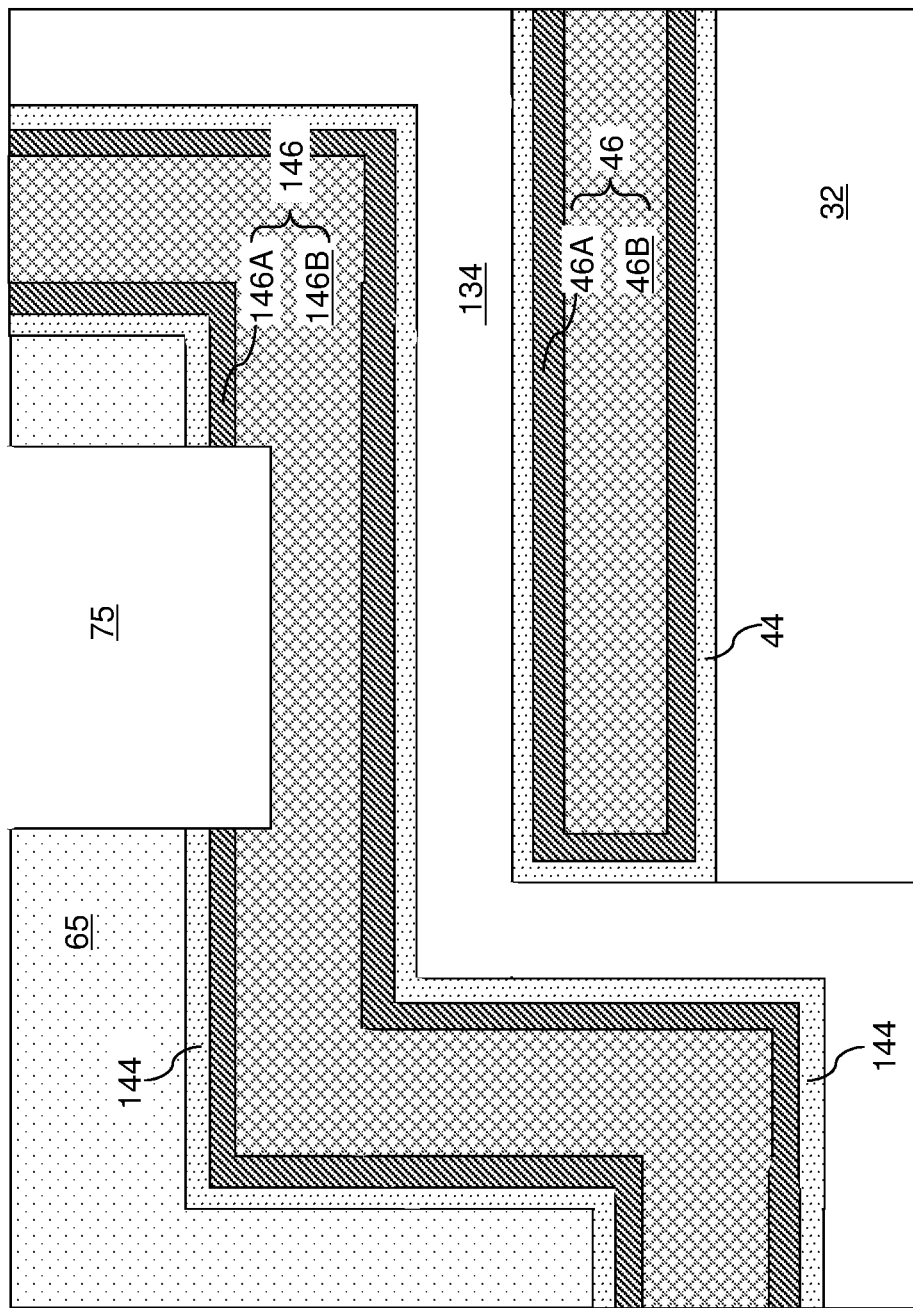
FIGS. 16A-16C are sequential vertical cross-sectional views of a region of the first exemplary structure during formation of an insulating spacer according to the first embodiment of the present disclosure.

Referring to FIGS. 15 and 16A, an upper level dielectric layer 93 is formed over the contact-level dielectric layer 73 and the backside contact via structure 76. The upper level dielectric layer 93 may comprise the same or different dielectric material as the contact-level dielectric layer 73. For example, the upper level dielectric layer 93 may comprise silicon oxide.

A patterned mask layer including discrete openings can be formed over the upper level dielectric layer 93. For example, a photoresist layer can be applied over the upper level dielectric layer 93, and can be lithographically patterned to form a pattern of discrete openings therein. A first anisotropic etch process can be performed to etch through the upper level dielectric layer 93, the contact-level dielectric layer 73 and the retro-stepped dielectric material portion 65. The first anisotropic etch process etches the materials of the upper level dielectric layer 93, the contact-level dielectric layer 73, the retro-stepped dielectric material portion 65, and the material of the encasing dielectric liner 144 (if present) selective to the material of the perforated etch stop plate 146. Contact via openings (75, 77) are formed through the retro-stepped dielectric material portion 65. The contact via openings (75, 77) vertically extend through the contact-level dielectric layer 73, the retro-stepped dielectric material portion 65, and the encasing dielectric liner 144 (if present), and into the perforated etch stop plate 146. The contact via openings (75, 77) may include word-line contact via openings 75 that overlie portions of the electrically conductive layers 46 that are not covered by any overlying electrically conductive layer 46, and optional peripheral contact via openings 77 overlying a respective optional peripheral semiconductor device 700 in the peripheral region 200.

According to an aspect of the present disclosure, the perforated etch stop plate 146 functions as an etch stop layer during the first anisotropic etch process. Thus, the chemistry of the anisotropic etch process can be selected such that the first anisotropic etch process etches the materials of the upper level dielectric layer 93, the contact-level dielectric layer 73 and the retro-stepped dielectric material portion 65 selective to the material of the perforated etch stop plate 146, which comprises the same one or more metallic materials as the electrically conductive layers 46. Portions of the perforated etch stop plate 146 that are physically exposed to the contact via openings (75, 77) are vertically recessed. The distance of the vertical recess into the perforated etch stop plate 146 may be generally proportional to the duration of time to which each portion of the perforated etch stop plate 146 is physically exposed to the etchant gas of the first anisotropic etch process. Thus, physically exposed portions of the perforated etch stop plate 146 that are more distal from the substrate (9, 10) may be recessed deeper than physically exposed portions of the perforated etch stop plate 146 that are proximal to the substrate (9, 10).

Figure 16B:
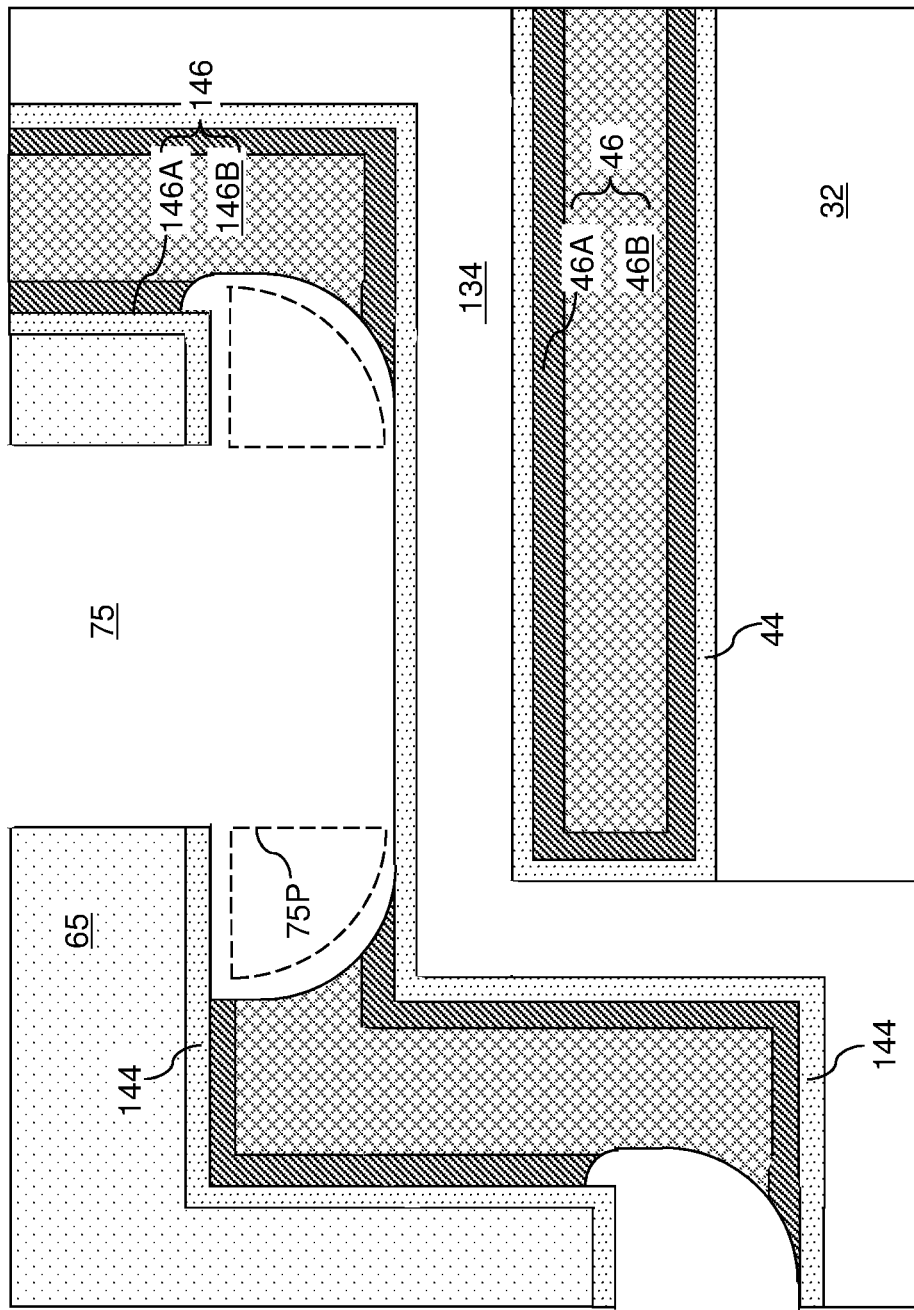

Referring to FIG. 16B, a selective isotropic etch process is performed to isotropically recess portions of the perforated etch stop plate 146 around the bottom regions of the contact via openings (75, 77). The selective isotropic etch process etches the material(s) of the perforated etch stop plate 146 selective to the materials of the retro-stepped dielectric material portions 65, the optional encasing dielectric liner 144 (if present), the insulating trench spacers 74, and optionally the stepped insulating plate 134 (in case the encasing dielectric liner 144 is not present or in case the encasing dielectric liner 144 is etched through during the isotropic etch process). For example, a wet etch process employing hot trimethyl-2 hydroxyethyl ammonium hydroxide ("hot TMY"), and/or a mixture of hydrofluoric acid and nitric acid, and optionally hydrochloric acid and/or a mixture of potassium hydroxide and potassium hexacyanoferrate ($K_3Fe(CN)_6$) (i.e., potassium ferricyanide) may be employed to etch portions of a tungsten perforated etch stop plate 146 that are proximal to the bottom portions of the contact via openings (75, 77). The electrically conductive layers 46 are protected from the chemical of the wet etch process by the stepped insulating plate 134 and the insulating trench spacers 74.

Each of the contact via openings (75, 77) is expanded in volume at a bottom portion. Specifically, a laterally-bulging recess cavity 75P can be formed at the bottom of each word-line contact via opening 75. In one embodiment, the duration of the selective isotropic etch process is selected such that a top surface of an underlying insulating material is physically exposed at the bottom of each of the contact via openings (75, 77). For example, the duration of the selective isotropic etch process may be selected such that the etch distance of the selective isotropic etch process into the materials of the perforated etch stop plate 146 is greater than the thickness of the horizontally-extending portions of the perforated etch stop plate 146. A surface of the encasing dielectric liner 144 or a surface of the stepped insulating plate 134 can be physically exposed at the bottom of each of the contact via openings (75, 77). Each of the laterally-bulging recess cavity 75P may comprise a convex tapered surface segment that adjoins the top surface of the underlying dielectric surface (such as a surface of the encasing dielectric liner 144 or the surface of the stepped insulating plate 134), and may optionally comprise a vertical cylindrical surface segment that is adjoined to a top periphery of the convex tapered surface segment. The patterned mask layer, such as the patterned photoresist layer, may be subsequently removed, for example, by ashing.

Figure 16C:
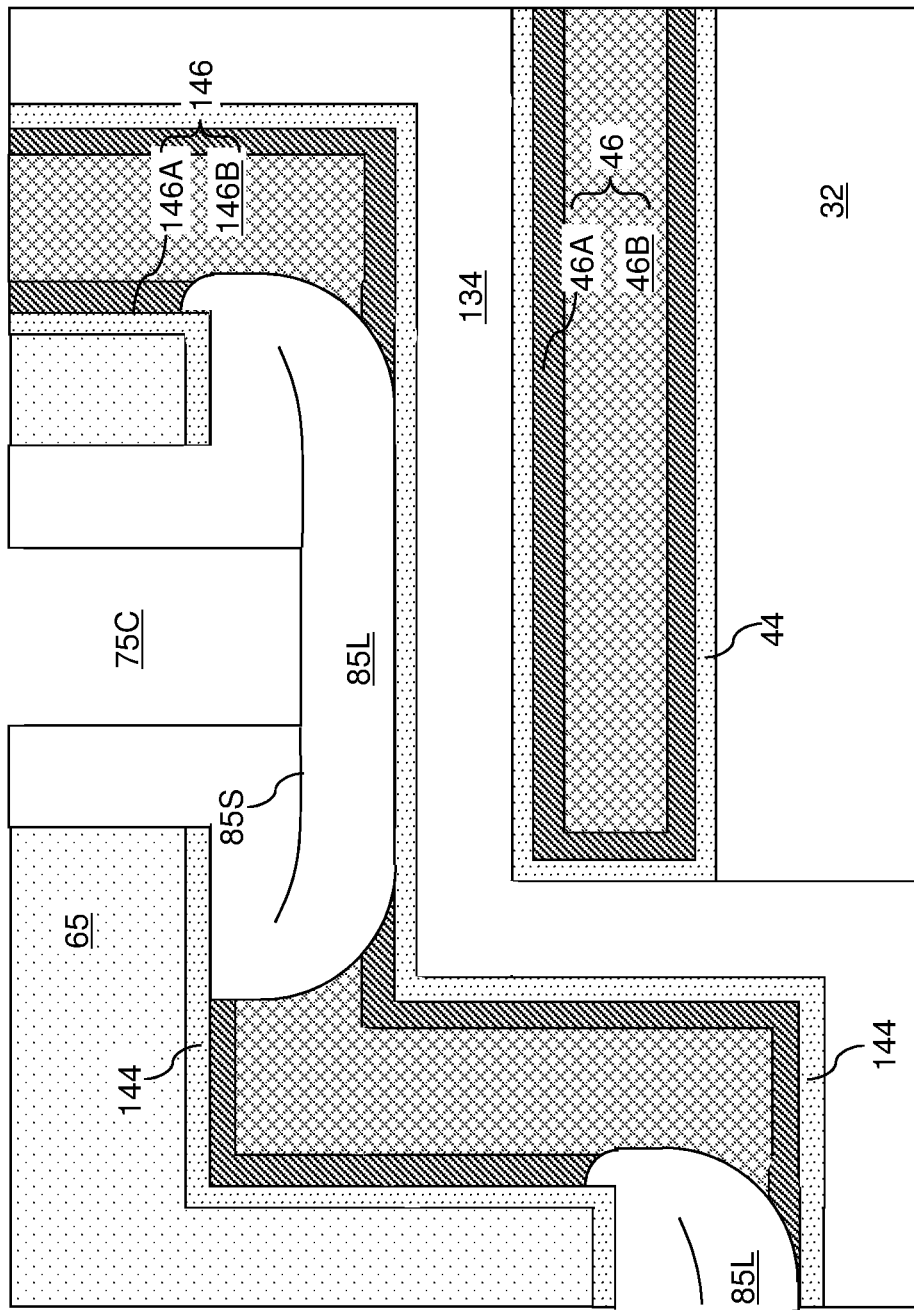

Referring to FIG. 16C, an insulating spacer material layer 85L can be deposited at peripheral regions of the contact via openings (75, 77) and over the upper level dielectric layer 93 and the contact-level dielectric layer 73 by a conformal deposition process. The insulating spacer material layer 85L includes an insulating material, such as silicon oxide. The thickness of the insulating spacer material layer 85L may be greater than one half of the thickness of horizontally-extending portions of the perforated etch stop plate 146 as formed at the processing steps of FIGS. 11D and 12A-12C. The volumes of the laterally-bulging recess cavities 75P can be filled with the insulating spacer material layer 85L. A horizontally-extending annular seam 85S may be present within each portion of the insulating spacer material layer 85L located within the laterally-bulging recess cavities 75P. A vertically-extending via cavity (i.e., an unfilled void) 75C may be present within each contact via opening.

Figure 17A:
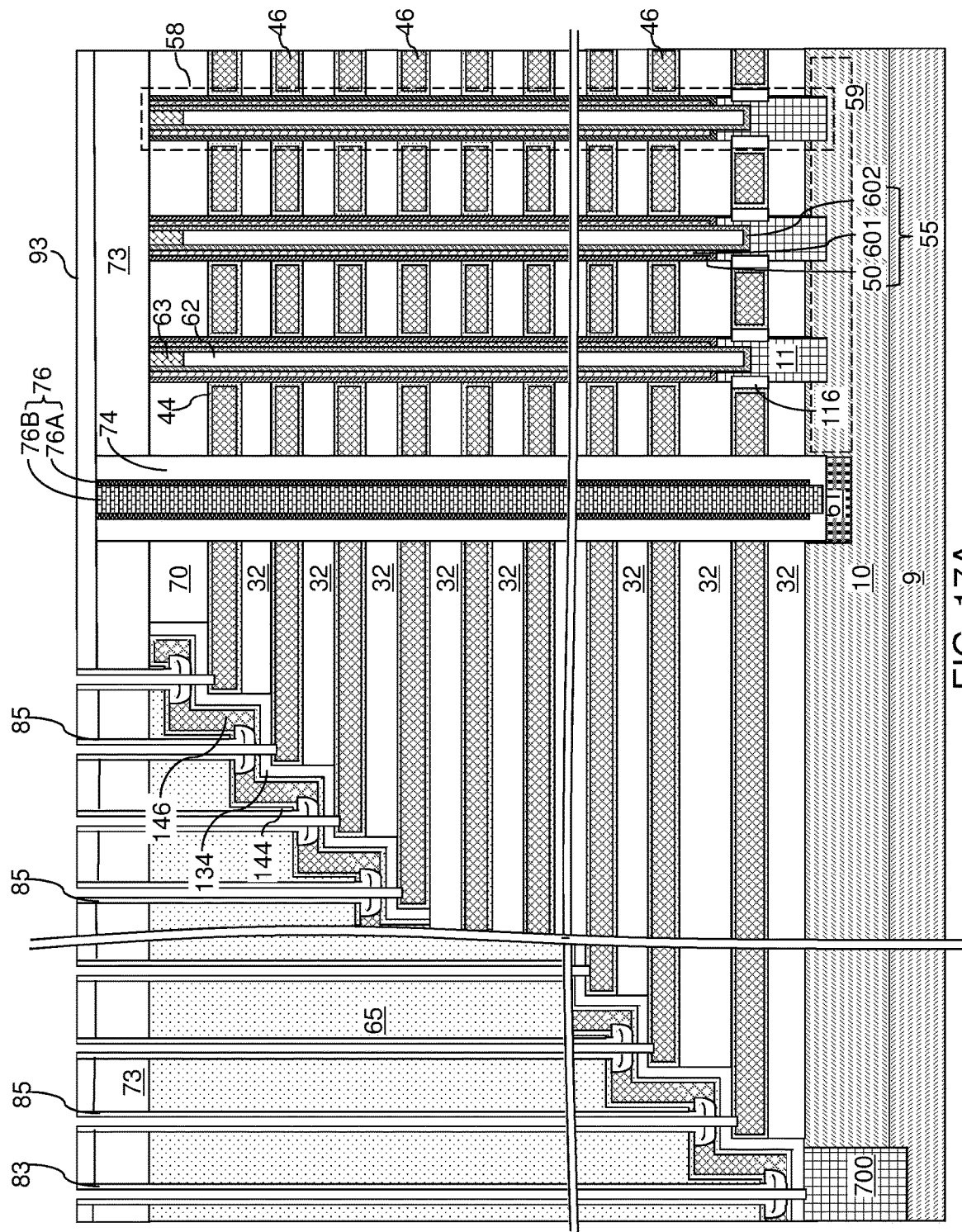
FIG. 17A is a schematic vertical cross-sectional view of the first exemplary structure after vertical extension of via cavities within the contact via openings according to the first embodiment of the present disclosure.
Figure 17B:
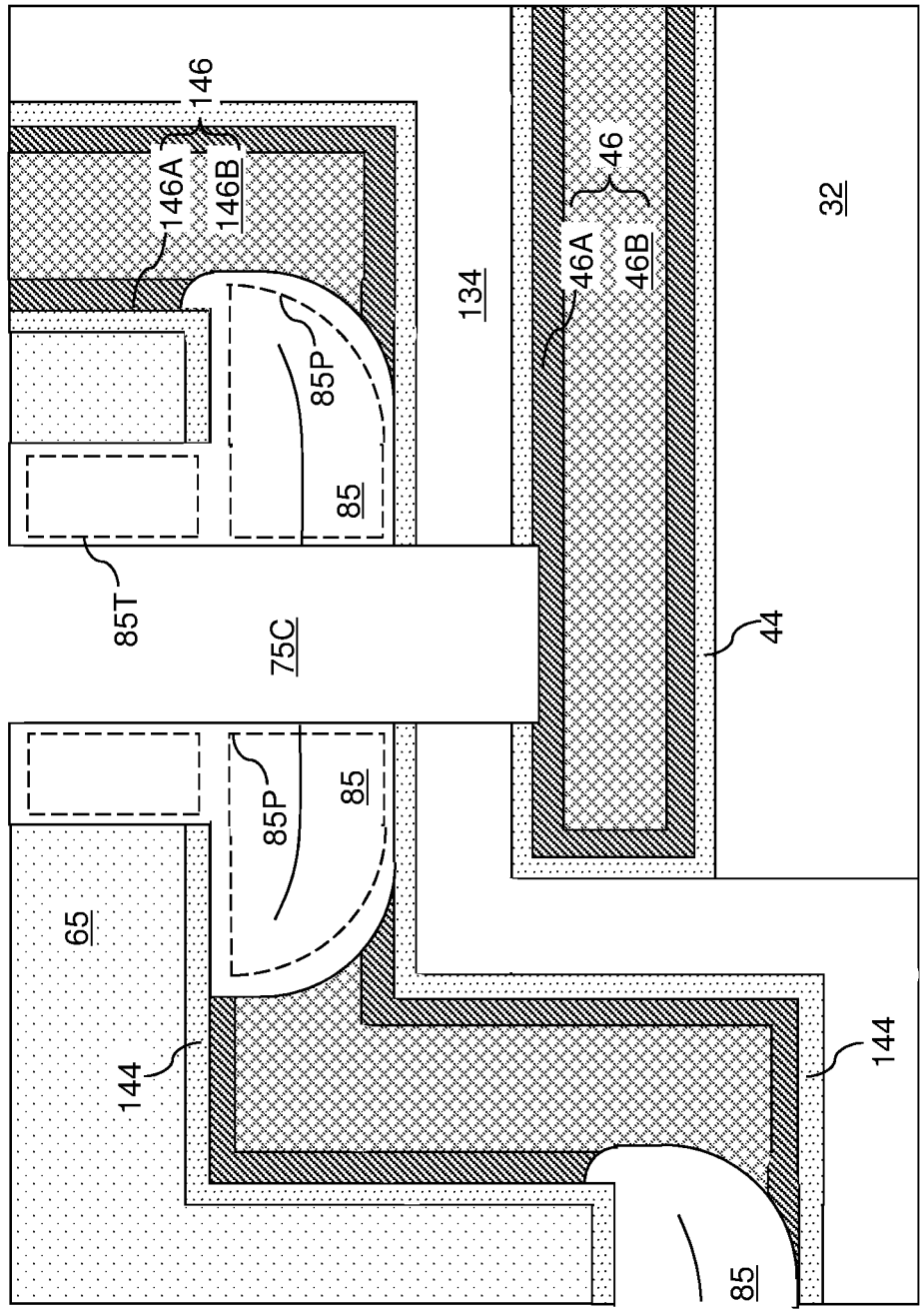
FIG. 17B is a magnified view of a region of the first exemplary structure of FIG. 17A.

Referring to FIGS. 17A and 17B, a second anisotropic etch process (e.g., a sidewall spacer etch process) can be performed to remove bottom portions of the insulating spacer material layer 85L located underneath the vertically-extending cavities within the contact via openings (75, 77). The second anisotropic etch process can be performed without forming any etch mask layer above the upper level dielectric layer 93 and the contact-level dielectric layer 73. In other words, application or patterning of a photoresist layer above the upper level dielectric layer 93 and the contact-level dielectric layer 73 prior to the second anisotropic etch process is not necessary.

Horizontally-extending portions of the insulating spacer material layer 85L can be removed from above the upper level dielectric layer 93 and at the bottom of each contact via opening (75, 77). Remaining vertically-extending portions of the insulating spacer material layer 85L comprise tubular insulating material portions, which are herein referred to as insulating spacers (85, 83) or tubular insulating spacers. The insulating spacers (85, 83) comprise word-line-contact insulating spacers 85 located within a respective one of the word-line contact via openings 75, and optional peripheral-contact insulating spacers 83 located within a respective one of the optional peripheral contact via openings 77. Each word-line-contact insulating spacer 85 is an insulating spacer that provides lateral electrical isolation to a contact via structure that contacts a respective word line or a select gate electrode.

Generally, insulating spacers (85, 83) can be formed at peripheral regions of the contact via openings (75, 77) over a respective top surface segment of the stepped insulating plate 134. The insulating spacers (85, 83) comprise word-line-contact insulating spacers 85 and optional peripheral-contact insulating spacers 83. The perforated etch stop plate 146 can be interposed between the alternating stack (32, 46) of the insulating layers 32 and the electrically conductive layers 46 and a stepped bottom surface of the retro-stepped dielectric material portion 65. The second anisotropic etch process can be continued to vertically extend the via cavities within the contact via openings (75, 77) through underlying portions of the encasing dielectric liner 144 (if present), the stepped insulating plate 134, and the backside blocking dielectric layer 44 (if present). Top surfaces of the electrically conductive layers 46 can be exposed underneath the vertically-extended via cavities. Generally, the second anisotropic etch process etches the material of the stepped insulating plate 134 without employing a photoresist layer over the retro-stepped dielectric material portion 65, and forms perforation openings through the stepped insulating plate 134. Each via cavity 75C can be vertically extended through respective material stacks having a same set of material compositions and a same thickness. Thus, the overetch into the physically exposed portions of the electrically conductive layers 46 underneath the via cavities can be about the same irrespective of the location of the via cavities, and thus, can be controlled to avoid any punch-through.

Each insulating spacer (85, 83) comprises a tubular insulating portion 85T including a vertically-extending outer sidewall segment in contact with the retro-stepped dielectric material portion 65, and a laterally-bulging insulating portion 85P adjoined to a bottom of the tubular insulating portion and laterally protrudes outward from a vertical plane including the vertically-extending outer sidewall segment. In one embodiment, the laterally-bulging insulating portion 85P comprises a convex tapered surface segment that contacts a concave tapered surface segment of the perforated etch stop plate 146 for at least one, a plurality, or each of the insulating spacers (85, 83). In one embodiment, the laterally-bulging insulating portion 85P comprises a planar top surface having an inner periphery adjoined to a bottom periphery of the vertically-extending outer sidewall segment of the tubular insulating portion 85T.

In one embodiment, the perforated etch stop plate 146 comprises a perforated metal plate comprising a same set of at least one metallic material as the electrically conductive layers 46. In one embodiment, each of the electrically conductive layers 46 is spaced from the memory stack structures 55 and the insulating layers 32 by a backside blocking dielectric layer 44, and the perforated etch stop plate 146 is encased within an encasing dielectric liner 144 having a same material composition and a same thickness as the backside blocking dielectric layer 44. In one embodiment, each word-line-contact insulating spacer 85 comprises a laterally-bulging insulating portion 85P that has a planar annular top surface that contacts a surface segment of the encasing dielectric liner 144, and a planar annular bottom surface that contacts another surface segment of the encasing dielectric liner 144.

In one embodiment, a perforated insulating plate 134 may be interposed between the alternating stack (32, 46) and the perforated etch stop plate 146. In one embodiment, the perforated insulating plate 134 comprises horizontally-extending portions including perforation openings therethrough, and vertically extending portions that contact sidewalls of the insulating layers 32 and connecting neighboring pairs of the horizontally-extending portions. The vertically extending portions are vertically offset from each other. In one embodiment, each of the insulating spacers (85, 83) comprises a respective annular bottom surface that contacts a respective top surface segment of the encasing dielectric liner 144.

In one embodiment, a pair of backside trench fill structures (74, 76) can be located within a neighboring pair of backside trenches 79, and can contact lengthwise sidewalls of the alternating stack of the insulating layers 32 and the electrically conductive layers 46, the lengthwise sidewalls of the stepped insulating plate 134, the lengthwise sidewalls of the perforated etch stop plate 146, and the lengthwise sidewalls of the dielectric material portion 65. The pair of backside trench fill structures (74, 76) can laterally extend along a first horizontal direction hd1 and can be laterally spaced apart along a second horizontal direction hd2. In one embodiment, each of the backside trench fill structures (74, 76) can comprise an insulating trench spacer 74 and an optional backside contact via structure 76. The pair of backside trench fill structures (74, 76) can contact each of the insulating layers 32 and the electrically conductive layers 46 at a respective lengthwise sidewall that laterally extends along the first horizontal direction hd1, and the perforated etch stop plate 146 contacts the lengthwise sidewalls of the pair of backside trench fill structures (74, 76).

Figure 18:
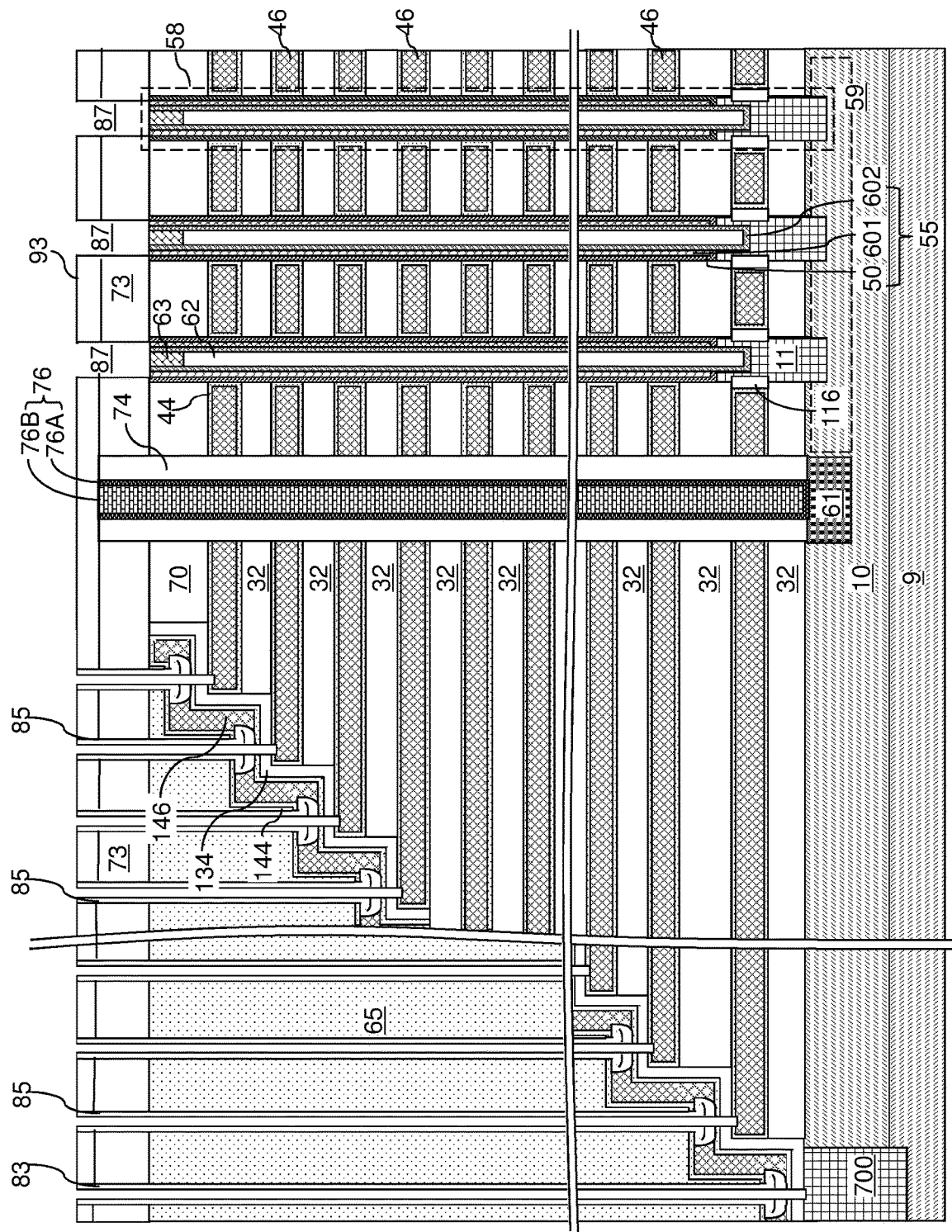
FIG. 18 is a schematic vertical cross-sectional view of the first exemplary structure after formation of drain contact via openings according to the first embodiment of the present disclosure.

Referring to FIG. 18, a photoresist layer (not shown) may be applied over the upper level dielectric layer 93, and can be lithographically patterned to form openings in the memory array region 100 over a respective one of the memory opening fill structures 58. An anisotropic etch process can be performed to transfer the pattern of the openings in the photoresist layer through the upper level dielectric layer 93 and the contact-level dielectric layer 73. Drain contact via openings 87 can be formed over the drain regions 63 of the memory opening fill structures 58. The photoresist layer can be subsequently removed, for example, by ashing.

Figure 19A:
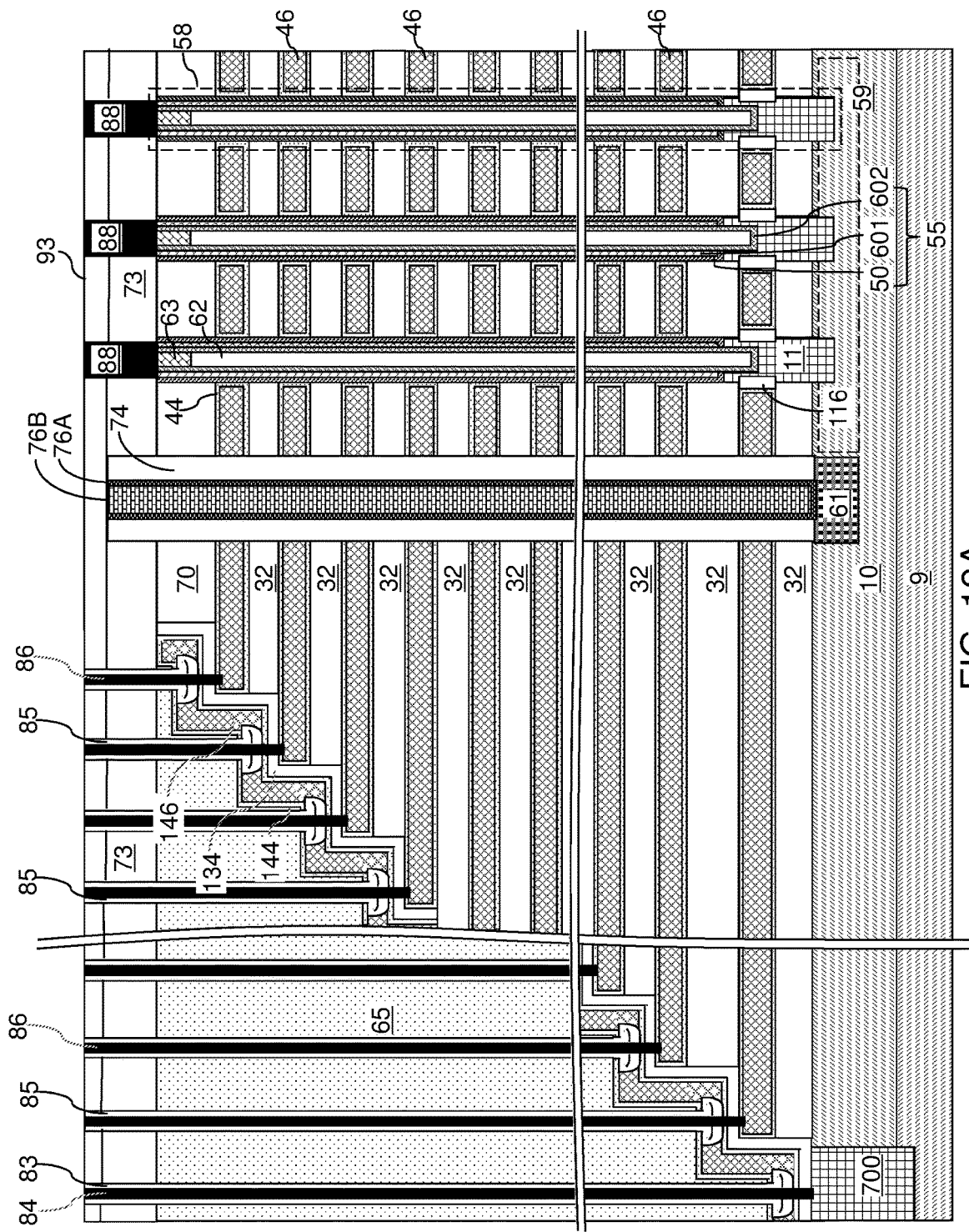
FIG. 19A is a schematic vertical cross-sectional view of the first exemplary structure after formation of contact via structures according to the first embodiment of the present disclosure.
Figure 19B:
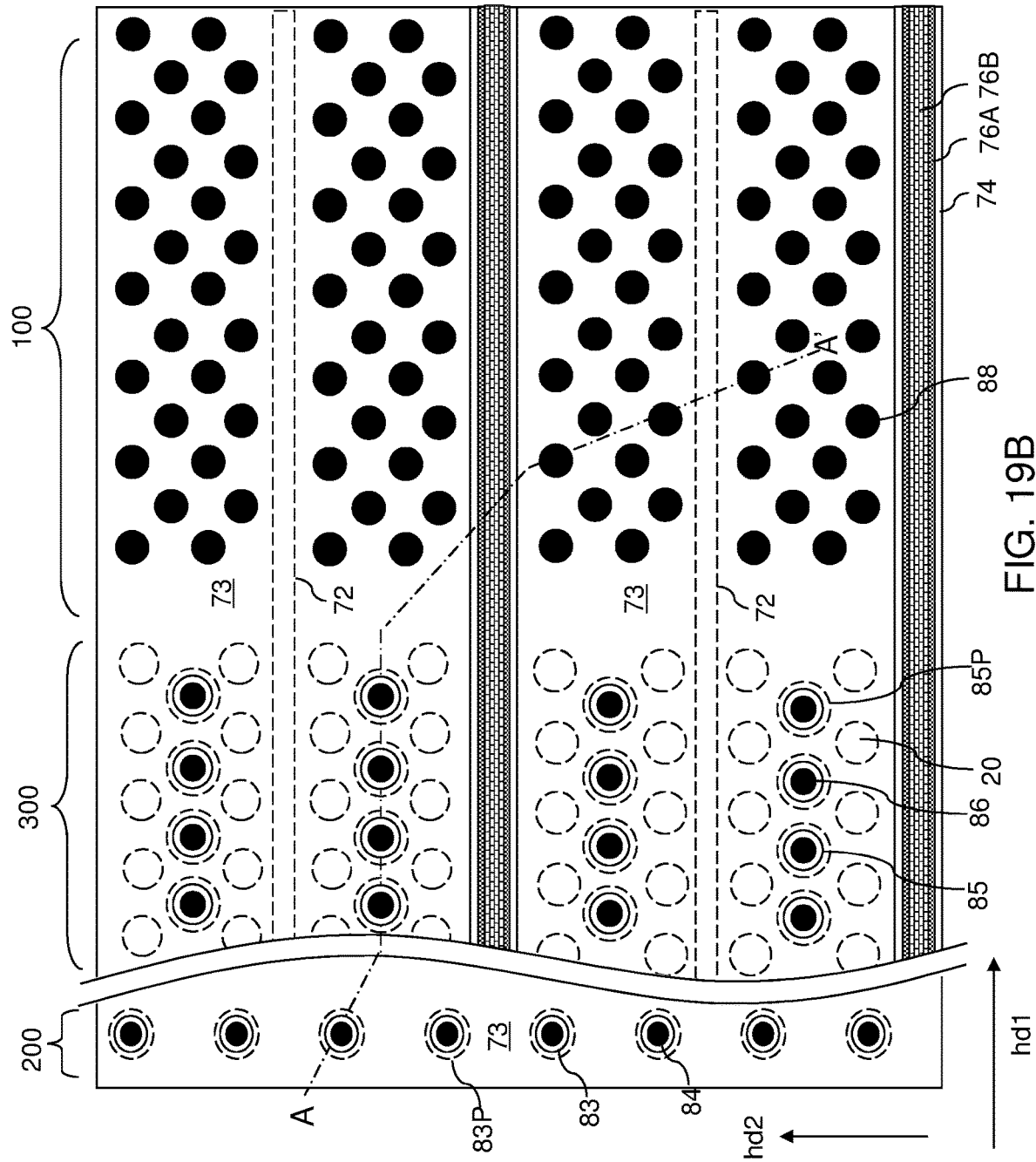
FIG. 19B is a top-down view of the first exemplary structure of FIG. 19A. The vertical plane A-A' is the plane of the schematic vertical cross-sectional view of FIG. 19A.
Figure 19C:
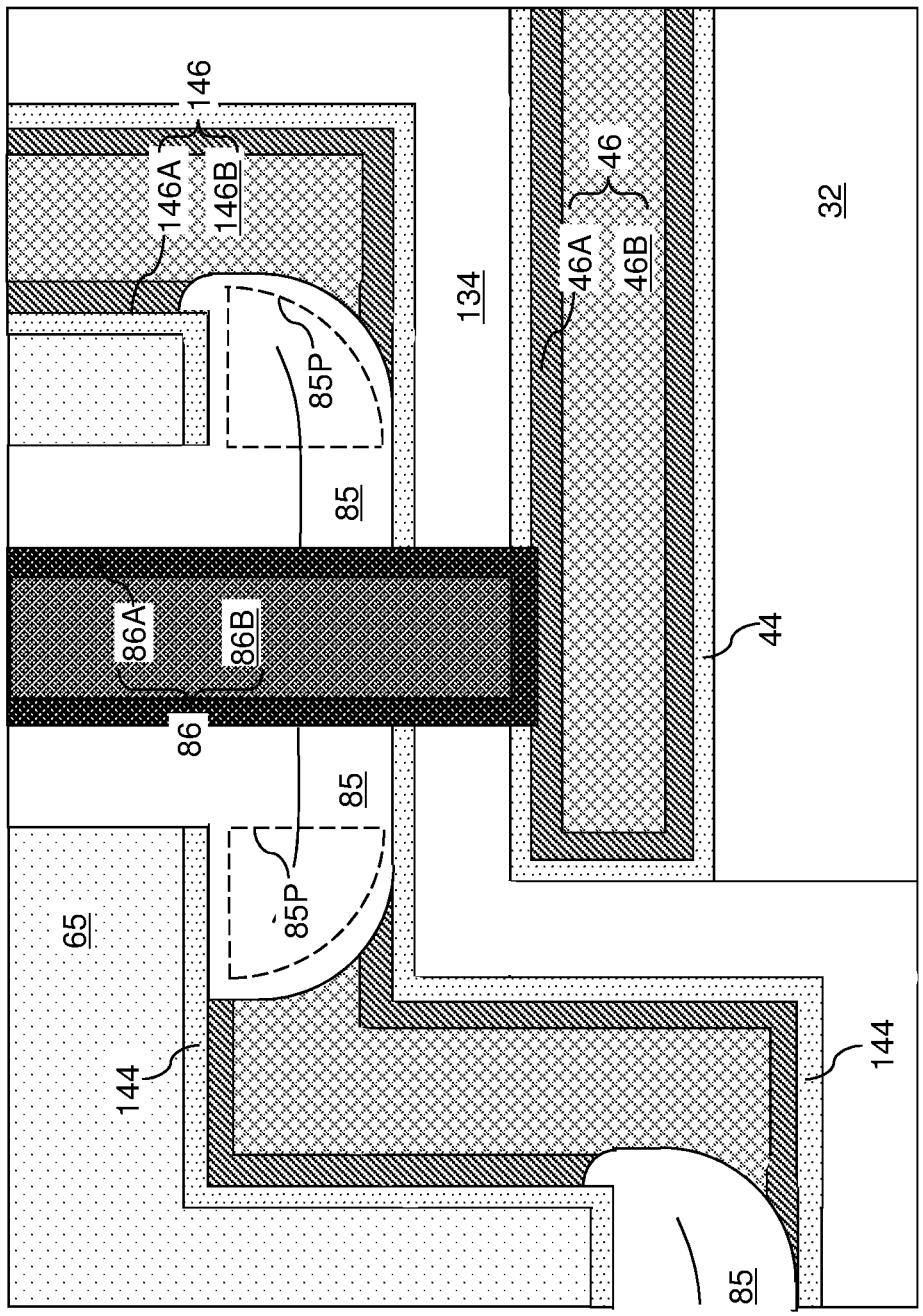
FIG. 19C is a magnified view of a region of the first exemplary structure of FIG. 19A.

Referring to FIGS. 19A-19C, at least one conductive material, such as at least one metallic material, can be deposited in the various via cavities within the contact via openings (75, 77, 87). For example, an optional metallic barrier liner 86A and a metallic fill material portion 86B can be deposited in each of the via cavities. Excess portions of the at least one conductive material can be removed from above the horizontal plane including the top surface of the upper level dielectric layer 93 by a planarization process, which may comprise a chemical mechanical polishing (CMP) process or a recess etch process. Remaining portions of the at least one conductive material comprise various contact via structures (86, 88, 84). The contact via structures (86, 88, 84) comprise word-line contact via structures 86 in contact with a respective one of the electrically conductive layers 46, drain contact via structures 88 in contact with a respective one of the drain regions 63, and peripheral contact via structures 84 in contact with a respective one of the peripheral semiconductor devices 700 within the peripheral region 200. Each word-line contact via structure 86 is a contact via structure that contacts a respective word line, which is one of the electrically conductive layers 46.

In one embodiment, each of the word-line contact via structures 86 and the optional peripheral contact via structures 84 may be formed directly on sidewalls of perforation openings in the stepped insulating plate 134. In one embodiment, each of the word-line contact via structures 86 and the peripheral contact via structures 84 extends through, and contacts a sidewall of, a respective perforation opening in the perforated insulating plate 134.

Each contiguous combination of an insulating spacer (85, 83) and a contact via structure (86, 84) constitutes a laterally-insulated contact structure {(85, 86), (83, 84)}. The laterally-insulated contact structures {(85, 86), (83, 84)} comprise laterally-insulated word-line contact structures (85, 86) vertically extending through the retro-stepped dielectric material portion 65 and through a respective one of perforation openings in the perforated etch stop plate 146, and including a word-line contact via structure 86 contacting a top surface of a respective one of the electrically conductive layers 46 and a word-line word-line-contact insulating spacer 85 laterally surrounding the word-line contact via structure 86 and contacting the perforated etch stop plate 146. Bit lines (not shown) are subsequently formed in electrical contact with respective drain contact via structures 88.

Figure 19D:
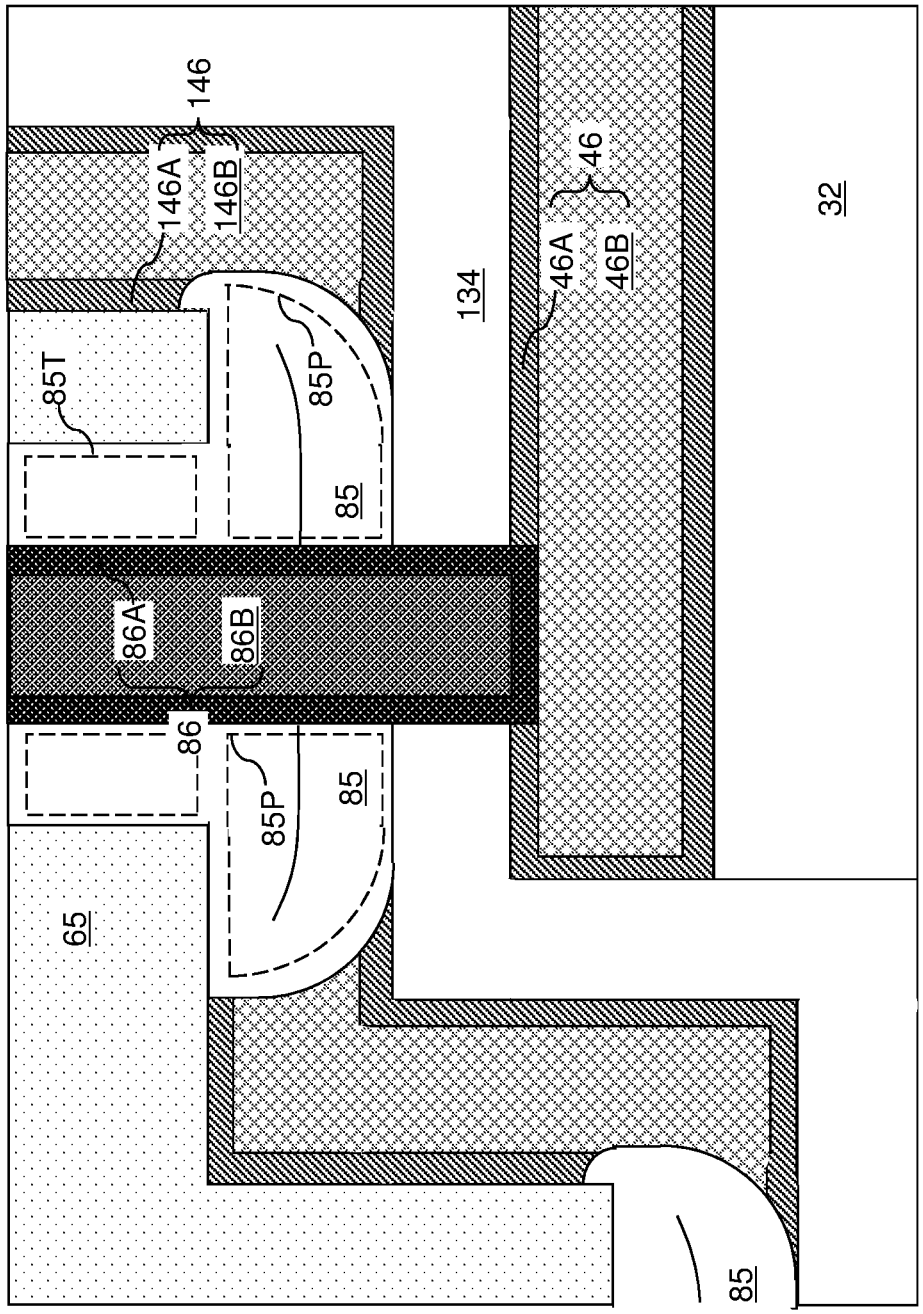
FIG. 19D is a magnified view of a region of an alternative configuration of the first exemplary structure at the processing steps of FIGS. 19A-10C according to the first embodiment of the present disclosure.

Referring to FIG. 19D, an alternative configuration of the first exemplary structure can be derived from the first exemplary structure by omitting formation of the backside blocking dielectric layers 44 and the encasing dielectric liners 144 at the processing steps of FIGS. 11D and 12A-12C. In one embodiment, each of the insulating spacers (85, 83) comprises a respective annular bottom surface that contacts a respective top surface segment of the perforated insulating plate 134.

Generally, each memory opening fill structure 58 in the first exemplary structure or alternative configurations thereof comprises a respective memory film 50, which may comprise a respective blocking dielectric layer 52, a respective vertical stack of memory elements located at levels of the electrically conductive layers 46 (comprising portions of the charge storage layer 54 located at the levels of the electrically conductive layers 46), and a respective tunneling dielectric layer 56 that contacts a respective vertical semiconductor channel 60. The electrically conductive layers 46 comprise word lines for controlling memory states of the vertical stacks of memory elements, and the contact via structures comprise word-line contact via structures 86 of the three-dimensional memory device.

Figure 20:
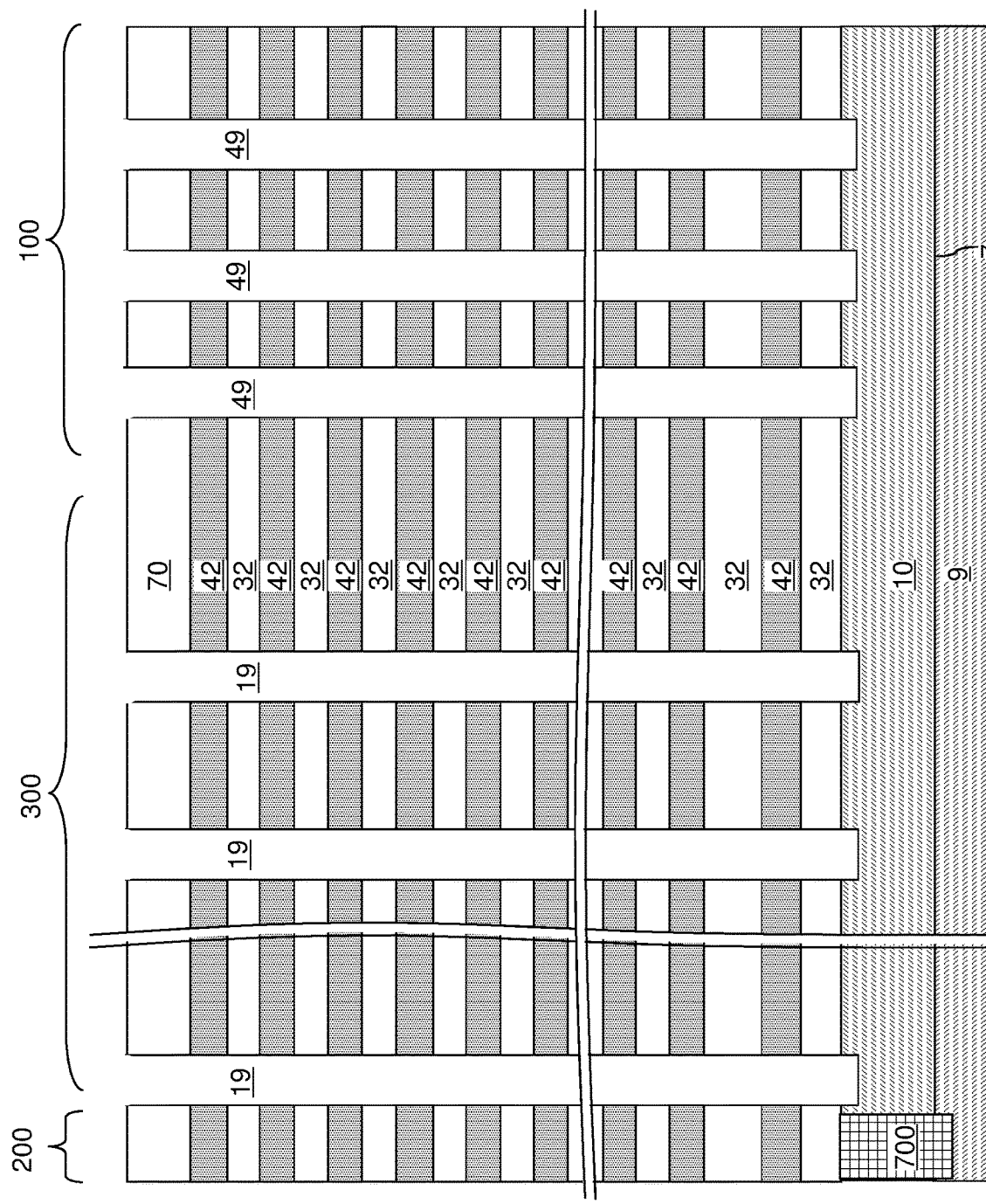
FIG. 20 is a schematic vertical cross-sectional view of a second exemplary structure after formation of support openings and memory openings in an alternating stack according to a second embodiment of the present disclosure.

FIG. 20 is a schematic vertical cross-sectional view of a second exemplary structure according to a second embodiment of the present disclosure. The second exemplary structure can be derived from the first exemplary structure illustrated in FIG. 2 by forming the alternating stack (32, 42) followed by forming the support openings 19 and memory openings 49 in an alternating stack as described above with respect to FIGS. 6A and 6B. Thus, in this embodiment, the support openings 19 and memory openings 49 may be formed in the alternating stack (32, 42) prior to forming the stepped surfaces that are shown in FIG. 3.

Figure 21:
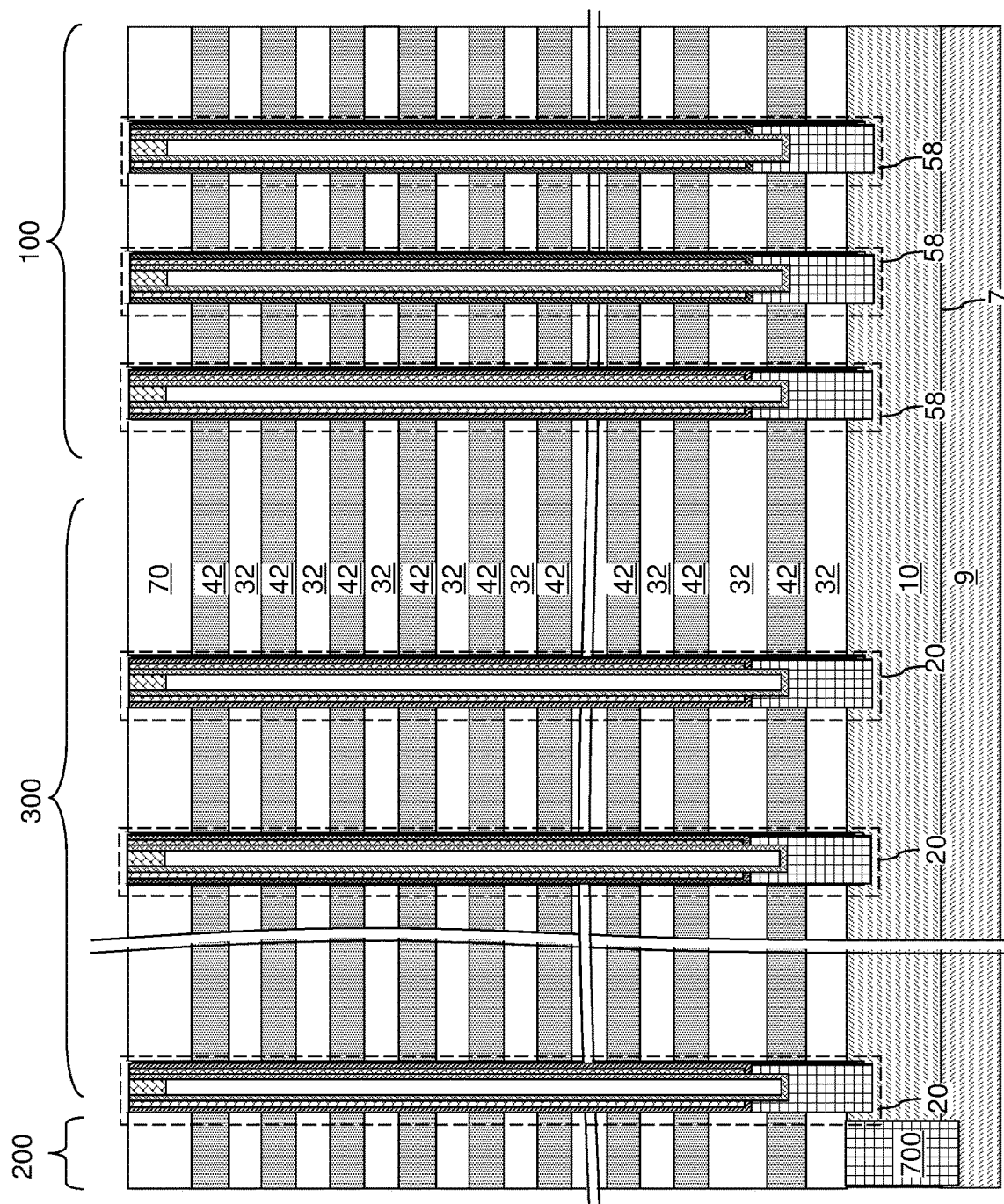
FIG. 21 is a schematic vertical cross-sectional view of the second exemplary structure after formation of memory stack structures and support pillar structures according to the second embodiment of the present disclosure.

Referring to FIG. 21, the memory stack structures 58 and the support pillar structures 20 are formed in the respective memory openings 49 and support openings 19, as described above with respect to FIGS. 7A-7H and FIG. 8.

Figure 22:
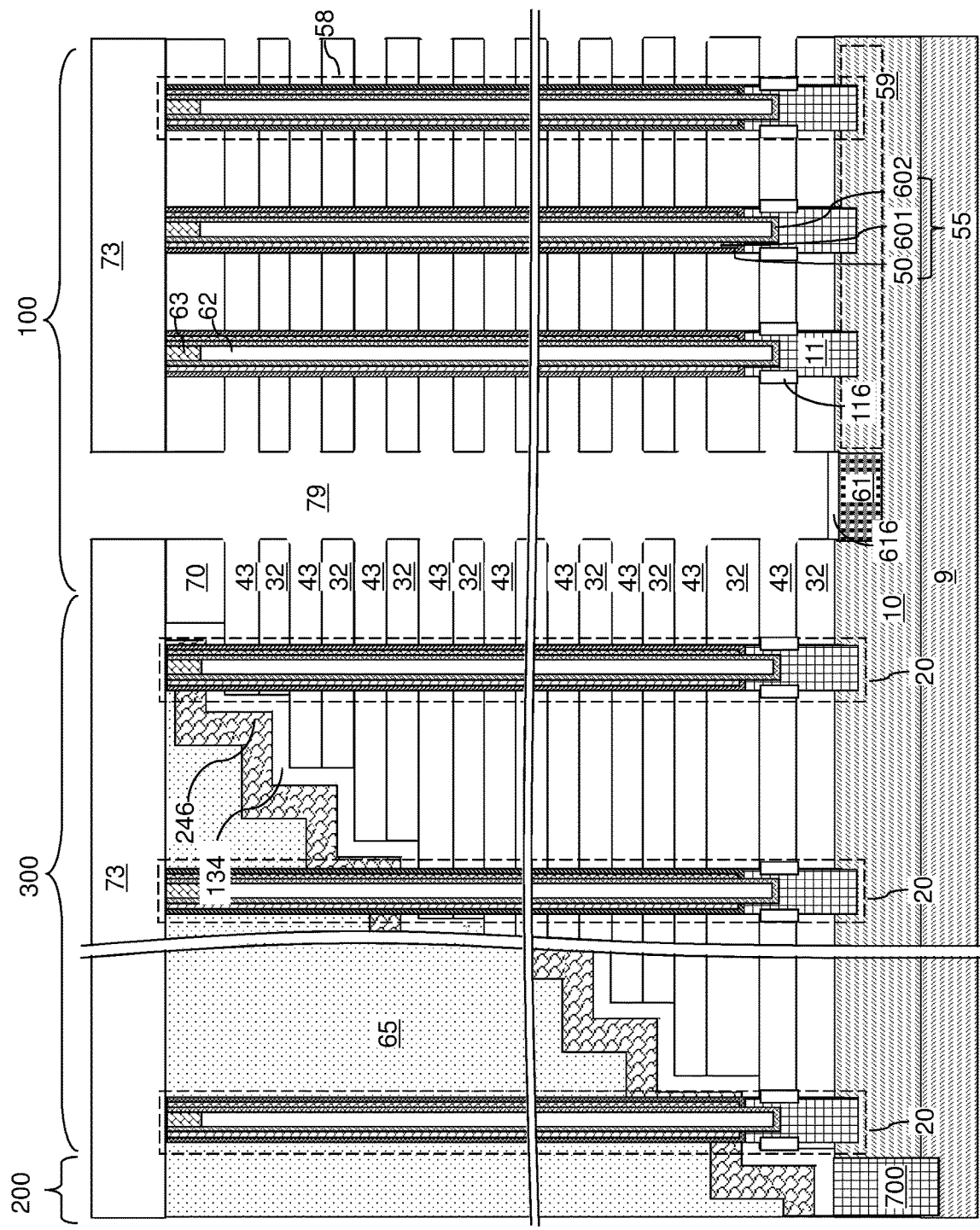
FIG. 22 is a schematic vertical cross-sectional view of the second exemplary structure after formation of backside recesses according to the second embodiment of the present disclosure.

Referring to FIG. 22, the stepped surfaces are formed in the staircase region 300 of the alternating stack (32, 42) as described above with respect to FIG. 3. The above described stepped insulating layer 134L is formed as a continuous material layer directly on the stepped surfaces of the alternating stack (32, 42) and over the insulating cap layer 70. A stepped etch stop material layer is formed over the stepped insulating layer 134L. The stepped insulating layer 134L in the second exemplary structure of the second embodiment may comprise a same material as, and may have the same thickness range as, the stepped insulating layer 134L in the first exemplary structure of the first embodiment.

The stepped etch stop material layer includes an etch stop material that is different from the materials of the stepped insulating layer 134L, the insulating layers 32, and the sacrificial material layers 42. In one embodiment, the stepped etch stop material layer may include a semiconductor material, such as polysilicon or amorphous silicon. Generally, the stepped etch stop material layer 246L includes a material that is resistant to the etch chemistry of an isotropic etch process to be subsequently employed to remove the sacrificial material layers 42 selective to the insulating layers 32. The stepped etch stop material layer can be deposited by a conformal deposition process such as chemical vapor deposition or atomic layer deposition. The thickness of the stepped etch stop material layer 246L can have a thickness in a range from 10 nm to 100 nm, such as from 20 nm to 50 nm, although lesser and greater thicknesses can also be employed.

Subsequently, a dielectric fill material, such as undoped silicate glass or a doped silicate glass can be deposited over the stepped etch stop material layer to form a dielectric fill material layer. The dielectric fill material layer may have the same material composition as the dielectric fill material layer 65L of the first exemplary structure illustrated in FIG. 4. A planarization process can be performed in to remove the portions of the dielectric fill material layer, the stepped etch stop material layer, and the stepped insulating layer 134L that are located above the horizontal plane including the top surface of the insulating cap layer 70. For example, a chemical mechanical polishing (CMP) process may be employed. A remaining portion of the dielectric fill material layer comprises the retro-stepped dielectric material portion 65. A remaining portion of the stepped etch stop material layer comprises a stepped etch stop plate 246. A remaining portion of the stepped insulating layer 134L comprises the stepped insulating plate 134. Topmost surfaces of the stepped insulating plate 134, the stepped etch stop plate 246, and the retro-stepped dielectric material portion 65 can be located within the same horizontal plane as the top surface of the insulating cap layer 70.

Generally, a stepped insulating plate 134 can be formed on the stepped surfaces of the alternating stack (32, 42), and a stepped material plate can be formed over, and directly on, the insulating plate 134. In one embodiment, the stepped material plate may be formed as a stepped etch stop plate 246 comprising a material different from the materials of the insulating layers 32 and the spacer material layers (such as the sacrificial material layers 42) of the alternating stack (32, 42). The retro-stepped dielectric material portion 65 can be formed over and directly on the stepped etch stop plate 246. Optionally, drain select level isolation structures (not shown) can be formed through the insulating cap layer 70 and a subset of the sacrificial material layers 42 located at drain select levels.

The processing steps of FIGS. 9A and 9B, and 10 and 11A can be subsequently performed with any needed changes in view of the change in the material composition of the perforated etch stop plate 246 relative to the material composition of the stepped material plate 135. The various processing steps form the contact-level dielectric layer 73, backside trenches 79, source regions 61, and backside recesses 43.

The backside recesses 43 can be formed by introducing an etchant that selectively etches the second material of the sacrificial material layers 42 with respect to the first material of the insulating layers 32 into the backside trenches 79, for example, employing a wet etch process. Backside recesses 43 are formed in volumes from which the sacrificial material layers 42 are removed. The removal of the second material of the sacrificial material layers 42 can be selective to the first material of the insulating layers 32, the material of the stepped insulating plates 134, the material of the perforated etch stop plate 246, the material of the retro-stepped dielectric material portion 65, the semiconductor material of the source regions 61, and the material of the outermost layer of the memory films 50. Subsequently, physically exposed surface portions of the optional pedestal channel portions 11 and the semiconductor material layer 10 can be converted into dielectric material portions by thermal conversion and/or plasma conversion of the semiconductor materials into dielectric materials.

Figure 23A:
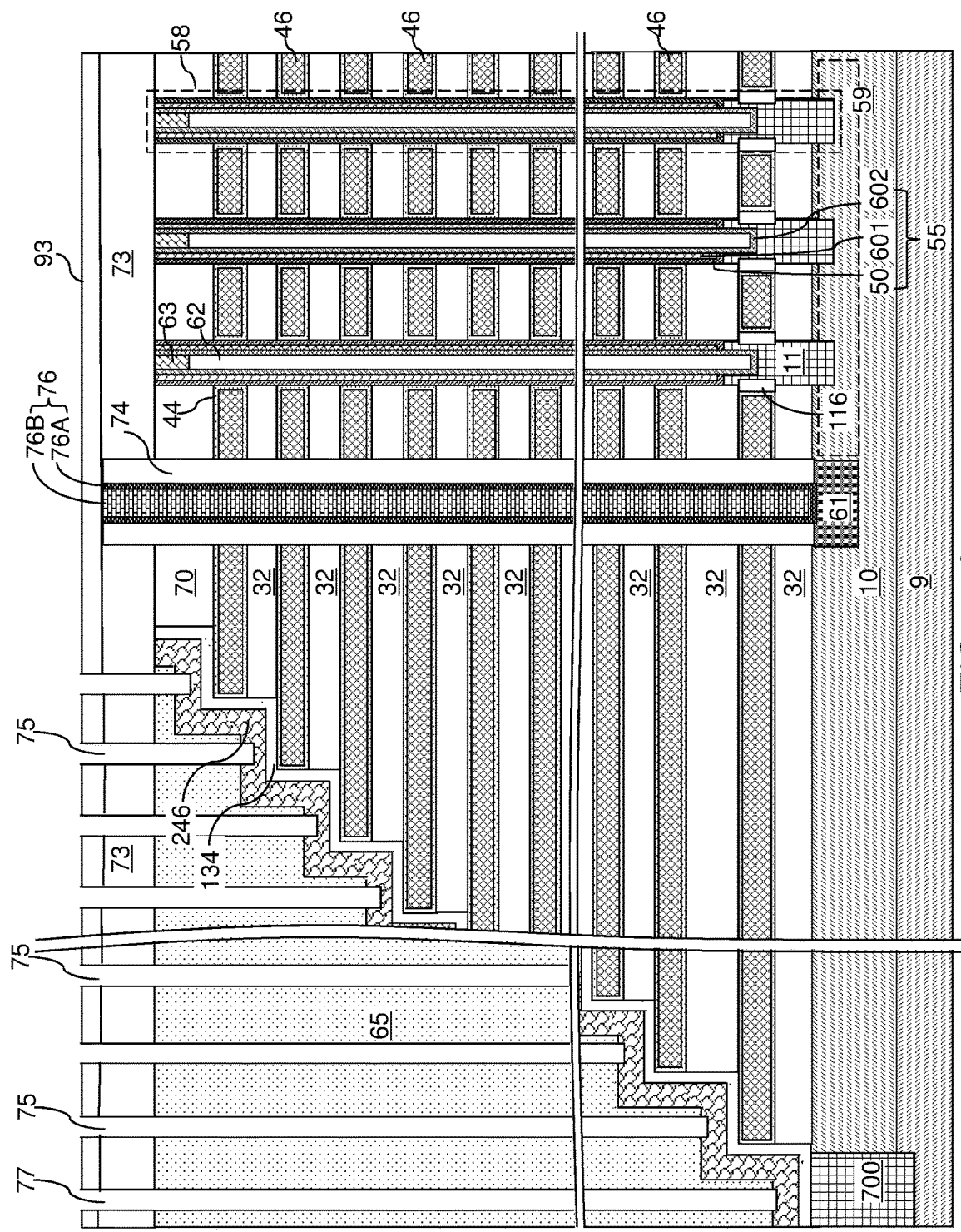
FIG. 23A is a schematic vertical cross-sectional view of the second exemplary structure after formation of word-line contact via openings and peripheral contact via openings according to the second embodiment of the present disclosure.
Figure 23B:
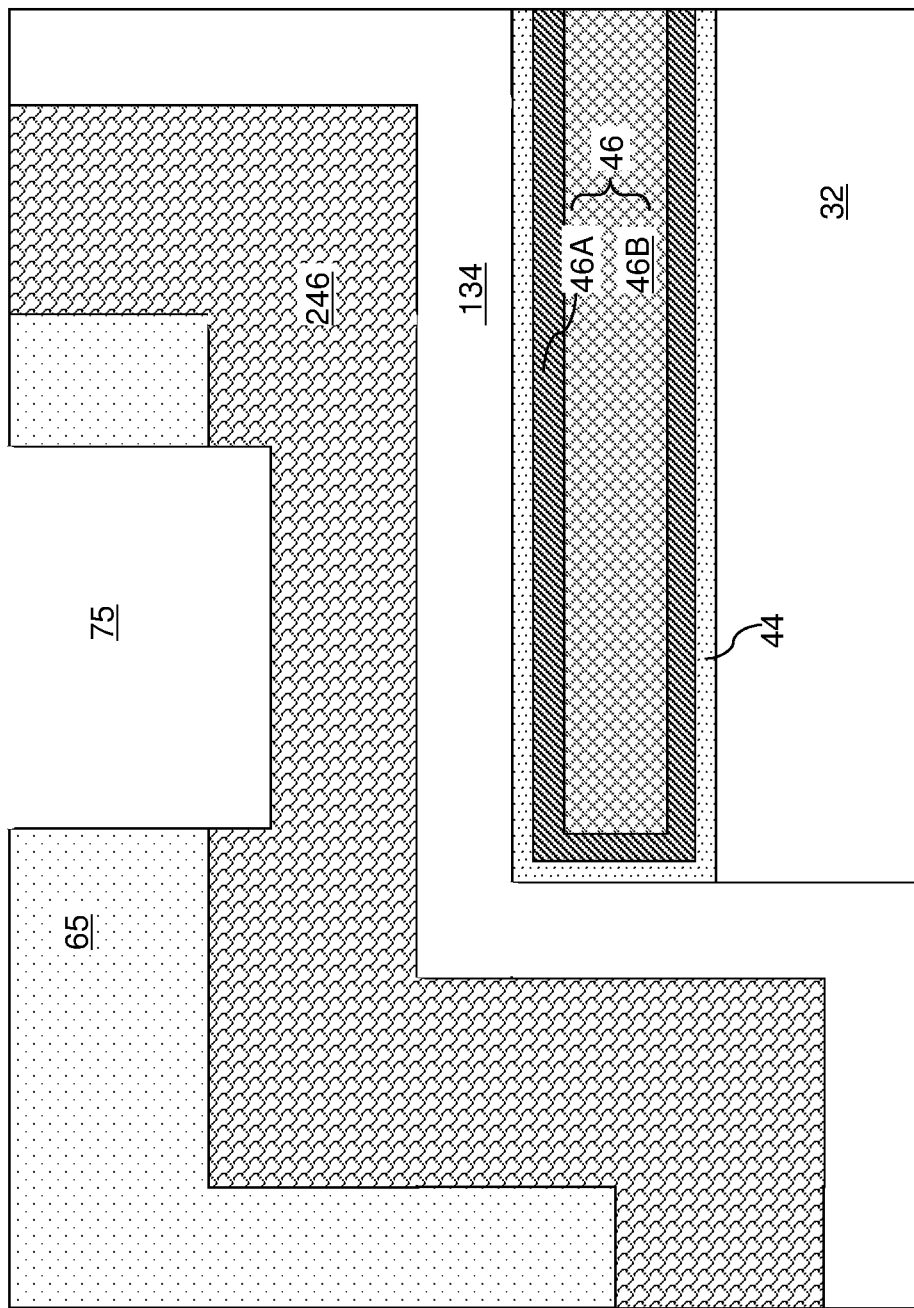
FIG. 23B is a magnified view of a region of the second exemplary structure of FIG. 23A.

Referring to FIGS. 23A and 23B, the processing steps of FIGS. 11B-11D, 12A-12C, 13, and 14A and 14B can be performed to form backside blocking dielectric layers 44, electrically conductive layers 46, insulating trench spacers 74, and backside contact via structures 76. Subsequently, the processing steps of FIGS. 15A and 16 can be performed to form the upper level dielectric layer 93 and the contact via openings (75, 77).

Specifically, a patterned mask layer including discrete openings can be formed over the upper level dielectric layer 93. For example, a photoresist layer can be applied over the upper level dielectric layer 93, and can be lithographically patterned to form a pattern of discrete openings therein. A first anisotropic etch process can be performed to etch through the upper level dielectric layer 93, the contact-level dielectric layer 73 and the retro-stepped dielectric material portion 65. The first anisotropic etch process etches the materials of the upper level dielectric layer 93, the contact-level dielectric layer 73 and the retro-stepped dielectric material portion 65 selective to the material of the perforated etch stop plate 246. Contact via openings (75, 77) are formed through the retro-stepped dielectric material portion 65. The contact via openings (75, 77) vertically extend through the upper level dielectric layer 93, the contact-level dielectric layer 73 and the retro-stepped dielectric material portion 65, and into the perforated etch stop plate 246. The contact via openings (75, 77) may include word-line contact via openings 75 that overlie portions of the electrically conductive layers 46 that are not covered by any overlying electrically conductive layer 46, and optional peripheral contact via openings 77 overlying a respective optional peripheral semiconductor device 700 in the peripheral region 200.

According to an aspect of the present disclosure, the perforated etch stop plate 246 functions as an etch stop structure during the first anisotropic etch process. Thus, the chemistry of the anisotropic etch process can be selected such that the first anisotropic etch process etches the materials of the upper level dielectric layer 93, the contact-level dielectric layer 73 and the retro-stepped dielectric material portion 65 selective to the material of the perforated etch stop plate 246. Portions of the perforated etch stop plate 246 that are physically exposed to the contact via openings (75, 77) are vertically recessed. The distance of the vertical recess into the perforated etch stop plate 246 may be generally proportional to the duration of time to which each portion of the perforated etch stop plate 246 is physically exposed to the etchant gas of the first anisotropic etch process. Thus, physically exposed portions of the perforated etch stop plate 246 that are more distal from the substrate (9, 10) may be recessed deeper than physically exposed portions of the perforated etch stop plate 246 that are proximal to the substrate (9, 10).

Figure 24A:
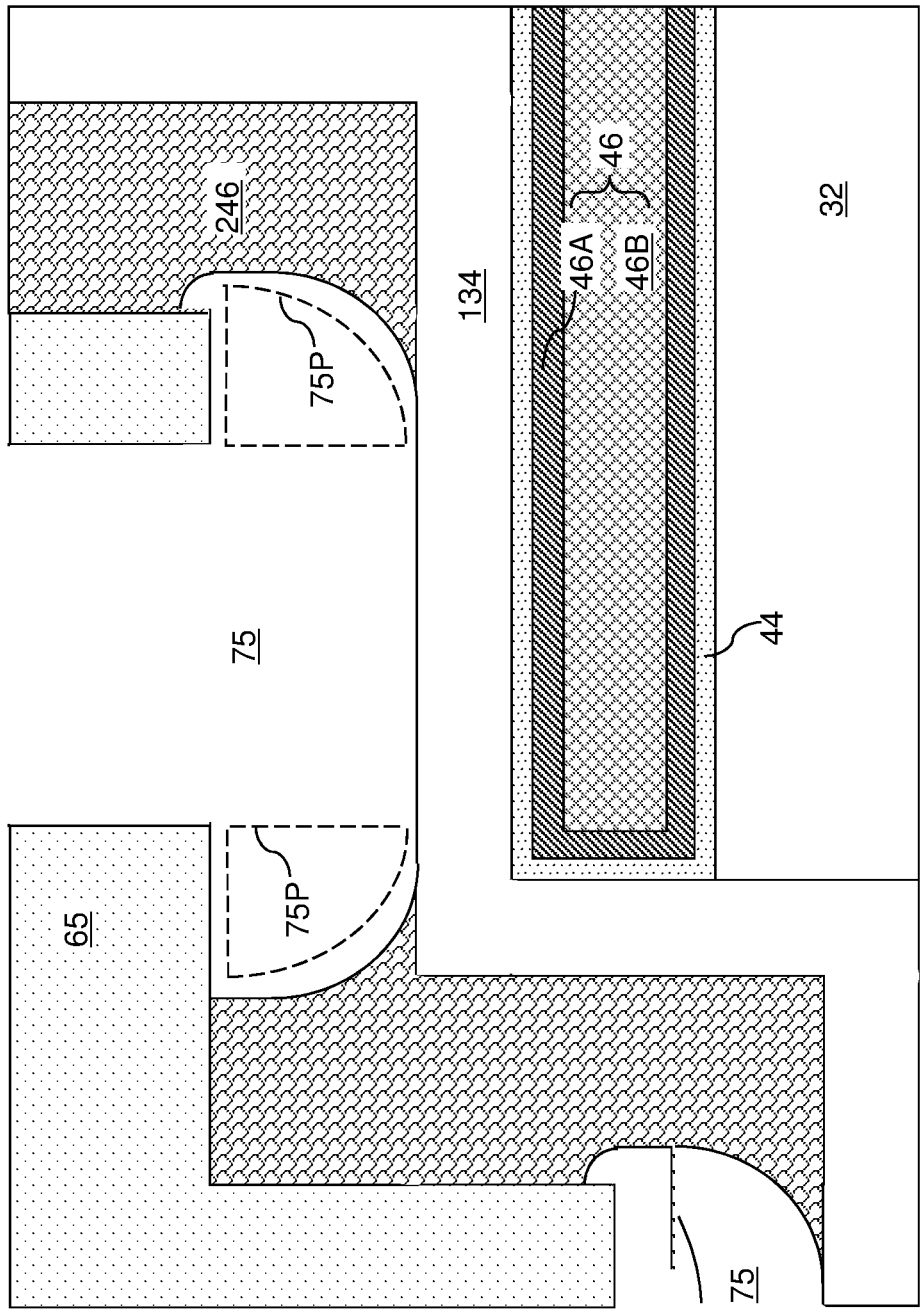
FIGS. 24A-24C are sequential vertical cross-sectional views of a region of the second exemplary structure during formation of an insulating spacer and vertical extension of a via cavity within each contact via opening according to the second embodiment of the present disclosure.

Referring to FIG. 24A, a selective isotropic etch process is performed to isotropically recess portions of the perforated etch stop plate 246 around the bottom regions of the contact via openings (75, 77). The selective isotropic etch process etches the materials of the perforated etch stop plate 246 selective to the materials of the retro-stepped dielectric material portions 65, the insulating trench spacers 74, and the stepped insulating plate. For example, if the perforated etch stop plate 246 comprises amorphous silicon or polysilicon, a wet etch process using hot trimethyl-2 hydroxyethyl ammonium hydroxide ("hot TMY") or tetramethyl ammonium hydroxide (TMAH) may be employed to etch portions of the perforated etch stop plate 246 that are proximal to the bottom portions of the contact via openings (75, 77). In this case, the perforated etch stop plate 246 comprises a perforated semiconductor plate comprising, and/or consisting essentially of, a semiconductor material, such as polysilicon or amorphous silicon. The electrically conductive layers 46 are protected from the chemical of the wet etch process by the stepped insulating plate 134 and the insulating trench spacers 74.

Each of the contact via openings (75, 77) is expanded in volume at a bottom portion. Specifically, the laterally-bulging recess cavity 75P can be formed at the bottom of each word-line contact via opening 75. In one embodiment, the duration of the selective isotropic etch process is selected such that a top surface of an underlying insulating material is physically exposed at the bottom of each of the contact via openings (75, 77). For example, the duration of the selective isotropic etch process may be selected such that the etch distance of the selective isotropic etch process into the materials of the perforated etch stop plate 246 is greater than the thickness of the horizontally-extending portions of the perforated etch stop plate 246. A surface of the stepped insulating plate 134 can be physically exposed at the bottom of each of the contact via openings (75, 77). Each of the laterally-bulging recess cavity 75P may comprise a convex tapered surface segment that adjoins the top surface of the underlying portion of the stepped insulating plate 134, and may optionally comprise a vertical cylindrical surface segment that is adjoined to a top periphery of the convex tapered surface segment. The patterned mask layer, such as the patterned photoresist layer, may be subsequently removed, for example, by ashing.

Figure 24B:
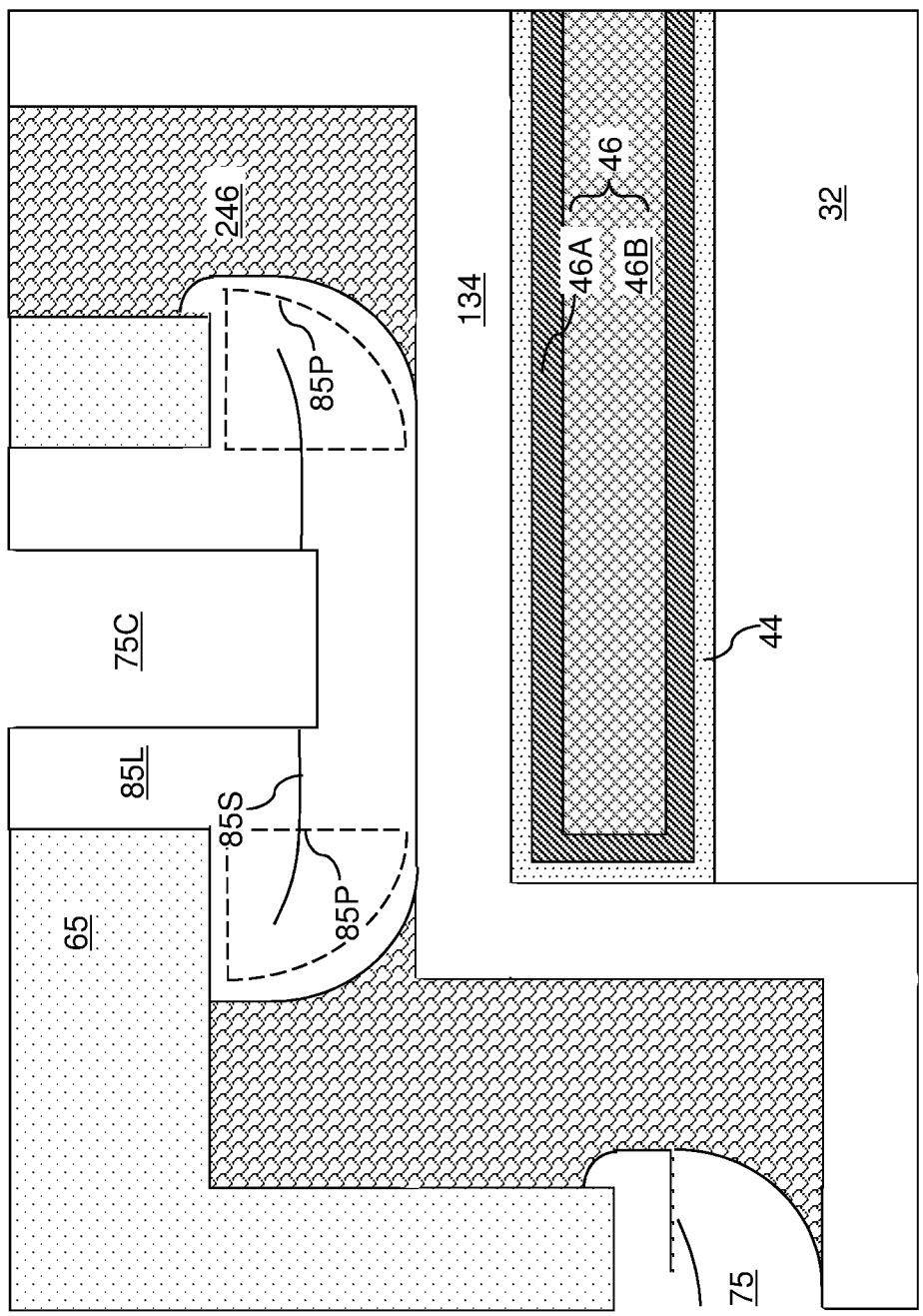

Referring to FIG. 24B, an insulating spacer material layer 85L can be deposited at peripheral regions of the contact via openings (75, 77) and over the upper level dielectric layer 93 by a conformal deposition process. The insulating spacer material layer 85L includes an insulating material, such as silicon oxide. The thickness of the insulating spacer material layer 85L may be greater than one half of the thickness of horizontally-extending portions of the perforated etch stop plate 246. The volumes of the laterally-bulging recess cavities 75P can be filled with the insulating spacer material layer 85L. A horizontally-extending annular seam 85S may be present within each portion of the insulating spacer material layer 85L located within the laterally-bulging recess cavities 75P. A vertically-extending via cavity (i.e., an unfilled void) 75C may be present within each contact via opening (75, 77).

Figure 24C:
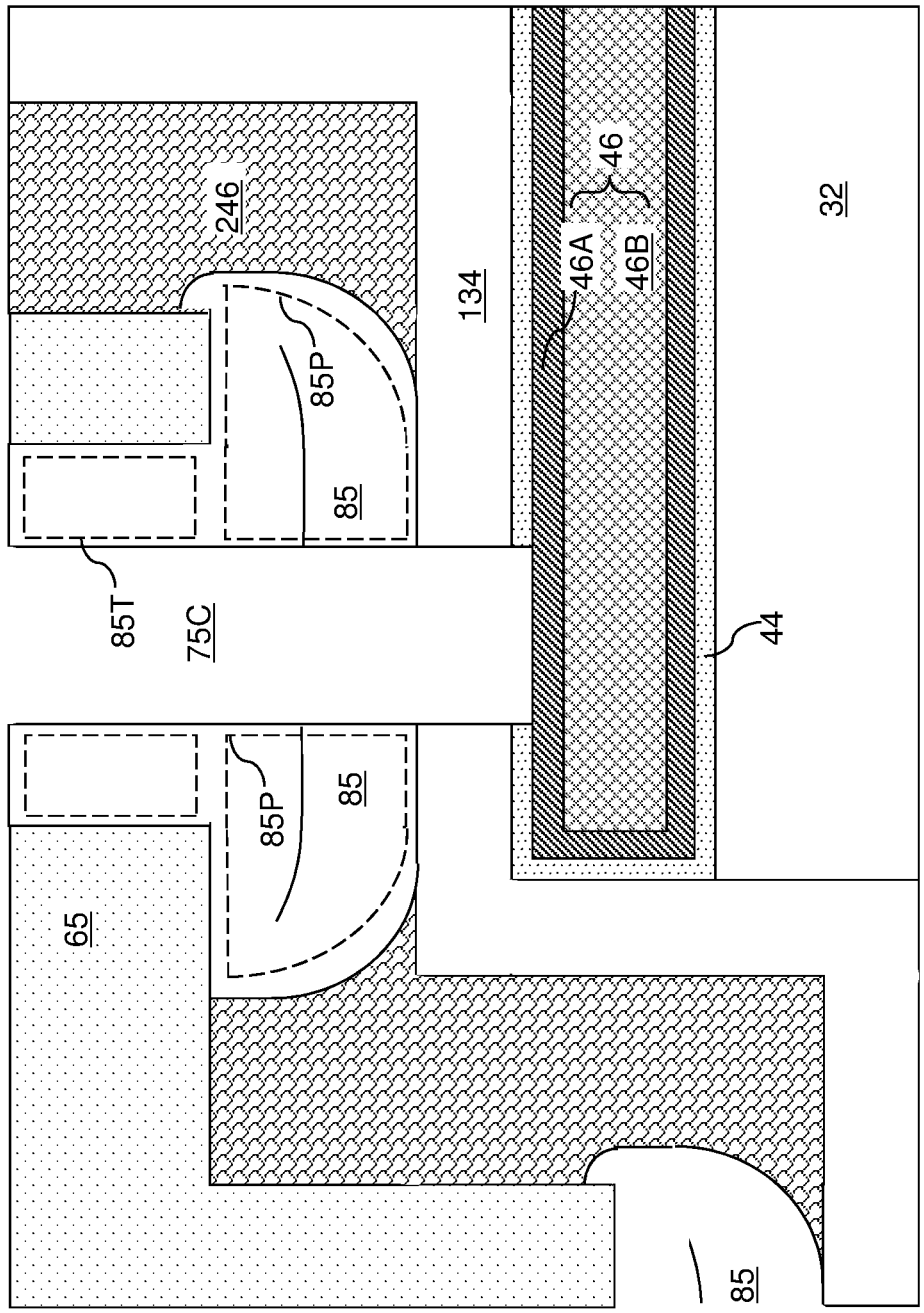

Referring to FIG. 24C, a second anisotropic etch process can be performed to remove bottom portions of the insulating spacer material layer 85L located underneath the vertically-extending cavities 75C within the contact via openings (75, 77). The second anisotropic etch process can be performed without forming any etch mask layer above the upper level dielectric layer 93. In other words, application or patterning of a photoresist layer above the upper level dielectric layer 93 prior to the second anisotropic etch process is not necessary.

Horizontally-extending portions of the insulating spacer material layer 85L can be removed from above the upper level dielectric layer 93 and at the bottom of each contact via opening (75, 77). Remaining vertically-extending portions of the insulating spacer material layer 85L comprise tubular insulating material portions, which are herein referred to as insulating spacers (85, 83) or tubular insulating spacers. The insulating spacers (85, 83) comprise word-line-contact insulating spacers 85 located within a respective one of the word-line contact via openings 75, and optional peripheral-contact insulating spacers 83 located within a respective one of the peripheral contact via openings 77.

Generally, insulating spacers (85, 83) can be formed at peripheral regions of the contact via openings (75, 77) over a respective top surface segment of the stepped insulating plate 134. The insulating spacers (85, 83) comprise word-line-contact insulating spacers 85 and peripheral-contact insulating spacers 83. The perforated etch stop plate 246 can be interposed between the alternating stack (32, 46) of the insulating layers 32 and the electrically conductive layers 46 and a stepped bottom surface of the retro-stepped dielectric material portion 65. The second anisotropic etch process can be continued to vertically extend the via cavities within the contact via openings (75, 77) through underlying portions of the stepped insulating plate 134. Top surfaces of the electrically conductive layers 46 can be exposed underneath the vertically-extended via cavities. Generally, the second anisotropic etch process etches the material of the stepped insulating plate 134 without employing a photoresist layer over the retro-stepped dielectric material portion 65, and forms perforation openings through the stepped insulating plate 134. Each via cavity 75C can be vertically extended through respective material stacks having a same set of material compositions and a same thickness. Thus, the overetch into the physically exposed portions of the electrically conductive layers 46 underneath the via cavities can be about the same irrespective of the location of the via cavities, and thus, can be controlled to avoid any punch-through through the electrically conductive layers 46.

Each insulating spacer (85, 83) comprises a tubular insulating portion 85T including a vertically-extending outer sidewall segment in contact with the retro-stepped dielectric material portion 65, and a laterally-bulging insulating portion 85P adjoined to a bottom of the tubular insulating portion and laterally protrudes outward from a vertical plane including the vertically-extending outer sidewall segment. In one embodiment, the laterally-bulging insulating portion 85P comprises a convex tapered surface segment that contacts a concave tapered surface segment of the perforated etch stop plate 246 for at least one, a plurality, or each of the insulating spacers (85, 83). In one embodiment, the laterally-bulging insulating portion 85P comprises a planar top surface having an inner periphery adjoined to a bottom periphery of the vertically-extending outer sidewall segment of the tubular insulating portion 85T.

In one embodiment, a perforated insulating plate 134 may be interposed between the alternating stack (32, 46) and the perforated etch stop plate 246. In one embodiment, the perforated insulating plate 134 comprises horizontally-extending portions including perforation openings therethrough, and vertically extending portions that contact sidewalls of the insulating layers 32 and connecting neighboring pairs among the horizontally-extending portions. In one embodiment, each of the insulating spacers (85, 83) comprises a respective annular bottom surface that contacts a respective top surface segment of the stepped insulating plate 134.

In one embodiment, the pair of backside trench fill structures (74, 76) can be located within a neighboring pair of backside trenches 79, and can contact lengthwise sidewalls of the alternating stack of the insulating layers 32 and the electrically conductive layers 46, the lengthwise sidewalls of the stepped insulating plate 134, the lengthwise sidewalls of the perforated etch stop plate 246, and the lengthwise sidewalls of the dielectric material portion 65. The pair of backside trench fill structures (74, 76) can laterally extend along a first horizontal direction hd1 and can be laterally spaced apart along a second horizontal direction hd2. Each of the backside trench fill structures (74, 76) can comprise an insulating trench spacer 74 and a backside contact via structure 76. The pair of backside trench fill structures (74, 76) can contact each of the insulating layers 32 and the electrically conductive layers 46 at a respective lengthwise sidewall that laterally extends along the first horizontal direction hd1, and the perforated etch stop plate 246 contacts the lengthwise sidewalls of the pair of backside trench fill structures (74, 76).

Figure 25A:
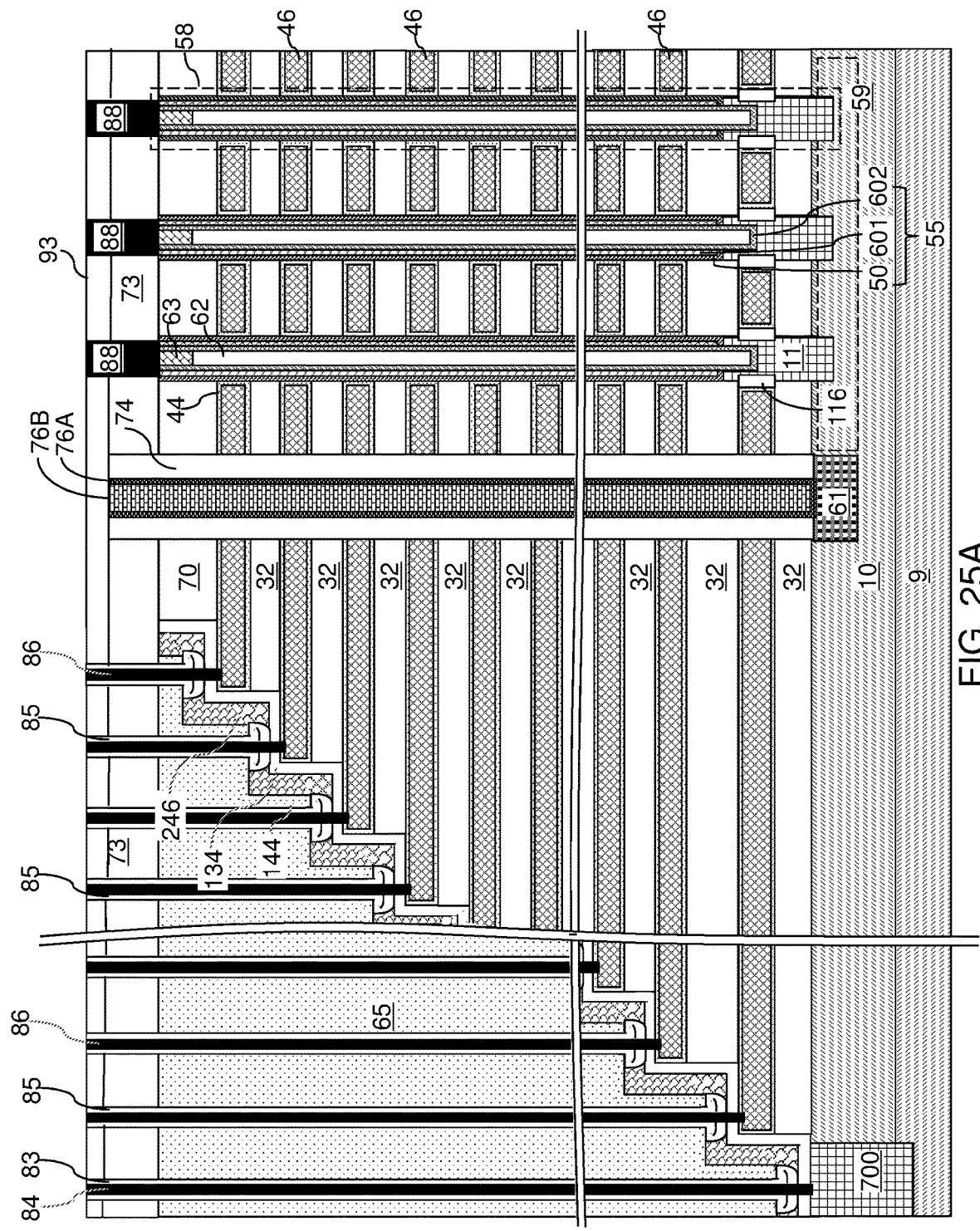
FIG. 25A is a schematic vertical cross-sectional view of the second exemplary structure after formation of contact via structures according to the second embodiment of the present disclosure.
Figure 25B:
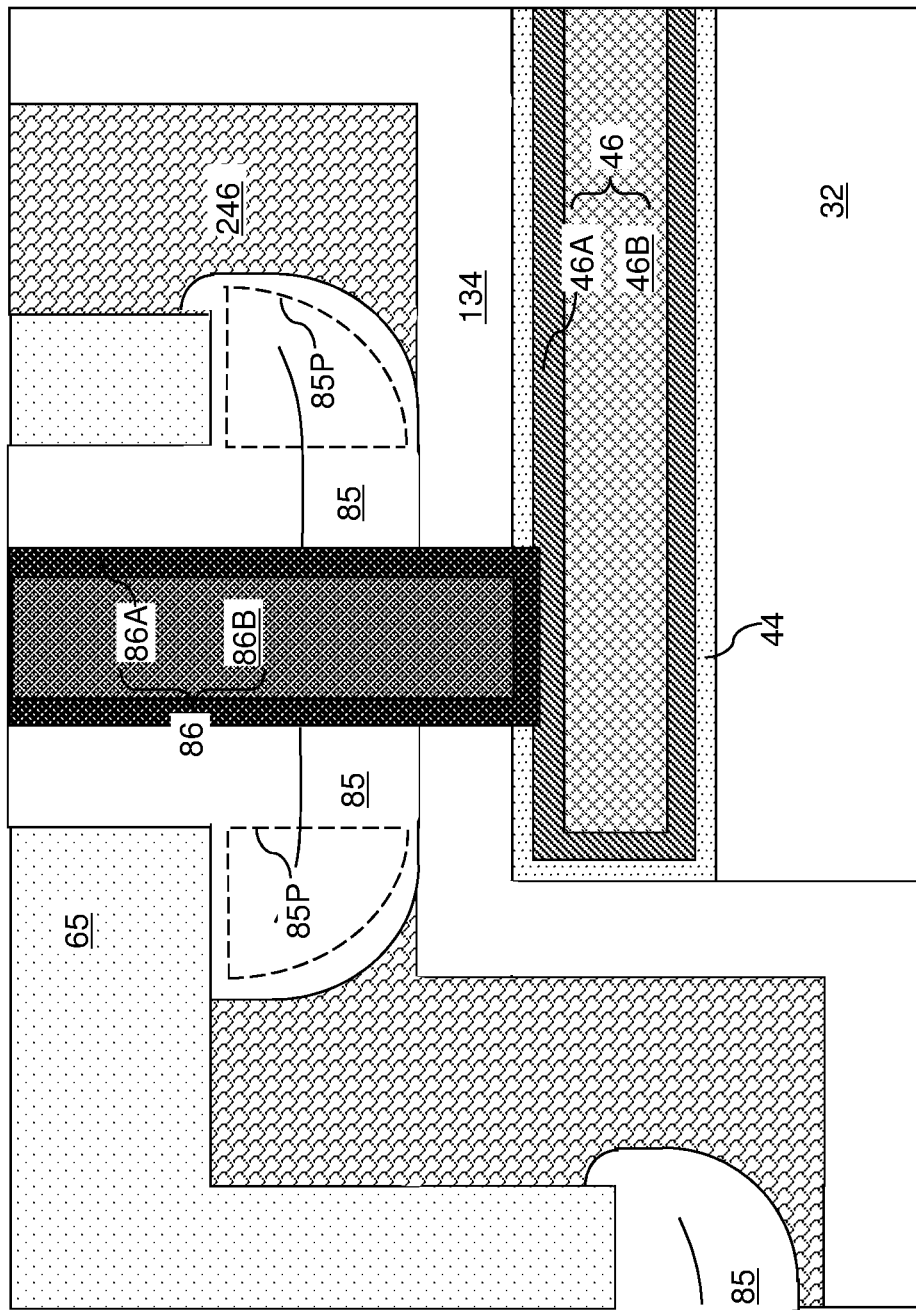
FIG. 25B is a top-down view of the second exemplary structure of FIG. 25A. The vertical plane A-A' is the plane of the schematic vertical cross-sectional view of FIG. 25A.

Referring to FIGS. 25A and 25B, drain contact via openings 87 can be formed over the drain regions 63 of the memory opening fill structures 58 by performing the processing steps of FIG. 18. The processing steps of FIGS. 19A-19C can be performed to form various contact via structures (86, 88, 84) and the bit lines. The contact via structures (86, 88, 84) comprise word-line contact via structures 86 in contact with a respective one of the electrically conductive layers 46, drain contact via structures 88 in contact with a respective one of the drain regions 63, and peripheral contact via structures 84 in contact with a respective one of the peripheral semiconductor devices 700 within the peripheral region 200.

In one embodiment, each of the word-line contact via structures 86 and the peripheral contact via structures 84 may be formed directly on sidewalls of perforation openings in the stepped insulating plate 134. In one embodiment, each of the word-line contact via structures 86 and the peripheral contact via structures 84 extends through and contacts a sidewall of a respective perforation opening in the perforated insulating plate 134.

Each contiguous combination of an insulating spacer (85, 83) and a contact via structure (86, 84) constitutes a laterally-insulated contact structure {(85, 86), (83, 84)}. The laterally-insulated contact structures {(85, 86), (83, 84)} comprise laterally-insulated word-line contact structures (85, 86) vertically extending through the retro-stepped dielectric material portion 65 and through a respective one of perforation openings in the perforated etch stop plate 246, and including a word-line contact via structure 86 contacting a top surface of a respective one of the electrically conductive layers 46 and a word-line word-line-contact insulating spacer 85 laterally surrounding the word-line contact via structure 86 and contacting the perforated etch stop plate 246.

In an alternative embodiment, formation of the backside blocking dielectric layers 44 may be omitted. In this case, each of the insulating spacers (85, 83) comprises a respective annular bottom surface that contacts a respective top surface segment of the perforated insulating plate 134.

Referring collective to FIGS. 1-25B and according to various embodiments of the present disclosure, a three-dimensional memory device is provided, which comprises: an alternating stack of insulating layers 32 and electrically conductive layers 46 located over a substrate (9, 10), wherein the alternating stack (32, 46) comprises a staircase region in which lateral extents of the electrically conductive layers 46 decrease with a vertical distance from the substrate (9, 10); a retro-stepped dielectric material portion 65 overlying the staircase region of the alternating stack (32, 46); memory stack structures 55 vertically extending through the alternating stack (32, 46), wherein each of the memory stack structures 55 comprises a respective vertical semiconductor channel 60 and a respective memory film 50; an electrically conductive or semiconductor perforated etch stop plate (146, 246) interposed between the alternating stack (32, 46) and a stepped bottom surface of the retro-stepped dielectric material portion 65; and laterally-insulated contact structures (85, 86) vertically extending through the retro-stepped dielectric material portion 65 and through a respective one of perforation openings in the perforated etch stop plate (146, 246), wherein each of the laterally-insulated contact structures (85, 86) comprises an assembly of a word-line contact via structure 86 contacting a top surface of a respective one of the electrically conductive layers 46 and an word-line-contact insulating spacer 85 laterally surrounding the word-line contact via structure 86 and contacting the perforated etch stop plate (146, 246).

Figure 26:
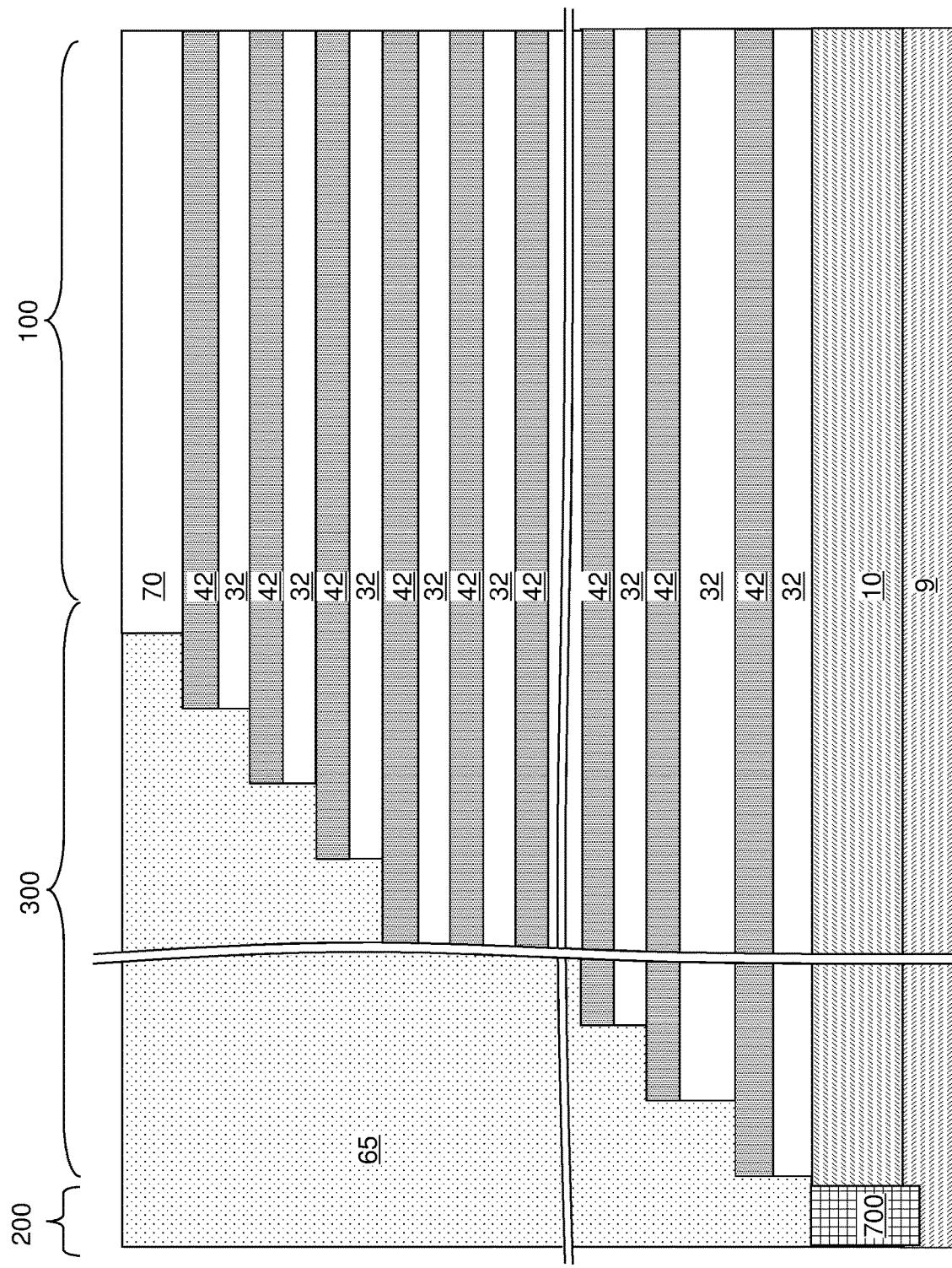
FIG. 26 is a schematic vertical cross-sectional view of a third exemplary structure after formation of an alternating stack of insulating layers and sacrificial material layers and a retro-stepped dielectric material portion according to a third embodiment of the present disclosure.

Referring to FIG. 26, a third exemplary structure according to a third embodiment of the present disclosure can be derived from the first exemplary structure of FIG. 4 by omitting formation of the stepped insulating plate 134 and the stepped material plate 135, or from the second exemplary structure of FIG. 20 by omitting formation of the stepped insulating layer 134L and the stepped etch stop material layer 246L and by forming a retro-stepped dielectric material portion. The retro-stepped dielectric material portion can be formed directly on the stepped surfaces of the alternating stack (32, 42).

Figure 27A:
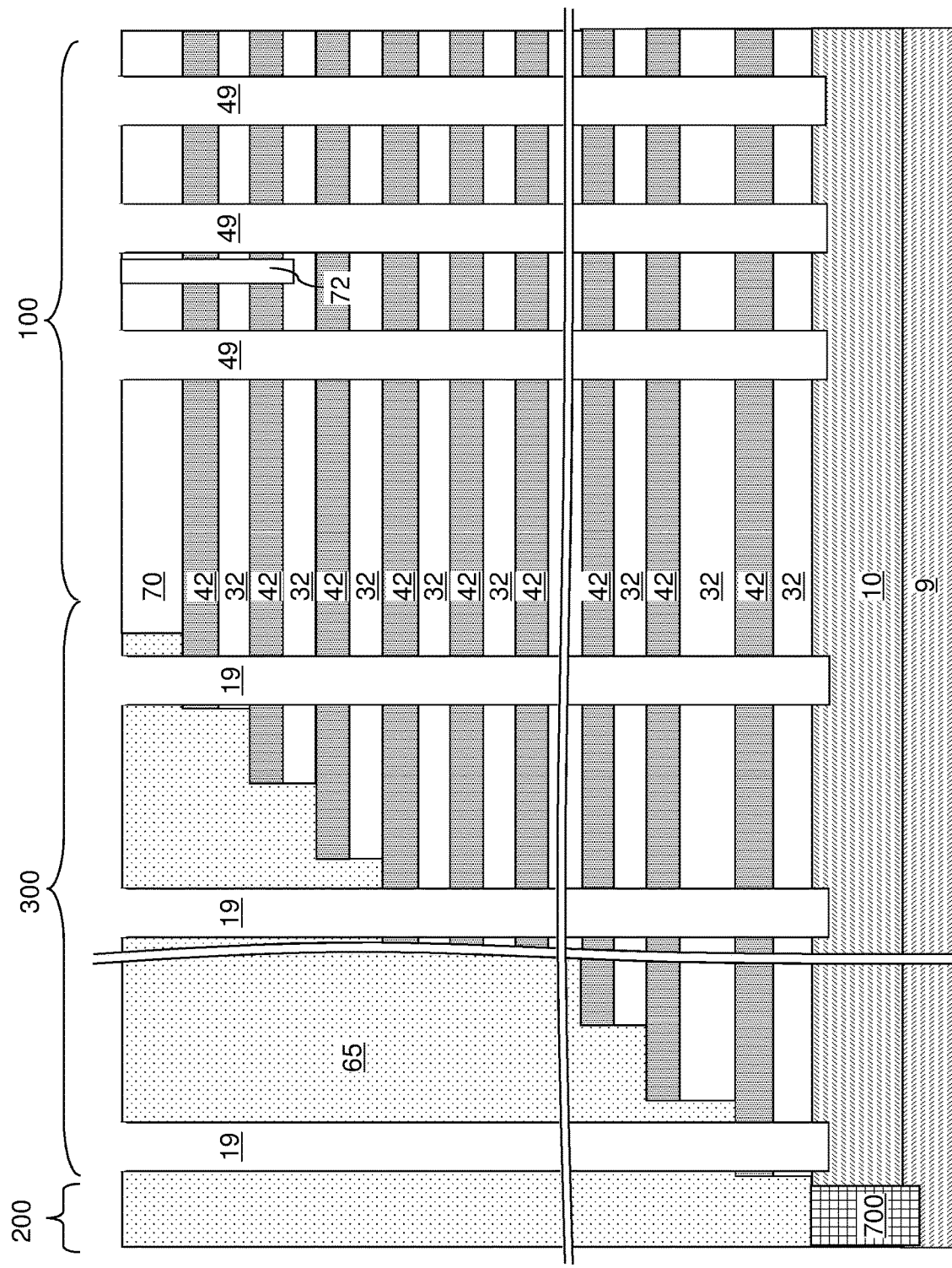
FIG. 27A is a schematic vertical cross-sectional view of the third exemplary structure after formation of memory openings and support openings according to the third embodiment of the present disclosure.
Figure 27B:
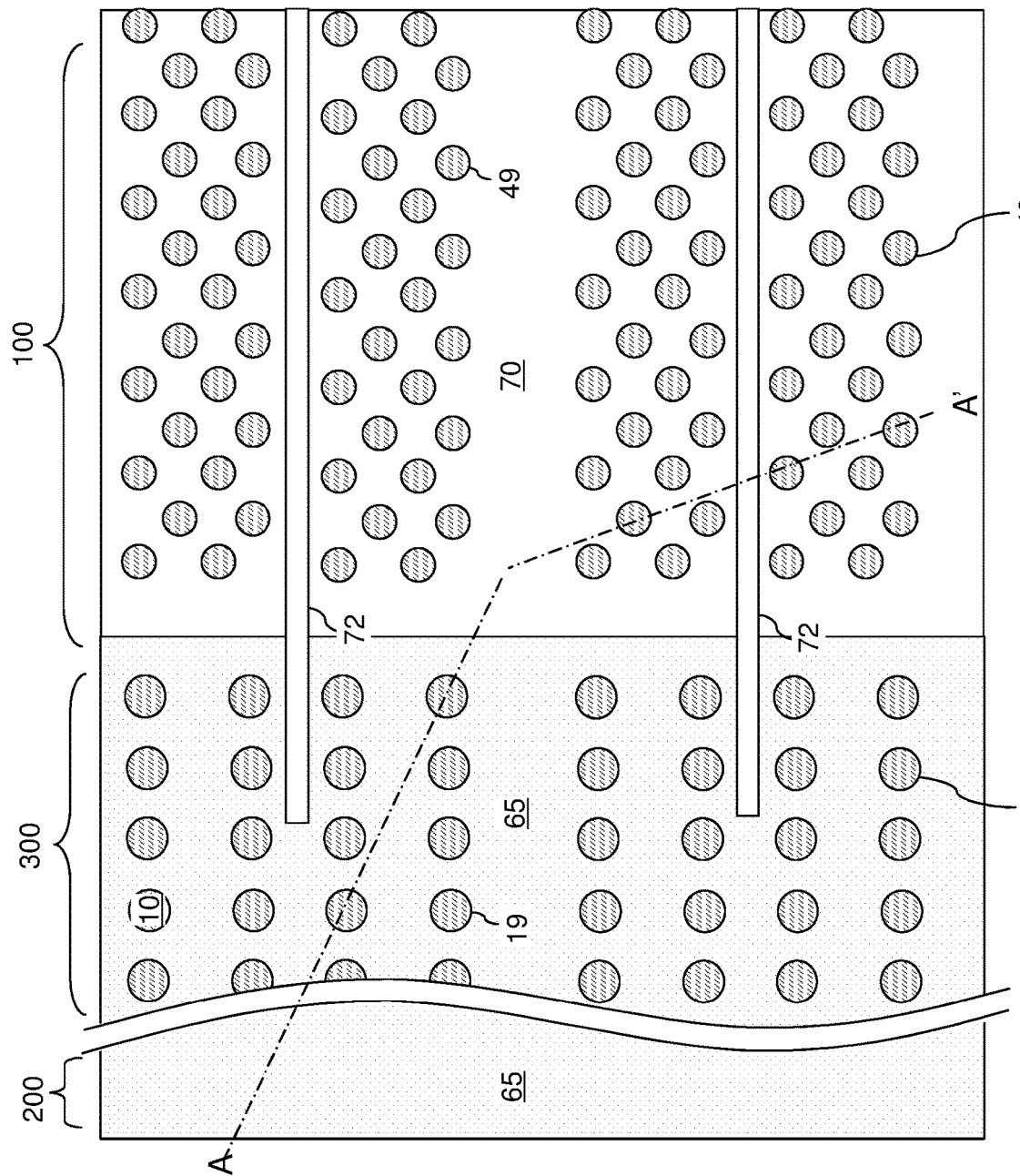
FIG. 27B is a top-down view of the third exemplary structure of FIG. 27A. The vertical plane A-A' is the plane of the cross-section for FIG. 27A.

Referring to FIGS. 27A and 27B, the processing steps of FIGS. 6A and 6B can be performed, with any needed changes in view of omission of the stepped insulating plate 134 and the stepped material plate 135 in the third exemplary structure, to form memory openings 49 and support openings 19. Specifically, the anisotropic etch process that etches the memory openings 49 and the support openings 19 may be modified as needed in the absence of a stepped insulating plate 134 and a stepped material plate 135 in the third exemplary structure relative to the first exemplary structure. Optionally, drain select level isolation structures 72 can be formed through the insulating cap layer 70 and a subset of the sacrificial material layers 42 located at drain select levels.

Figure 28:
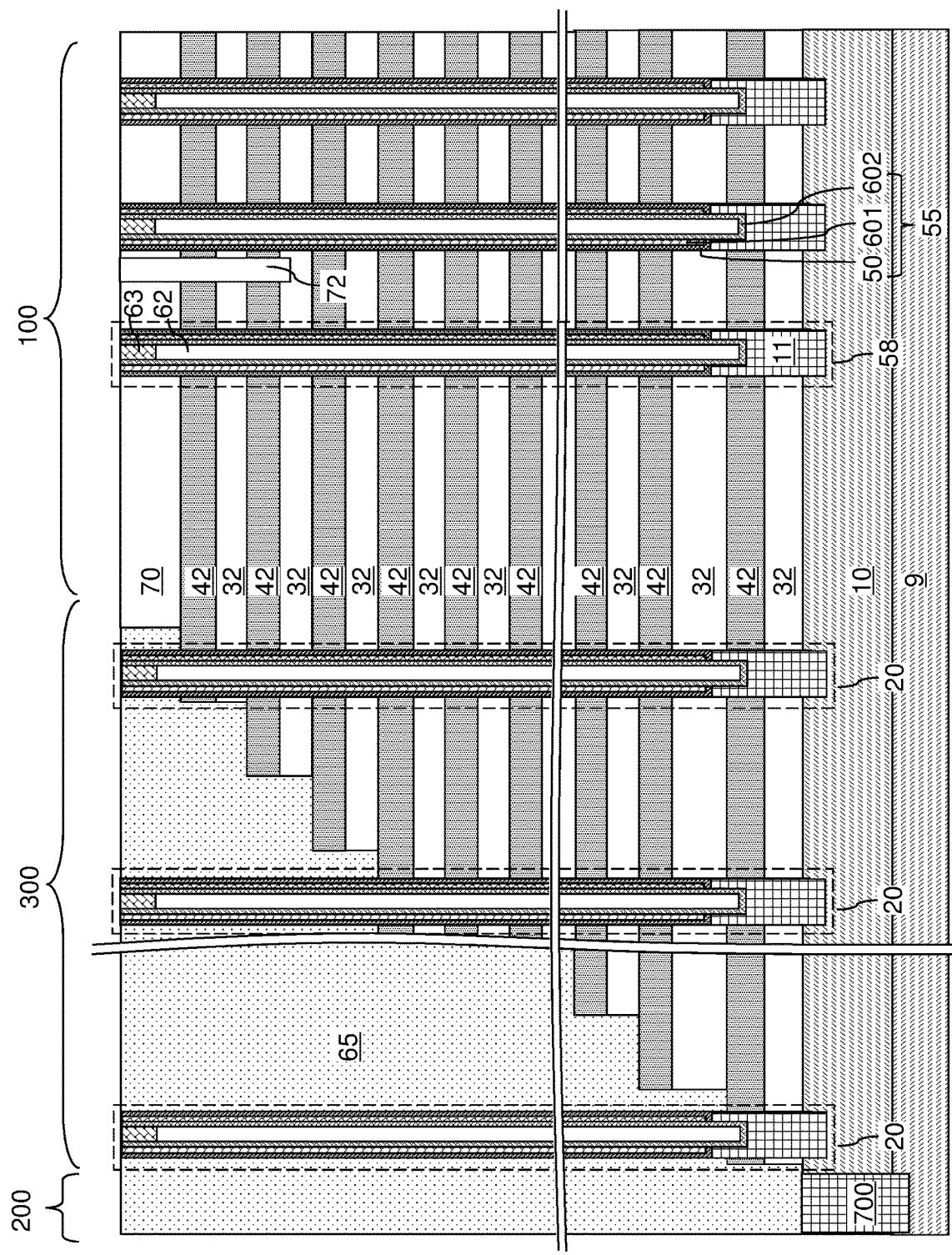
FIG. 28 is a schematic vertical cross-sectional view of the third exemplary structure after formation of memory stack structures and support pillar structures according to the third embodiment of the present disclosure.

Referring to FIG. 28, the processing steps of FIGS. 7A-7H can be performed to form a memory opening fill structure 58 in each memory opening 49, and to form a support pillar structure 20 in each support opening 19.

Figure 29A:
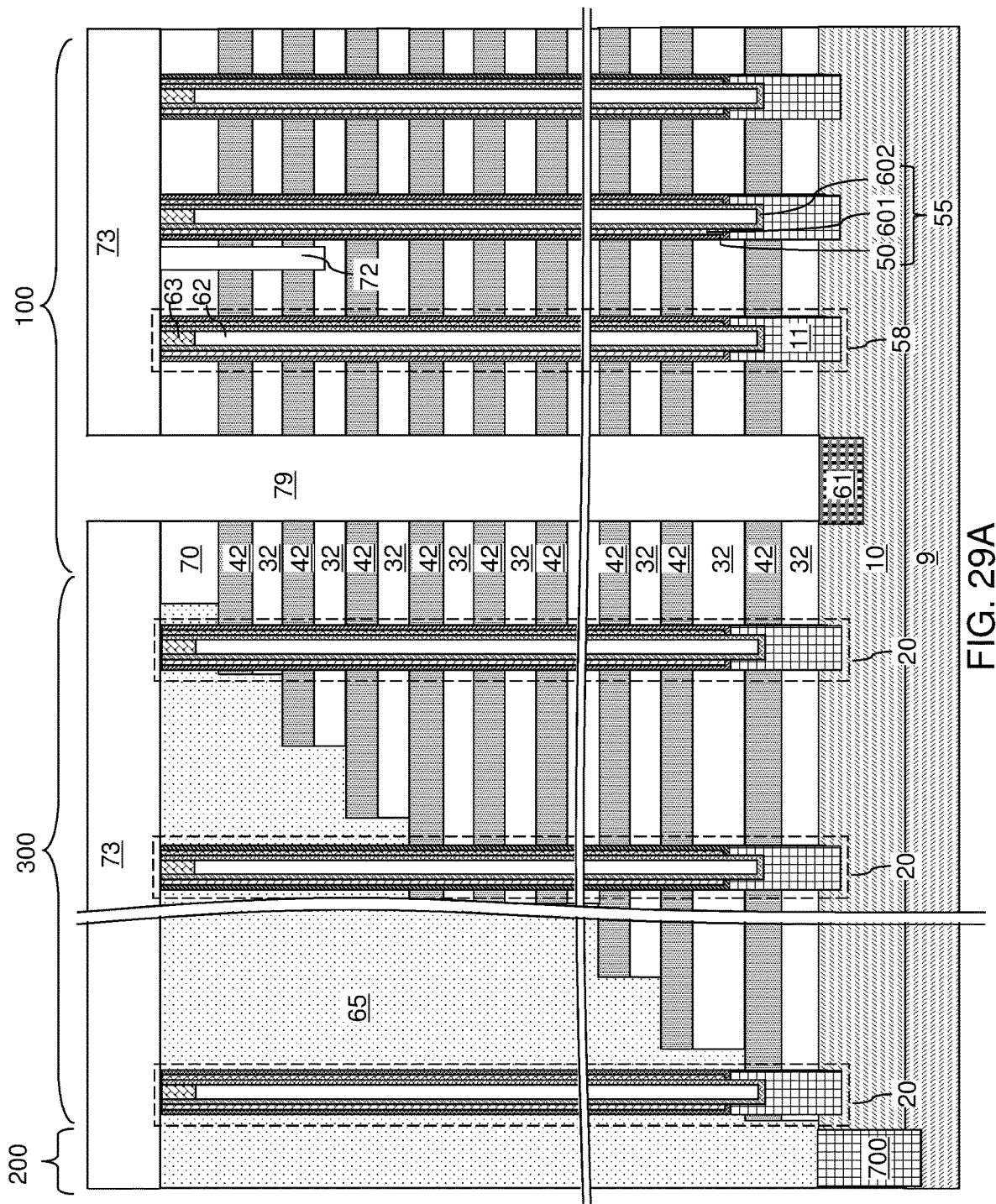
FIG. 29A is a schematic vertical cross-sectional view of the third exemplary structure after formation of backside trenches according to the third embodiment of the present disclosure.
Figure 29B:
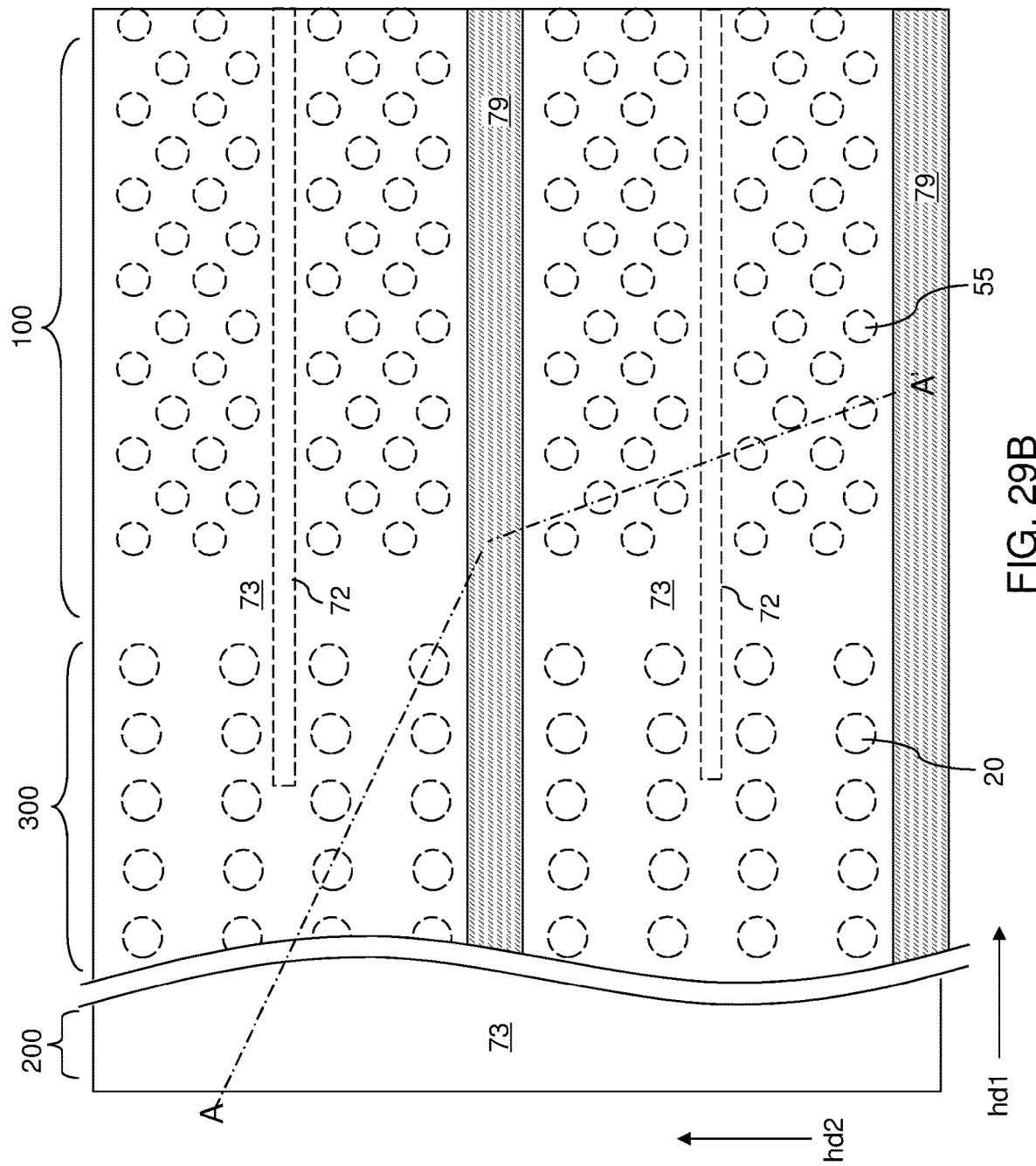
FIG. 29B is a top-down view of the third exemplary structure of FIG. 29A. The vertical plane A-A' is the plane of the schematic vertical cross-sectional view of FIG. 29A.

Referring to FIGS. 29A and 29B, the processing steps of FIGS. 9A and 9B can be performed, with any needed changes in view of omission of the stepped insulating plate 134 and the stepped material plate 135 in the third exemplary structure, to form backside trenches 79 and the source regions 61. Specifically, the anisotropic etch process that etches the backside trenches 79 may be modified as needed in the absence of a stepped insulating plate 134 and a stepped material plate 135 in the third exemplary structure relative to the first exemplary structure.

Figure 30:
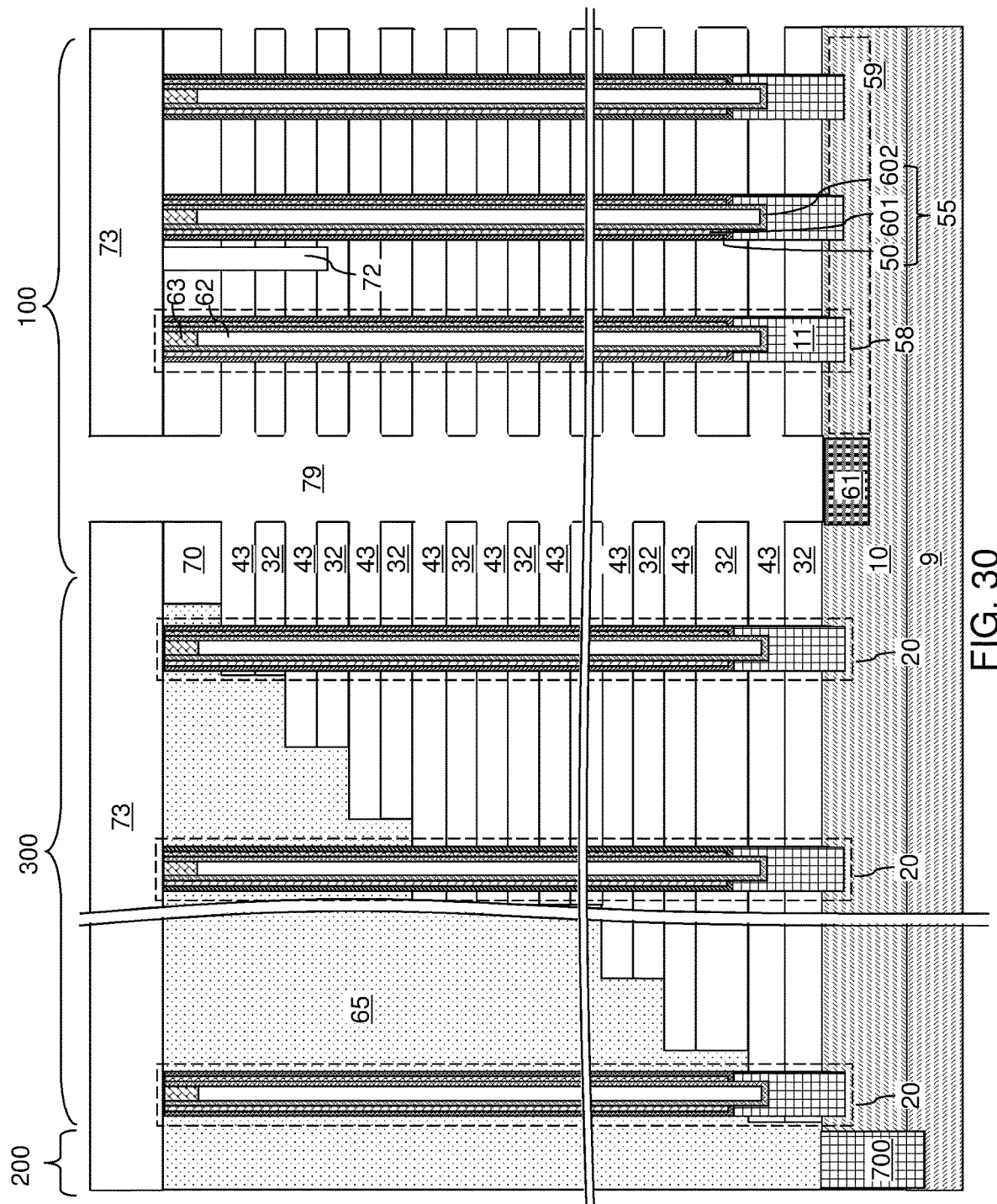
FIG. 30 is a schematic vertical cross-sectional view of the third exemplary structure after formation of backside recesses according to the third embodiment of the present disclosure.

Referring to FIG. 30, the processing steps of FIG. 10 can be performed to form backside recesses 43, tubular dielectric spacers 116, and the planar dielectric portions 616. Generally, an etchant that selectively etches the second material of the sacrificial material layers 42 with respect to the first material of the insulating layers 32 can be introduced into the backside trenches 79, for example, employing a wet etch process. Backside recesses 43 are formed in volumes from which the sacrificial material layers 42 are removed.

Figure 31A:
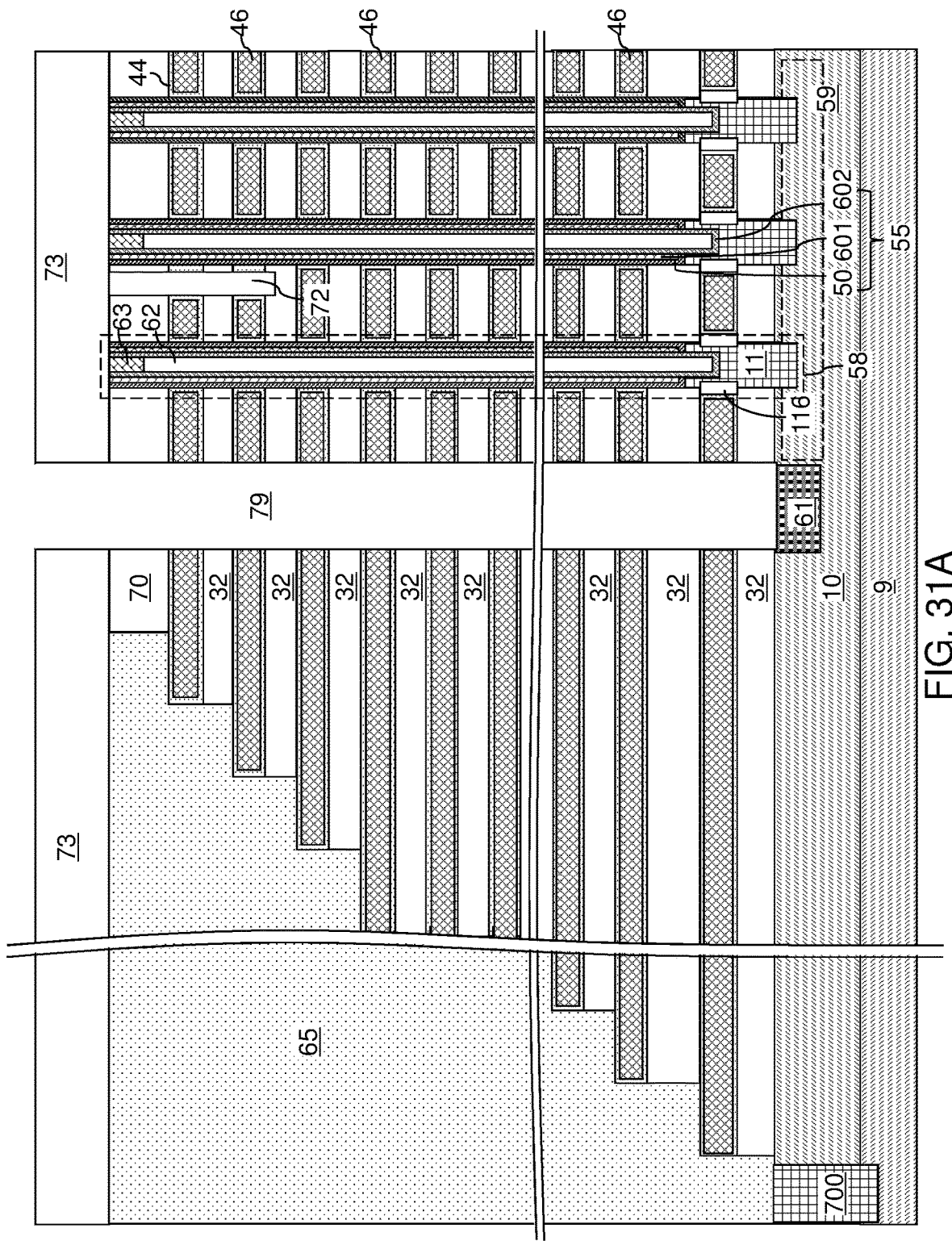
FIG. 31A is a schematic vertical cross-sectional view of the third exemplary structure after formation of electrically conductive layers according to the third embodiment of the present disclosure.
Figure 31B:
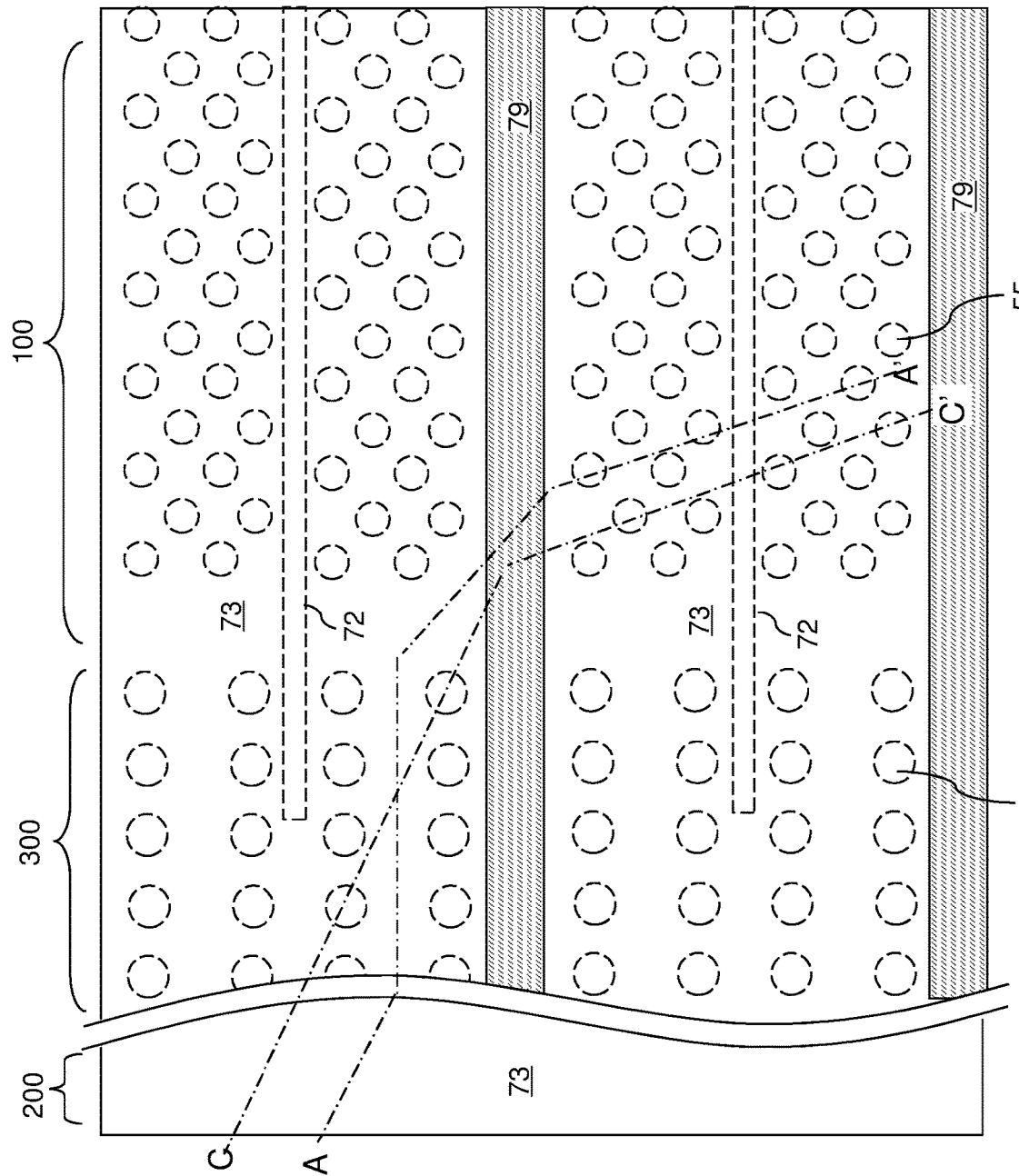
FIG. 31B is a top-down view of the third exemplary structure of FIG. 31A. The vertical plane A-A' is the plane of the schematic vertical cross-sectional view of FIG. 31A.
Figure 31C:
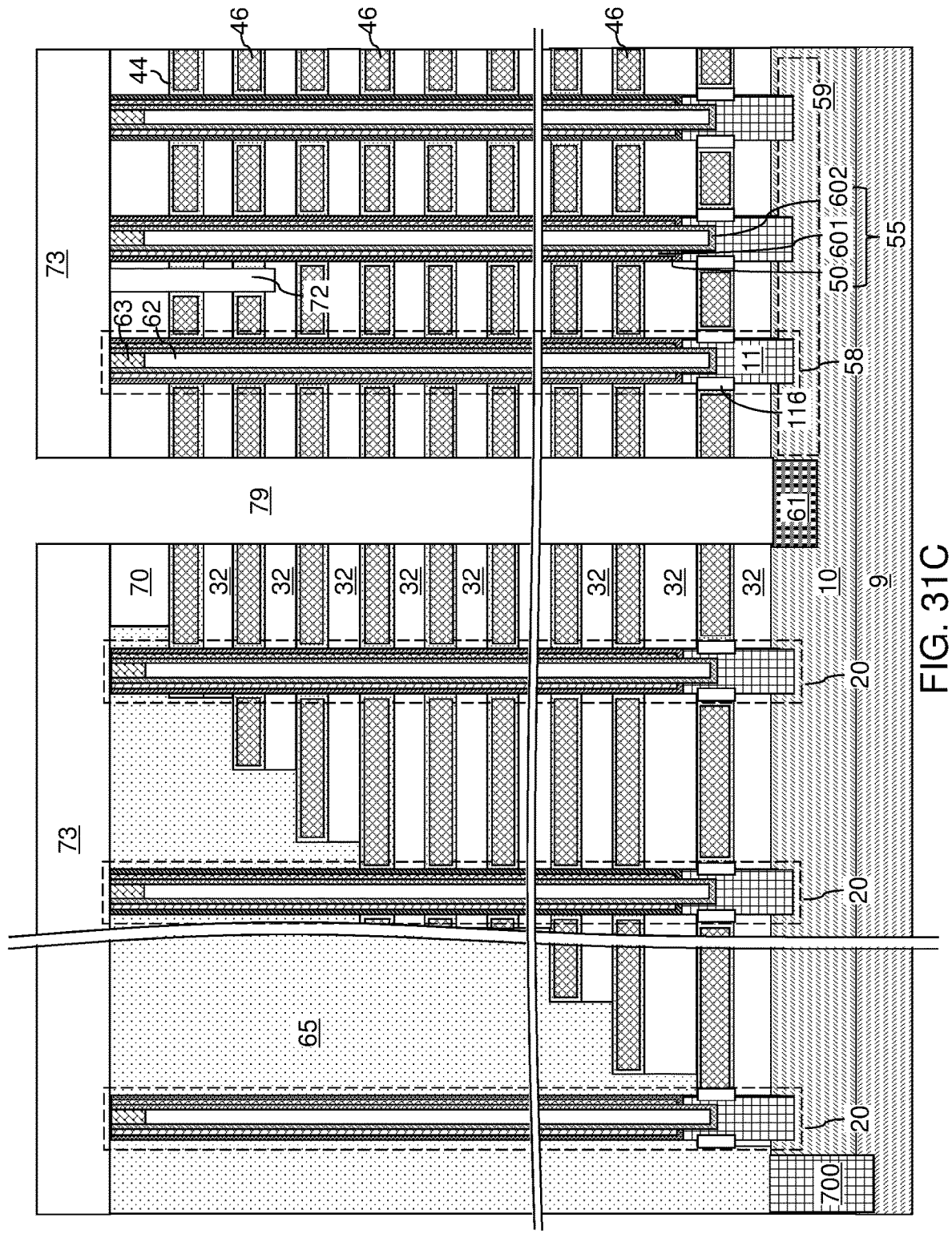
FIG. 31C is a schematic vertical cross-sectional view of the third exemplary structure along the vertical plane C-C' of FIG. 31B.

Referring to FIGS. 31A-31C, the processing steps of FIGS. 11B, 11C, 11D, 12A-12C, and 13 can be performed to optionally form backside blocking dielectric layers 44 and to form electrically conductive layers 46. The topmost electrically conductive layer 46D is a dummy electrically conductive layer as will be described below.

Figure 32:
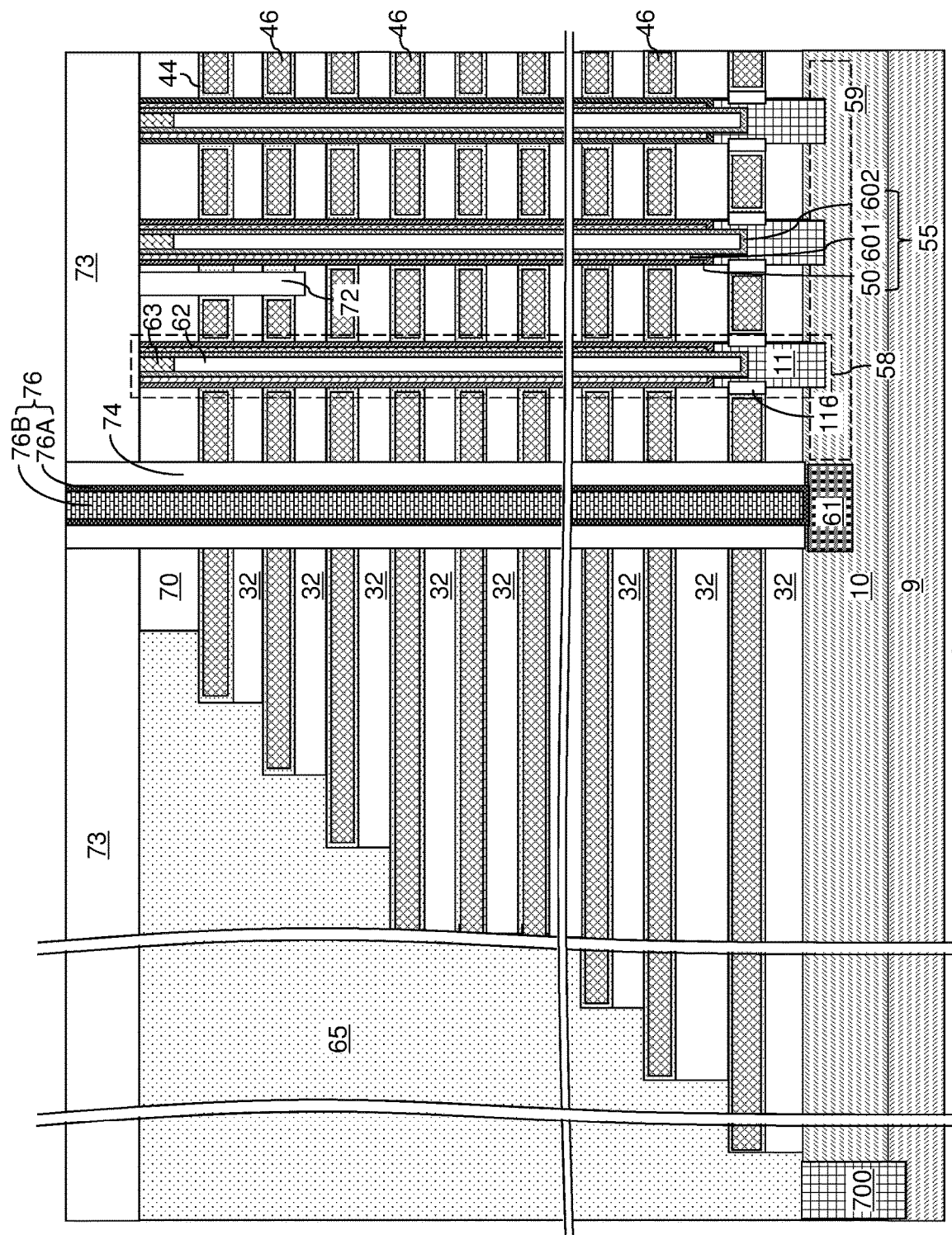
FIG. 32 is a schematic vertical cross-sectional view of the third exemplary structure after formation of a backside insulating spacer and a backside contact via structure in each backside trench according to the third embodiment of the present disclosure.

Referring to FIG. 32, the processing steps of FIGS. 14A and 14B can be performed to form an insulating trench spacer 74 and a backside contact via structure 76 in each backside trench 79.

Figure 33:
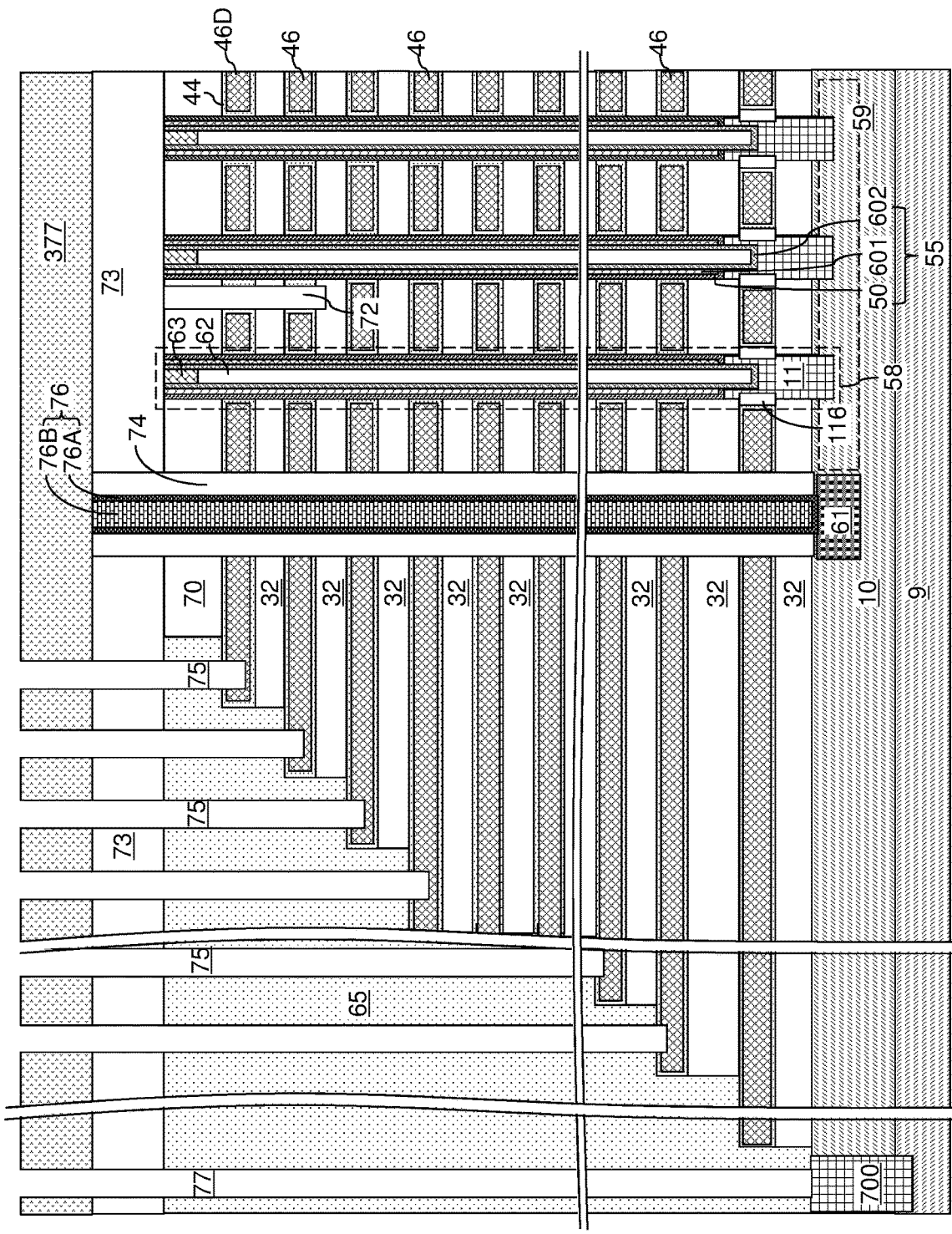
FIG. 33 is a schematic vertical cross-sectional view of the third exemplary structure after formation of word-line contact via openings and peripheral contact via openings according to the third embodiment of the present disclosure.
Figure 34A:
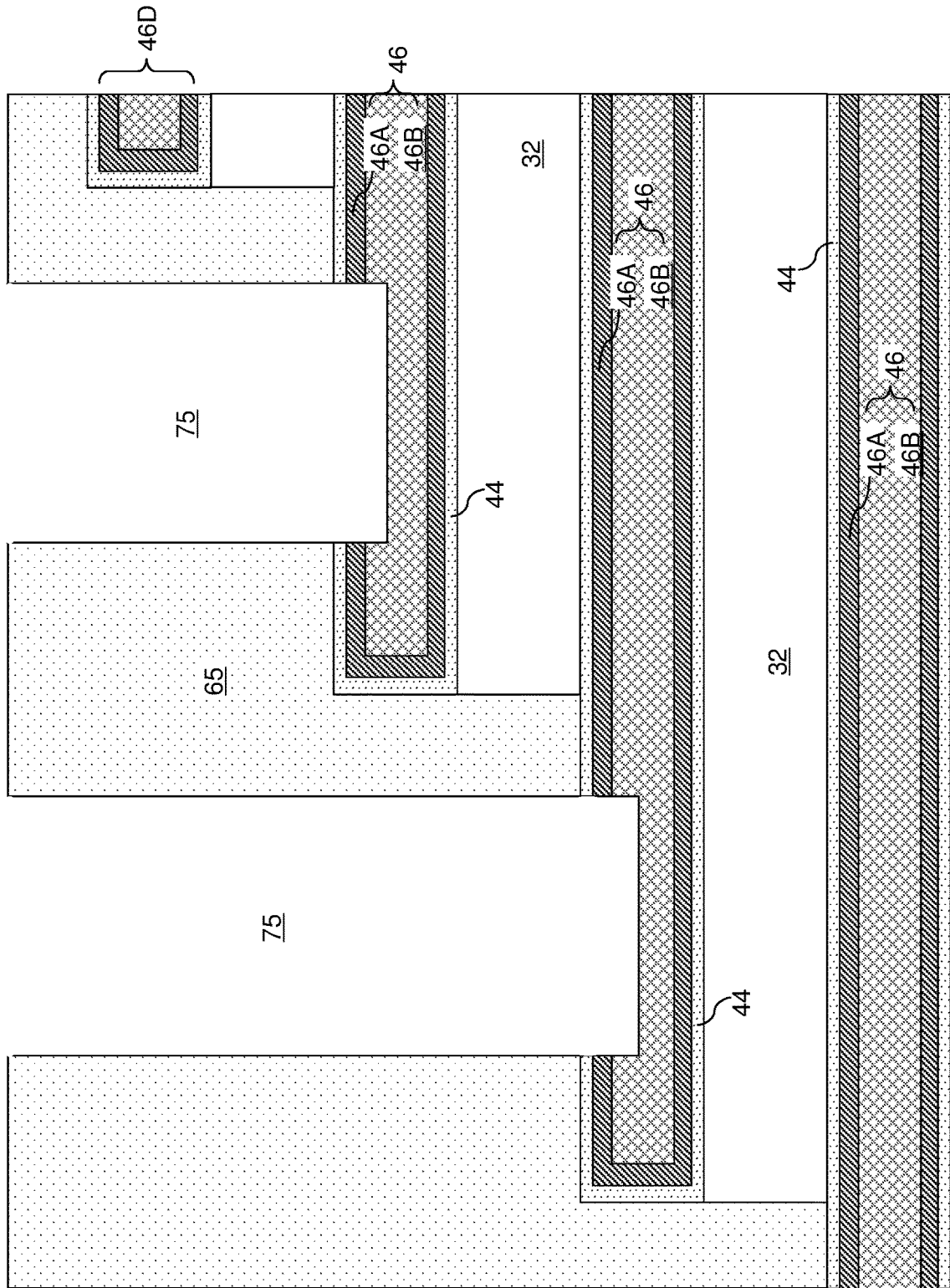
FIGS. 34A-34C are sequential vertical cross-sectional views of a region of the third exemplary structure during formation of an insulating spacer according to the third embodiment of the present disclosure.

Referring to FIGS. 33 and 34A, a patterned mask layer including discrete openings can be formed over the contact-level dielectric layer 73. For example, a photoresist layer 377 can be applied over the contact-level dielectric layer 73, and can be lithographically patterned to form a pattern of discrete openings therein. A first anisotropic etch process can be performed to etch through the contact-level dielectric layer 73 and the retro-stepped dielectric material portion 65. The first anisotropic etch process etches the materials of the contact-level dielectric layer 73 and the retro-stepped dielectric material portion 65 selective to the material of the electrically conductive layers 46. Contact via openings (75, 77) are formed through the retro-stepped dielectric material portion 65. The contact via openings (75, 77) may include word-line contact via openings 75 that overlie portions of the electrically conductive layers 46 that are not covered by any overlying electrically conductive layer 46. The word-line contact via openings 75 vertically extend through the contact-level dielectric layer 73 and the retro-stepped dielectric material portion 65 and into a respective electrically conductive layer 46 that underlies an interface between a stepped bottom surface of the retro-stepped dielectric material portion 65 and a horizontally surface of a respective backside blocking dielectric layer 44, or an interface between the stepped bottom surface of the retro-stepped dielectric material portion 65 and a horizontal surface of a respective electrically conductive layer 46 (in case the backside blocking dielectric layers 44 are not employed). The contact via openings (75, 77) may include peripheral contact via openings 77 overlying a respective peripheral semiconductor device 700 in the peripheral region 200.

End portions of the electrically conductive layers 46 (including the dummy electrically conductive layer 46D) function as etch stop structures during the first anisotropic etch process. Thus, the chemistry of the anisotropic etch process can be selected such that the first anisotropic etch process etches the materials of the contact-level dielectric layer 73 and the retro-stepped dielectric material portion 65 selective to the material of the electrically conductive layers 46. Portions of the electrically conductive layers 46 that are physically exposed to the word-line contact via openings 75 are vertically recessed. The distance of the vertical recess into the electrically conductive layers 46 is generally proportional to the duration of time to which each portion of the electrically conductive layers 46 is physically exposed to the etchant gas of the first anisotropic etch process. Thus, physically exposed portions of the electrically conductive layers 46 that are more distal from the substrate (9, 10) are recessed deeper than physically exposed portions of the electrically conductive layers 46 that are proximal to the substrate (9, 10).

Figure 34B:
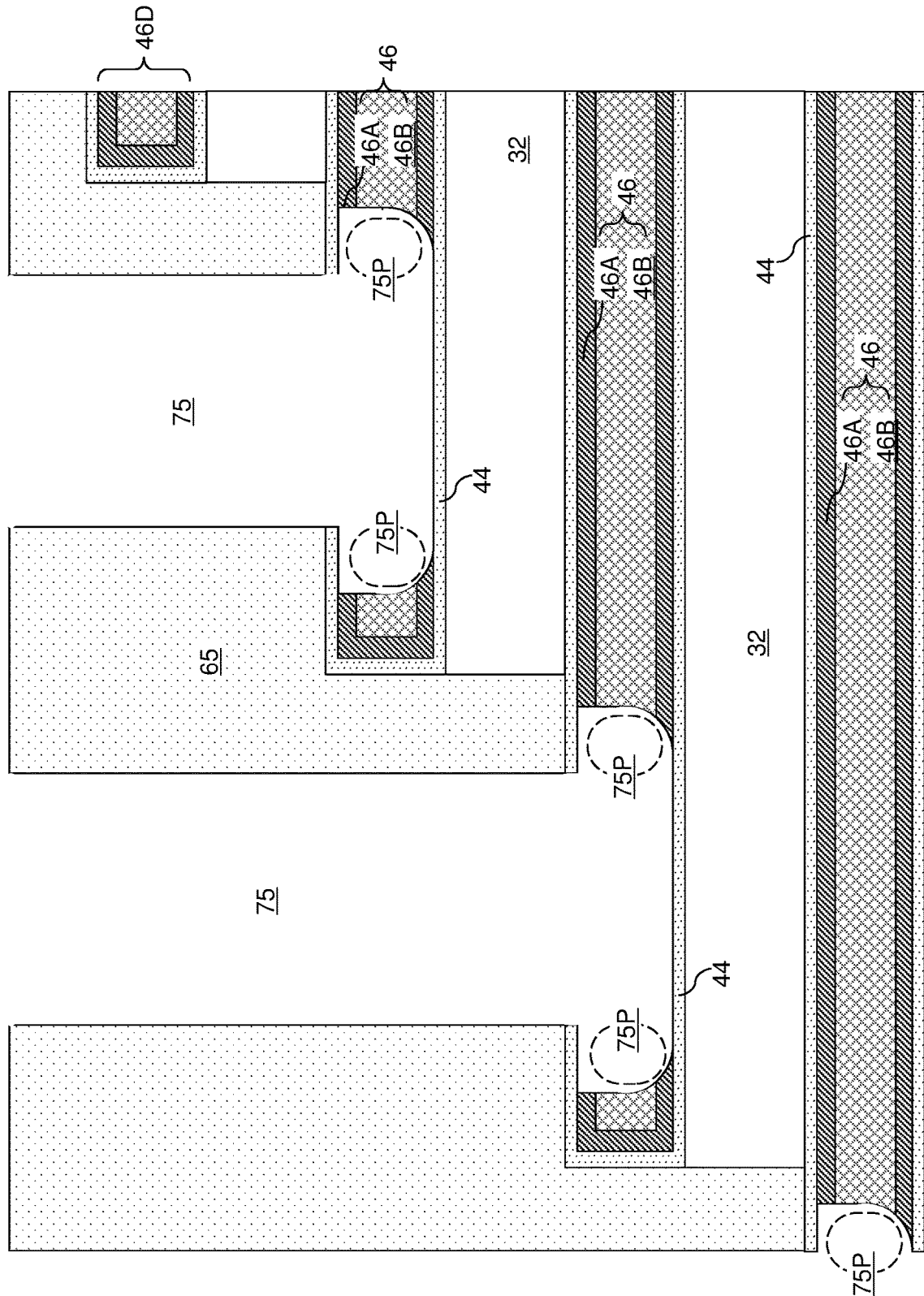

Referring to FIG. 34B, a selective isotropic etch process is performed to isotropically recess portions of the electrically conductive layers 46 around the bottom regions of the word-line contact via openings 75. The selective isotropic etch process etches the materials of the electrically conductive layers 46 selective to the materials of the retro-stepped dielectric material portions 65 and the insulating layers 32. For example, a wet etch process employing hot trimethyl-2 hydroxyethyl ammonium hydroxide ("hot TMY"), and/or a mixture of hydrofluoric acid and nitric acid, and optionally hydrochloric acid and/or a mixture of potassium hydroxide and potassium hexacyanoferrate ($K_3Fe(CN)_6$) (i.e., potassium ferricyanide) may be employed to etch portions of the electrically conductive layers 46 that are proximal to the bottom portions of the word-line contact via openings 75.

Each of the word-line contact via openings 75 is optionally expanded in volume at a bottom portion. Specifically, an optional laterally-bulging recess cavity 75P can be formed at the bottom of each word-line contact via opening 75. In one embodiment, the duration of the selective isotropic etch process is selected such that a top surface of an underlying insulating material is physically exposed at the bottom of each of the word-line contact via openings 75. For example, the duration of the selective isotropic etch process may be selected such that the etch distance of the selective isotropic etch process into the materials of the electrically conductive layers 46 is greater than the vertical thickness of each electrically conductive layer 46. A horizontal surface of a backside blocking dielectric layer 44 or a horizontal surface of an insulating layer 32 can be physically exposed at the bottom of each of the contact via openings (75, 77). Each of the laterally-bulging recess cavity 75P may comprise a convex tapered surface segment that adjoins the top surface of the underlying dielectric surface (such as a horizontal surface of a backside blocking dielectric layer 44 or a horizontal surface of an insulating layer 32), and may optionally comprise a vertical cylindrical surface segment that is adjoined to a top periphery of the convex tapered surface segment. The patterned mask layer, such as the patterned photoresist layer, may be subsequently removed, for example, by ashing.

Figure 34C:
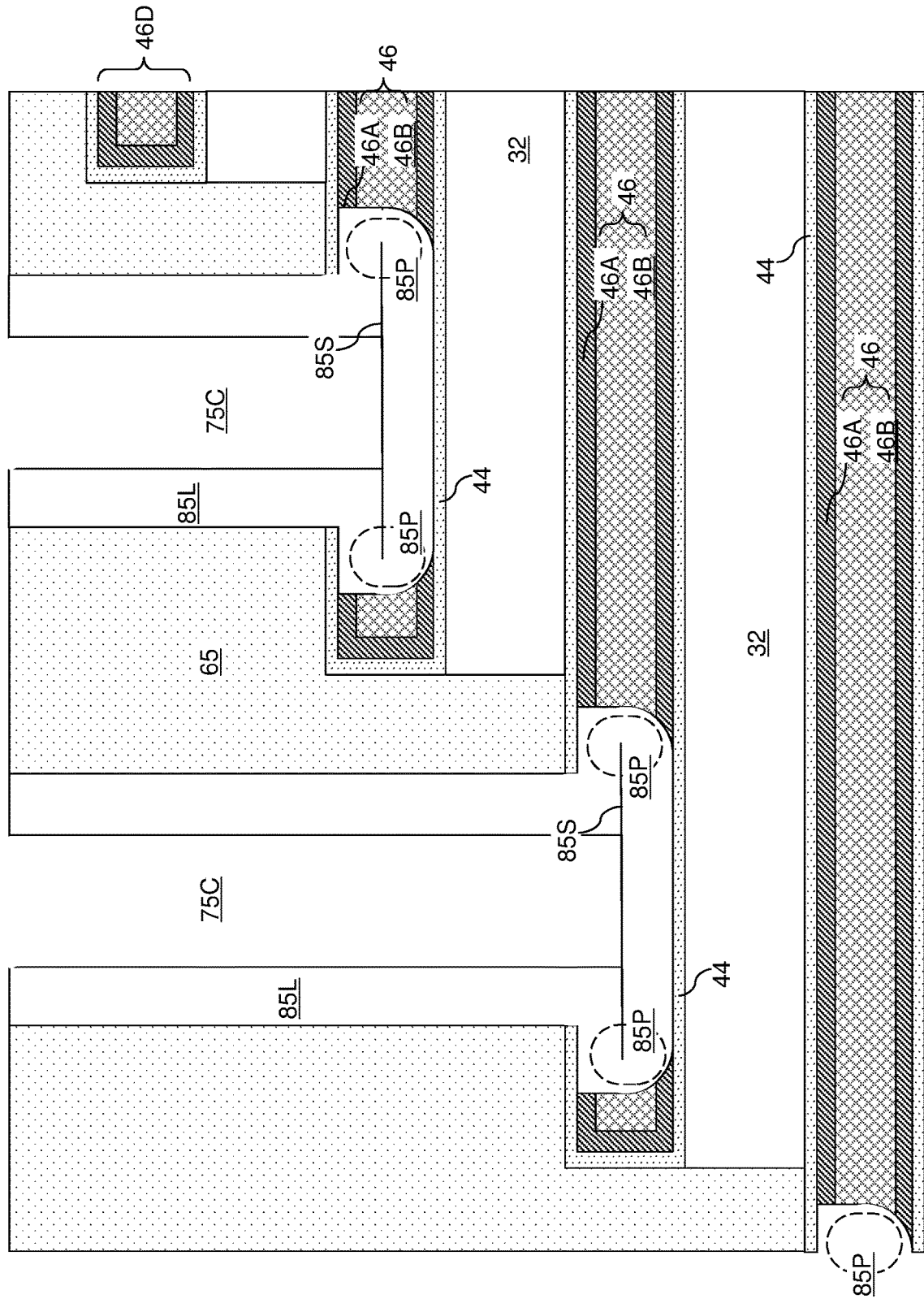

Referring to FIG. 34C, an insulating spacer material layer 85L can be deposited at peripheral regions of the contact via openings (75, 77) and over the contact-level dielectric layer 73 by a conformal deposition process. The insulating spacer material layer 85L includes an insulating material such as silicon oxide. The thickness of the insulating spacer material layer 85L may be greater than one half of the thickness of the electrically conductive layers 46 as formed at the processing steps of FIGS. 31A-31C. The volumes of the laterally-bulging recess cavities 75P can be filled with the insulating spacer material layer 85L to form the laterally-bulging insulating portions 85P. A horizontally-extending annular seam 85S may be present within each portion of the insulating spacer material layer 85L located within the laterally-bulging insulating portions 85P in the laterally-bulging recess cavities 75P. A vertically-extending via cavity (i.e., an unfilled void) 75C may be present within each contact via opening (75, 77).

Figure 35A:
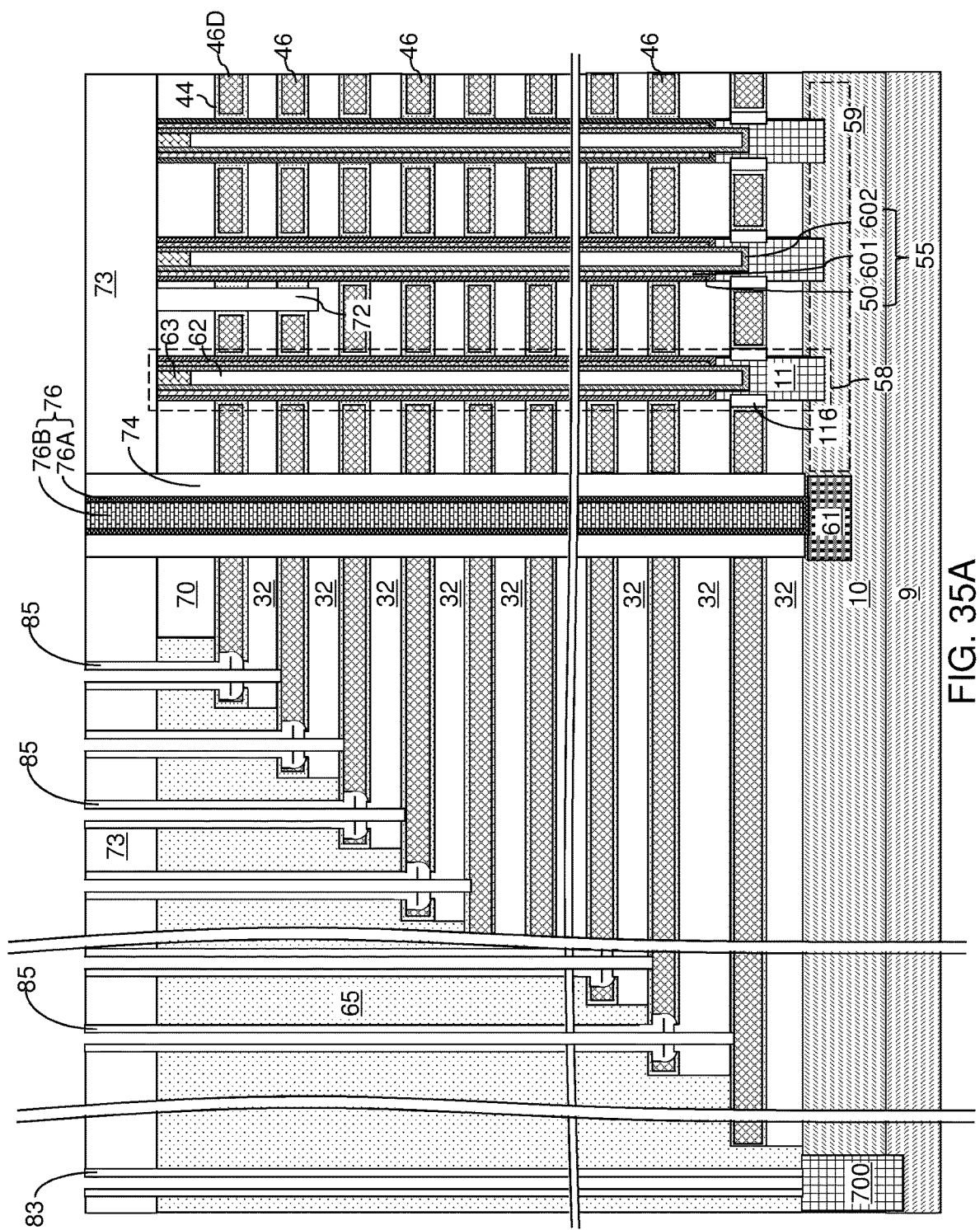
FIG. 35A is a schematic vertical cross-sectional view of the third exemplary structure after vertical extension of via cavities within the contact via openings according to the third embodiment of the present disclosure.
Figure 35B:
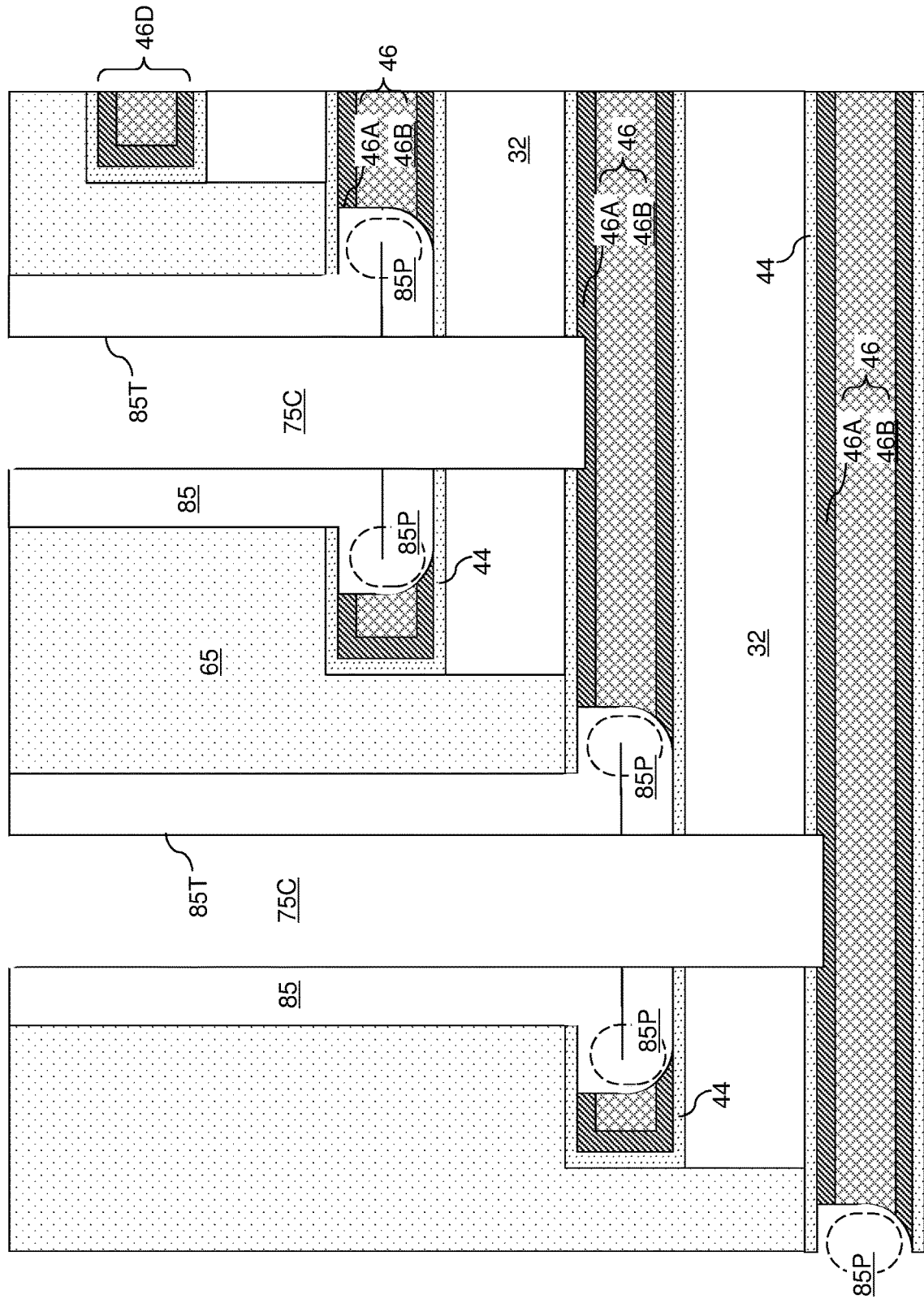
FIG. 35B is a magnified view of a region of the third exemplary structure of FIG. 35A.

Referring to FIGS. 35A and 35B, a second anisotropic etch process can be performed to remove bottom portions of the insulating spacer material layer 85L located underneath the vertically-extending cavities 75C within the contact via openings (75, 77). The second anisotropic etch process can be performed without forming any etch mask layer above the contact-level dielectric layer 73. In other words, application or patterning of a photoresist layer above the contact-level dielectric layer 73 prior to the second anisotropic etch process is not necessary.

Horizontally-extending portions of the insulating spacer material layer 85L can be removed from above the contact-level dielectric layer 73 and at the bottom of each contact via opening (75, 77). Remaining vertically-extending portions of the insulating spacer material layer 85L comprise tubular insulating material portions, which are herein referred to as insulating spacers (85, 83) or tubular insulating spacers. The insulating spacers (85, 83) comprise word-line-contact insulating spacers 85 located within a respective one of the word-line contact via openings 75, and peripheral-contact insulating spacers 83 located within a respective one of the peripheral contact via openings 77.

Generally, insulating spacers (85, 83) can be formed at peripheral regions of the contact via openings (75, 77). The insulating spacers (85, 83) comprise word-line-contact insulating spacers 85 and peripheral-contact insulating spacers 83. The second anisotropic etch process can be continued to vertically extend the via cavities within the contact via openings (75, 77) through underlying dielectric material portions such as a respective underlying insulating layer 32. Top surfaces of a respective electrically conductive layers 46 can be exposed underneath the vertically-extended via cavities. Generally, the second anisotropic etch process etches the material of the backside blocking dielectric layers 44 (if employed) and the material of the insulating layers 32. Each via cavity within the word-line contact via openings 75 can be vertically extended through respective set of at least one dielectric material having a same set of material compositions and a same thickness. Thus, the overetch into a respective underlying electrically conductive layer 46 underneath the via cavities can be about the same irrespective of the location of the via cavities, and thus, can be controlled to avoid any punch-through through the respective underlying electrically conductive layers 46.

Thus, an insulating spacer 85 is located at a peripheral region of the contact via opening 75 that extends through the dummy electrically conductive layer 46D. However, a separate contact via opening which terminates in or at the dummy electrically conductive layer 46D is preferably omitted. Thus, the dummy electrically conductive layer 46D acts as an etch stop during the etching step shown in FIG. 34A instead of the stepped material or etch stop plates (135, 246) of the first and second embodiments.

Each word-line-contact insulating spacer 85 comprises a tubular insulating portion 85T including a vertically-extending outer sidewall segment in contact with the retro-stepped dielectric material portion 65, and a laterally-bulging insulating portion 85P adjoined to a bottom of the tubular insulating portion. Portion 85P laterally protrudes outward from a vertical plane including the vertically-extending outer sidewall segment. In one embodiment, the laterally-bulging insulating portion 85P comprises a convex tapered surface segment that contacts a concave tapered surface segment of a respective electrically conductive layer 46 for at least one, a plurality, or each, of the word-line-contact insulating spacers 85. In one embodiment, the laterally-bulging insulating portion 85P comprises a planar top surface having an inner periphery adjoined to a bottom periphery of the vertically-extending outer sidewall segment of the tubular insulating portion 85T.

In one embodiment, each word-line-contact insulating spacer 85 comprises a laterally-bulging insulating portion 85P that has a planar annular top surface that contacts a surface segment of a backside blocking dielectric layer 44 and a planar annular bottom surface that contacts another surface segment of the backside blocking dielectric layer 44. The pair of backside trench fill structures (74, 76) can laterally extend along a first horizontal direction hd1 and can be laterally spaced apart along a second horizontal direction hd2. Each of the backside trench fill structures (74, 76) can comprise an insulating trench spacer 74 and an optional backside contact via structure 76. The pair of backside trench fill structures (74, 76) can contact each of the insulating layers 32 and the electrically conductive layers 46 at a respective lengthwise sidewall that laterally extends along the first horizontal direction hd1.

Thus, in one embodiment, each word-line-contact insulating spacer 85 comprise: a tubular insulating portion 85T including a vertically-extending outer sidewall segment in contact with the retro-stepped dielectric material portion 65, and a laterally-bulging insulating portion 85P adjoined to a bottom of the tubular insulating portion 85T and laterally protrudes outward from a vertical plane including the vertically-extending outer sidewall segment.

Figure 36:
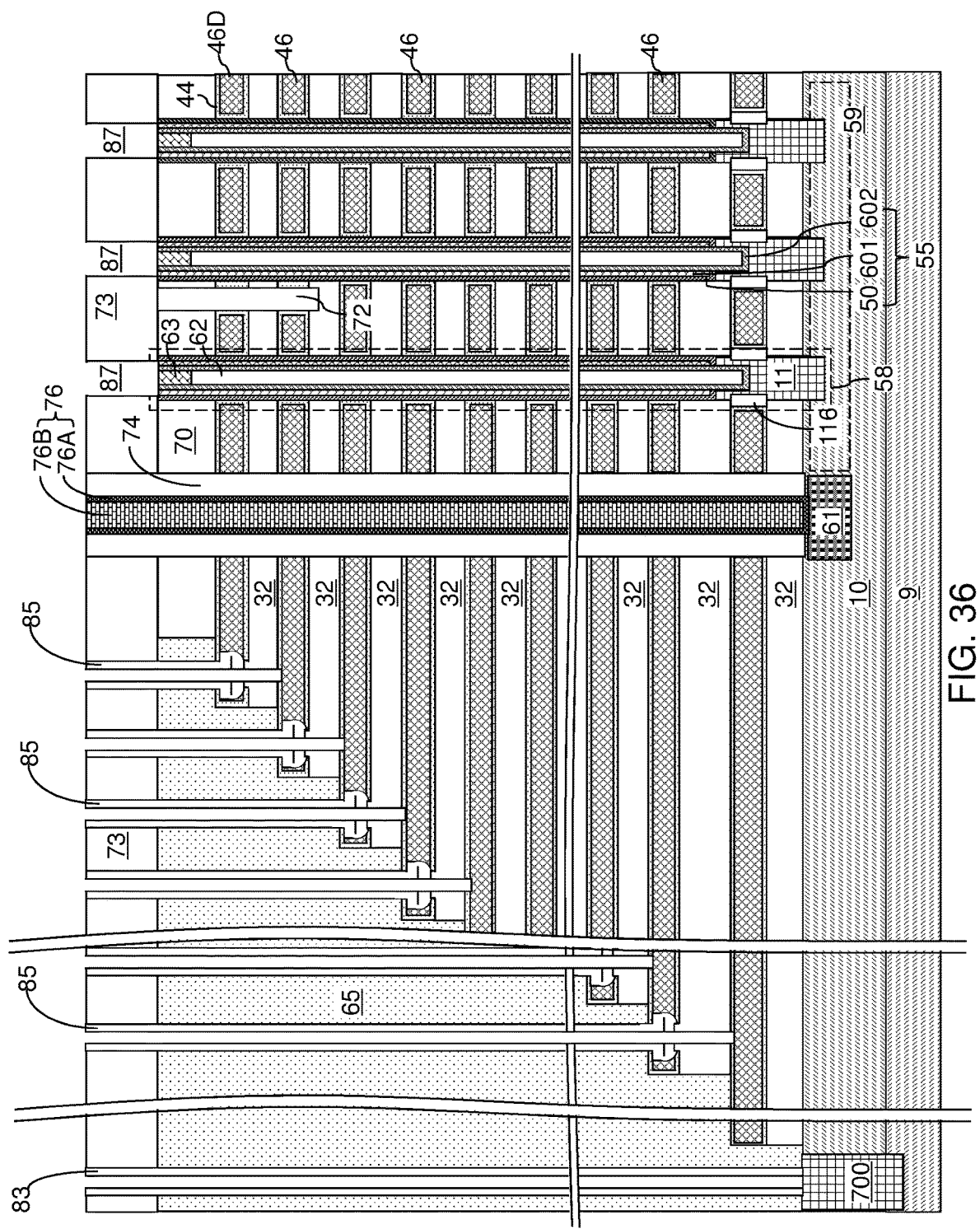
FIG. 36 is a schematic vertical cross-sectional view of the third exemplary structure after formation of drain contact via openings according to the third embodiment of the present disclosure.

Referring to FIG. 36, a photoresist layer (not shown) may be applied over the contact-level dielectric layer 73, and can be lithographically patterned to form openings in the memory array region 100 over a respective one of the memory opening fill structures 58. An anisotropic etch process can be performed to transfer the pattern of the openings in the photoresist layer through the contact-level dielectric layer 73. Drain contact via openings 87 can be formed over the drain regions 63 of the memory opening fill structures 58. The photoresist layer can be subsequently removed, for example, by ashing.

Figure 37A:
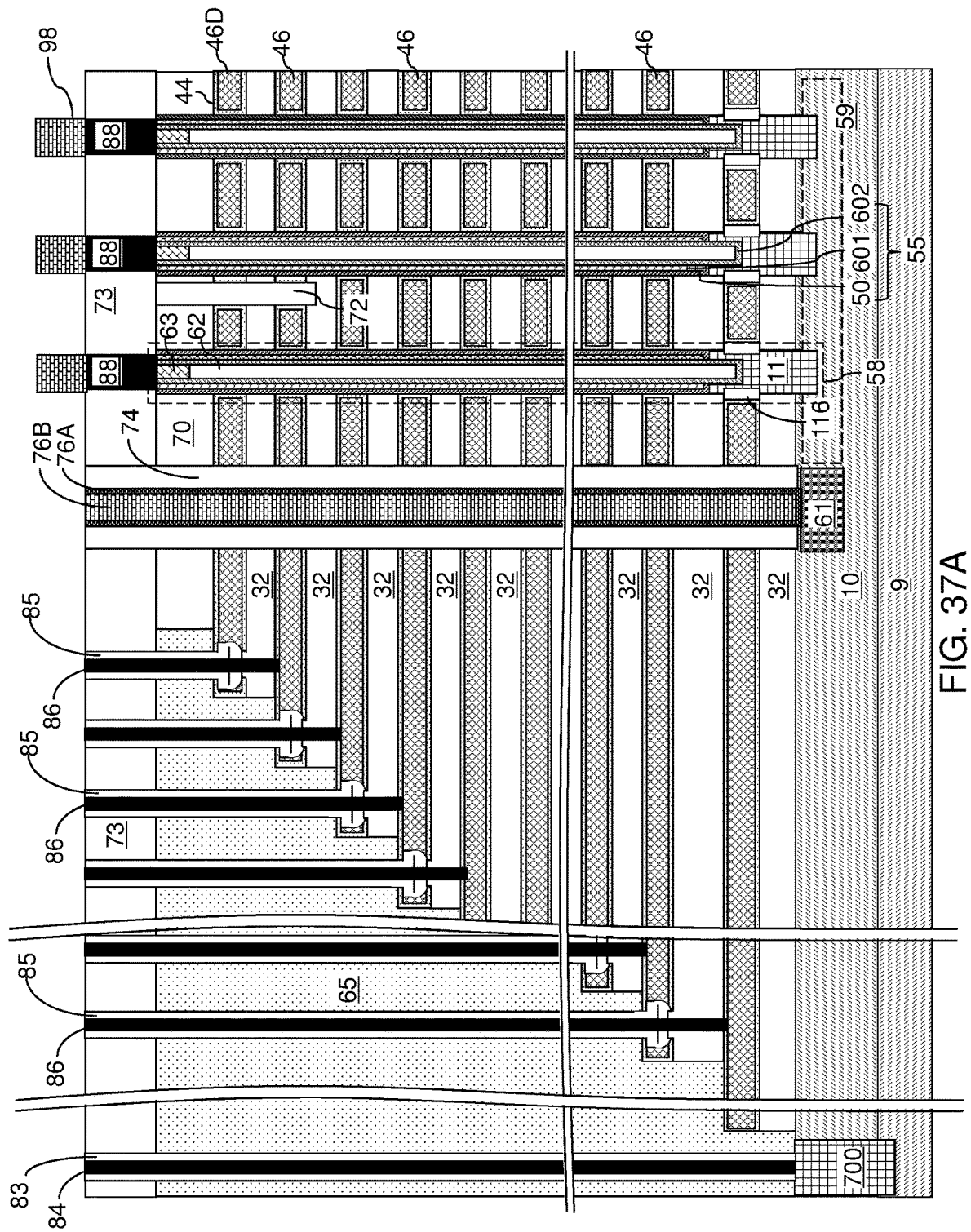
FIG. 37A is a schematic vertical cross-sectional view of the third exemplary structure after formation of contact via structures according to the third embodiment of the present disclosure.
Figure 37B:
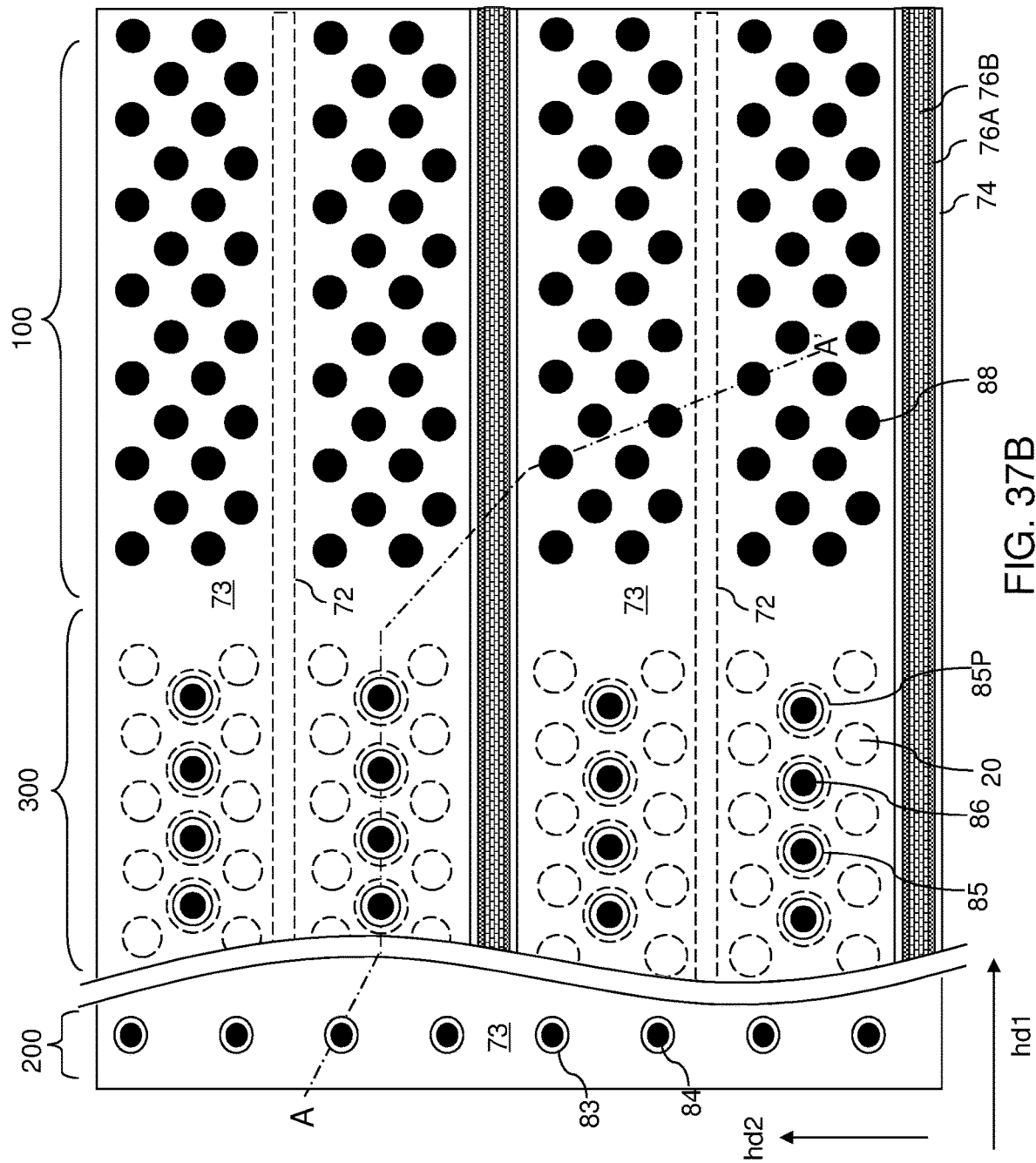
FIG. 37B is a top-down view of the third exemplary structure of FIG. 37A. The vertical plane A-A' is the plane of the schematic vertical cross-sectional view of FIG. 37A.
Figure 37C:
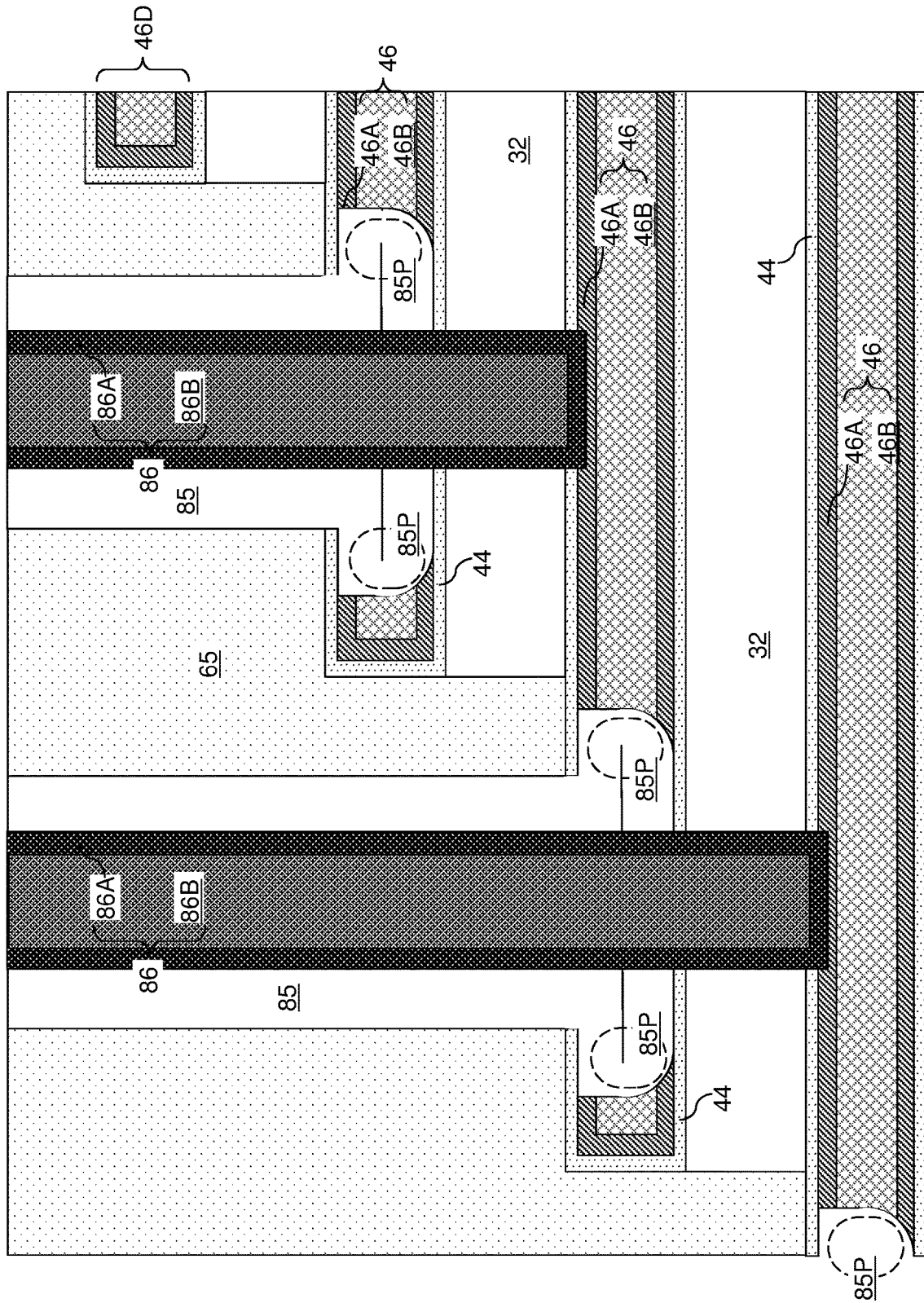
FIG. 37C is a magnified view of a region of the third exemplary structure of FIG. 37A.

Referring to FIGS. 37A-37C, at least one conductive material, such as at least one metallic material, can be deposited in the various via cavities within the contact via openings (75, 73, 87). For example, a metallic barrier liner 86A and a metallic fill material portion 86B can be deposited in each of the via cavities. Excess portions of the at least one conductive material can be removed from above the horizontal plane including the top surface of the contact-level dielectric layer 73 by a planarization process, which may comprise a chemical mechanical polishing (CMP) process or a recess etch process. Remaining portions of the at least one conductive material comprise various contact via structures (86, 88, 84). The contact via structures (86, 88, 84) comprise word-line contact via structures 86 in contact with a respective one of the electrically conductive layers 46 other than the topmost electrically conductive layer 46, drain contact via structures 88 in contact with a respective one of the drain regions 63, and peripheral contact via structures 84 in contact with a respective one of the peripheral semiconductor devices 700 within the peripheral region 200.

Each contiguous combination of an insulating spacer (85, 83) and a contact via structure (86, 84) constitutes a laterally-insulated contact structure {(85, 86), (83, 84)}. The laterally-insulated contact structures {(85, 86), (83, 84)} comprise laterally-insulated word-line contact structures (85, 86) vertically extending through the retro-stepped dielectric material portion 65, and including a word-line contact via structure 86 contacting a top surface of a respective one of the electrically conductive layers 46 other than the topmost dummy electrically conductive layer 46D and a word-line word-line-contact insulating spacer 85 laterally surrounding the word-line contact via structure 86 and contacting a sidewall of a respective overlying electrically conductive layer. The dummy electrically conductive layer 46D lacks any electrical contact with any of the electrical contact via structures 86, and remain inactive (e.g., electrically floating) during the operation of the memory device. Thus, the dummy electrically conductive layer 46D does not function as a select gate electrode or a word line. At least one word-line contact via structure 86 extends through the dummy electrically conductive layer 46D to contact an underlying electrically conductive layer 46 (e.g., topmost drain side select gate electrodes). However, this word-line contact via structure 86 does not physically or electrically contact the dummy electrically conductive layer 46D because this word-line contact via structure 86 is laterally surrounded by the word-line-contact insulating spacer 85 at the level of the dummy electrically conductive layer 46D.

Figure 37D:
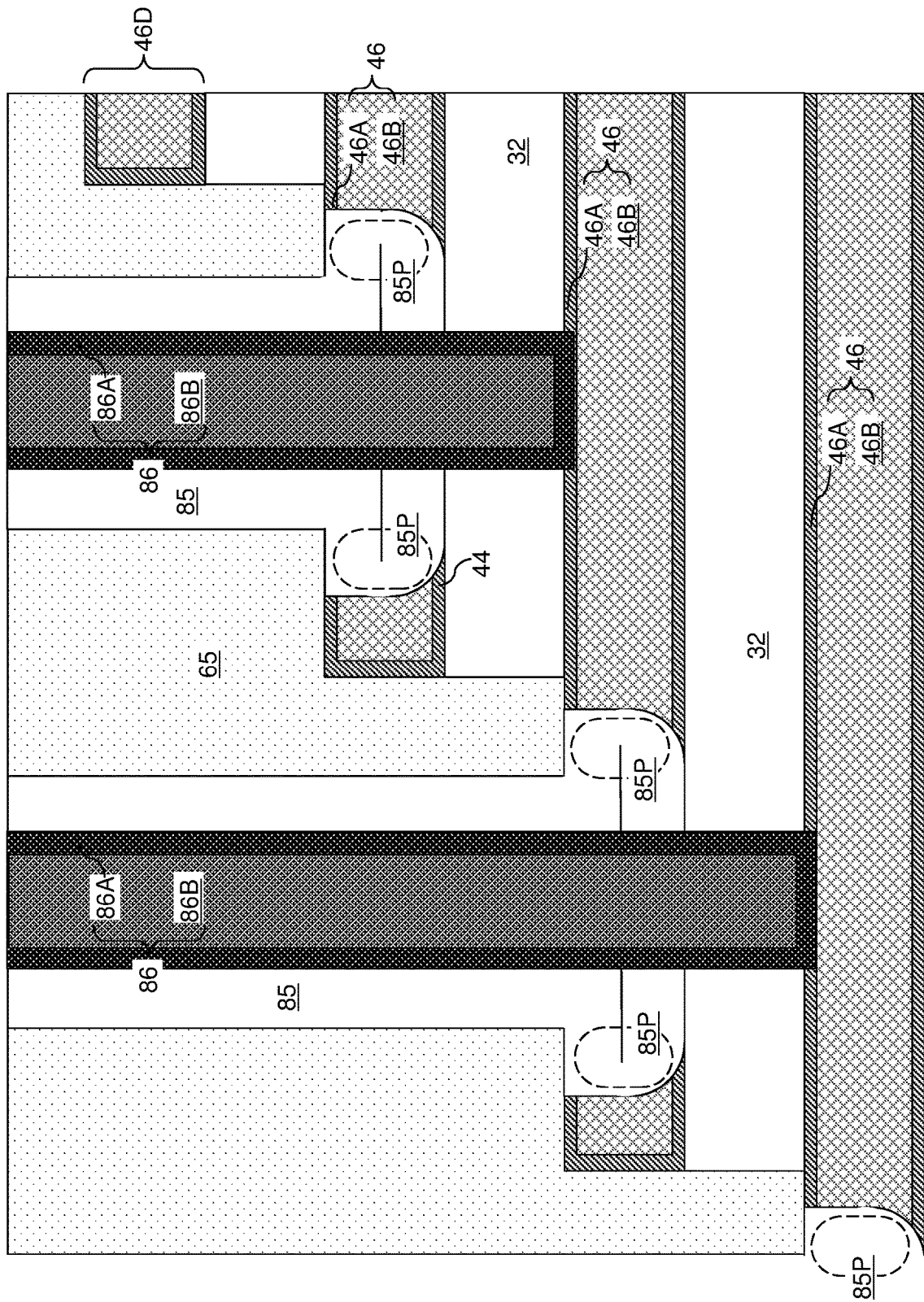
FIG. 37D is a magnified view of a region of a first alternative configuration of the third exemplary structure at the processing steps of FIGS. 37A-37C according to the third embodiment of the present disclosure.

Referring to FIG. 37D, a first alternative configuration of the third exemplary structure can be derived from the first exemplary structure by omitting formation of the backside blocking dielectric layers 44. In one embodiment, each of the word-line-contact insulating spacers 85 comprises a respective annular bottom surface that contacts a top surface of a respective insulating layer 32.

Generally, each memory opening fill structure 58 in the third exemplary structure or alternative configurations thereof comprises a respective memory film 50, which may comprise a respective blocking dielectric layer 52, a respective vertical stack of memory elements located at levels of the electrically conductive layers 46 (comprising portions of the charge storage layer 54 located at the levels of the electrically conductive layers 46), and a respective tunneling dielectric layer 56 that contacts a respective vertical semiconductor channel 60. The electrically conductive layers 46 comprise word lines for controlling memory states of the vertical stacks of memory elements, and the contact via structures comprise word-line contact via structures 86 of the three-dimensional memory device.

Referring to FIGS. 26-37D and all related drawings and according to various embodiments of the present disclosure, a three-dimensional memory device is provided, which comprises: an alternating stack (32, 46) of insulating layers 32 and electrically conductive layers 46 located over a substrate (9, 10), wherein the alternating stack (32, 46) comprises a staircase region 300 in which lateral extents of the electrically conductive layers 46 decrease with a vertical distance from the substrate (9, 10); a retro-stepped dielectric material portion 65 overlying the staircase region of the alternating stack (32, 46); memory stack structures 55 vertically extending through the alternating stack (32, 46), wherein each of the memory stack structures 55 comprises a respective vertical semiconductor channel 60 and a respective memory film 50; and a laterally-insulated contact structure (86, 85) vertically extending through the retro-stepped dielectric material portion 65.

The laterally-insulated contact structure (86, 85) comprises an electrically conductive contact via structure 86 and an insulating spacer 85 that laterally surrounds the electrically conductive contact via structure 86; the electrically conductive contact via structure contacts 85 a first electrically conductive layer 46 of the electrically conductive layers and vertically extends through an opening in a second electrically conductive layer 46D of the electrically conductive layers which overlies the first electrically conductive layer 46; and the electrically conductive contact via structure 86 is electrically isolated from the second electrically conductive layer 46D by the insulating spacer 85.

In one embodiment, the insulating spacer 85 comprises a tubular insulating portion 85T and a laterally-bulging insulating portion 85P. The laterally-bulging insulating portion 85P comprises a planar annular top surface located within a same horizontal plane as a top surface of the second electrically conductive layer 46D. In one embodiment, each of the electrically conductive layers 46 is spaced from the memory stack structures 55 and the insulating layers 32 by a respective backside blocking dielectric layer 44; and the planar annular top surface of the laterally-bulging insulating portion 85P contacts a bottom surface of a horizontally-extending portion of one of the backside blocking dielectric layers 44.

In one embodiment, the laterally-bulging insulating portion 85P comprises a planar annular bottom surface that contacts a top surface of another horizontally-extending portion of the one of the backside blocking dielectric layers 44. In one embodiment, the laterally-bulging insulating portion 85P comprises a planar annular bottom surface located within a same horizontal plane as a bottom surface of the second electrically conductive layer 46D.

In one embodiment, the laterally-bulging insulating portion 85P comprises a convex tapered surface segment that contacts a concave tapered surface segment of the second electrically conductive layer 46D. In one embodiment, the laterally-bulging insulating portion 85P comprises a vertical cylindrical surface segment that is adjoined to a top end of the convex tapered surface segment and contacts a vertical surface segment of the second electrically conductive layer 46D. In one embodiment, the laterally-bulging insulating portion 85P comprises a planar top surface having an inner periphery adjoined to a bottom periphery of the vertically-extending outer sidewall segment.

In one embodiment, the laterally-bulging insulating portion 85P comprises a horizontally-extending annular seam 85S that contacts a sidewall of the electrically conductive contact via structure 86 and located midway between a first horizontal plane including a bottom surface of the second electrically conductive layer 46D and a second horizontal plane including a top surface of the second electrically conductive layer 46D.

In one embodiment, each electrically conductive contact via structure 86 vertically extends through a first insulating layer 32 located between the first electrically conductive layer 46 and the second electrically conductive layer 46D. In one embodiment, the electrically conductive contact via structure 86 directly contacts a sidewall of an opening in the first insulating layer 32. In one embodiment, the electrically conductive contact via structure 86 comprises a straight sidewall that vertically extends straight at least from a top surface of the retro-stepped dielectric material portion 65 to a top surface of the first electrically conductive layers 46.

In one embodiment, a minimum lateral spacing between the electrically conductive contact via structure 86 and the second electrically conductive layer 46D is greater than a minimum lateral spacing between the electrically conductive contact via structure 86 and the retro-stepped dielectric material portion 65.

In one embodiment, the second electrically conductive layer 46D comprises a dummy electrically conductive layer which does not electrically contact any electrically conductive contact via structures 86 and which is electrically floating during operation of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate, wherein the alternating stack comprises a staircase region in which lateral extents of the electrically conductive layers decrease with a vertical distance from the substrate;
a retro-stepped dielectric material portion overlying the staircase region of the alternating stack;
memory stack structures vertically extending through the alternating stack, wherein each of the memory stack structures comprises a respective vertical semiconductor channel and a respective memory film;
an electrically conductive or semiconductor perforated etch stop plate interposed between the alternating stack and a stepped bottom surface of the retro-stepped dielectric material portion; and
laterally-insulated contact structures vertically extending through the retro-stepped dielectric material portion and through a respective one of perforation openings in the perforated etch stop plate, wherein each of the laterally-insulated contact structures comprises an assembly of a contact via structure contacting a top surface of a respective one of the electrically conductive layers and an insulating spacer laterally surrounding the contact via structure and contacting the perforated etch stop plate,
wherein the insulating spacer of each of the laterally-insulated contact structures comprises:
a tubular insulating portion including a vertically-extending outer sidewall segment in contact with the retro-stepped dielectric material portion; and
a laterally-bulging insulating portion adjoined to a bottom of the tubular insulating portion and laterally protruding outward from a vertical plane including the vertically-extending outer sidewall segment,
wherein a surface segment of the laterally-bulging insulating portion contacts a surface segment of a horizontal portion of the perforated etch stop plate for at least one of the laterally-insulated contact structures.

2. The three-dimensional memory device of claim 1, wherein the surface segment of the laterally-bulging insulating portion comprises a convex tapered surface segment, and the surface segment of the horizontal portion of the etch stop plate comprises a concave tapered surface segment of the horizontal portion of the perforated etch stop plate.

3. The three-dimensional memory device of claim 1, wherein the laterally-bulging insulating portion comprises a planar top surface having an inner periphery adjoined to a bottom periphery of the vertically-extending outer sidewall segment, and a planar bottom surface having an inner periphery that contacts the contact via structure and having an outer periphery that is adjoined to a bottom periphery of the respective opening through the electrically conductive or semiconductor perforated etch stop plate.

4. The three-dimensional memory device of claim 1, wherein the perforated etch stop plate comprises the electrically conductive perforated metal plate comprising a same one or more materials as the electrically conductive layers.

5. The three-dimensional memory device of claim 4, wherein:
each of the electrically conductive layers is spaced from the memory stack structures and the insulating layers by a backside blocking dielectric layer; and
the perforated etch stop plate is encased within an encasing dielectric liner having a same material composition and a same thickness as the backside blocking dielectric layer.

6. The three-dimensional memory device of claim 5, wherein the laterally-bulging insulating portion that has:
a planar annular top surface that contacts a surface segment of the encasing dielectric liner; and
a planar annular bottom surface that contacts another surface segment of the encasing dielectric liner.

7. The three-dimensional memory device of claim 1, wherein the perforated etch stop plate comprises the semiconductor perforated plate.

8. The three-dimensional memory device of claim 1, further comprising a perforated insulating plate interposed between the alternating stack and the perforated etch stop plate.

9. The three-dimensional memory device of claim 8, wherein each of the contact via structure extends through and contacts a sidewall of a respective perforation opening in the perforated insulating plate.

10. The three-dimensional memory device of claim 8, wherein the perforated insulating plate comprises:
   horizontally-extending portions including perforation openings therethrough; and
   vertically extending portions that contact sidewalls of the insulating layers and connecting neighboring pairs among the horizontally-extending portions, wherein the vertically extending portions are vertically offset from each other.

11. The three-dimensional memory device of claim 8, wherein each of the insulating spacers of the laterally-insulated contact structures comprises a respective annular surface that contacts a respective surface segment of the perforated insulating plate.

12. The three-dimensional memory device of claim 1, further comprising a pair of backside trench fill structures laterally extending along a first horizontal direction and laterally spaced apart along a second horizontal direction, wherein:
   each of the backside trench fill structures contacts each of the insulating layers and the electrically conductive layers at a respective lengthwise sidewall that laterally extends along the first horizontal direction; and
   the perforated etch stop plate contacts the lengthwise sidewalls of the pair of backside trench fill structures.

13. The three-dimensional memory device of claim 1, wherein:
   the respective memory film comprises a respective blocking dielectric layer, a respective vertical stack of memory elements located at levels of the electrically conductive layers, and a respective tunneling dielectric layer that contacts the respective vertical semiconductor channel;
   the electrically conductive layers comprise word lines; and
   the contact via structures comprise word-line contact via structures of the three-dimensional memory device.

14. The three-dimensional memory device of claim 1, wherein for each of the laterally-insulated contact structures, an entirety of a contact area between the laterally-bulging insulating portion and the electrically conductive or semiconductor perforated etch stop plate is laterally offset outward from a cylindrical vertical plane containing the vertically-extending outer sidewall segment of the tubular insulating portion.

15. The three-dimensional memory device of claim 14, wherein for each of the laterally-insulated contact structures, the laterally-bulging insulating portion comprises:
   a planar top surface;
   a planar bottom surface; and
   a sidewall surface that connects the planar top surface and the planar bottom surface, wherein an entirety of the sidewall surface is in direct contact with the electrically conductive or semiconductor perforated etch stop plate.

16. The three-dimensional memory device of claim 15, wherein the sidewall surface comprises a convex tapered surface segment that contacts a concave tapered surface segment of the perforated etch stop plate for at least one of the laterally-insulated contact structures.

17. The three-dimensional memory device of claim 15, wherein the planar top surface has an inner periphery adjoined to a bottom periphery of the vertically-extending outer sidewall segment.

18. The three-dimensional memory device of claim 14, wherein for each of the laterally-insulated contact structures, the laterally-bulging insulating portion comprises:
   a planar top surface having an inner periphery that coincides with a bottom periphery of the vertically-extending outer surface segment and having an outer periphery segment that coincides with a top periphery of a respective opening through the electrically conductive or semiconductor perforated etch stop plate; and
   a planar bottom surface having an inner periphery that contacts the contact via structure and having an outer periphery that coincides with a bottom periphery of the respective opening through the electrically conductive or semiconductor perforated etch stop plate.

19. The three-dimensional memory device of claim 14, wherein:
   each of the electrically conductive layers is encapsulated by, and is contacted by, a respective backside blocking dielectric layer except in regions contacted by a respective one of the contact via structures;
   the perforated etch stop plate is encased within an encasing dielectric liner having a same material composition and a same thickness as the backside blocking dielectric layer;
   each of the contact via structures is contacted by a horizontally-extending portion of the encasing dielectric liner and by a horizontally-extending portion of a respective one of the backside blocking dielectric layers; and
   a stepped insulating layer having a continuously extending interface with the encasing dielectric liner which continuously extends from a horizontal plane including a bottommost surface of the alternating stack to a horizontal plane including a topmost surface of the alternating stack, and contacting each of the backside blocking dielectric layers.

20. The three-dimensional memory device of claim 1, wherein:
   each of the electrically conductive layers is encapsulated by, and is contacted by, a respective backside blocking dielectric layer except in regions contacted by a respective one of the contact via structures;
   the perforated etch stop plate is encased within an encasing dielectric liner having a same material composition and a same thickness as the backside blocking dielectric layer;
   each of the contact via structures is contacted by a horizontally-extending portion of the encasing dielectric liner and by a horizontally-extending portion of a respective one of the backside blocking dielectric layers; and
   a stepped insulating layer having a continuously extending interface with the encasing dielectric liner which continuously extends from a horizontal plane including a bottommost surface of the alternating stack to a horizontal plane including a topmost surface of the alternating stack, and contacting each of the backside blocking dielectric layers.

* * * * *